United States Patent
Kang

(10) Patent No.: US 12,439,589 B2
(45) Date of Patent: Oct. 7, 2025

(54) INTEGRATED CIRCUIT DEVICE

(71) Applicant: SAMSUNG ELECTRONICS CO., LTD., Suwon-si (KR)

(72) Inventor: Jongin Kang, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 435 days.

(21) Appl. No.: 18/119,556

(22) Filed: Mar. 9, 2023

(65) Prior Publication Data
US 2024/0015955 A1    Jan. 11, 2024

(30) Foreign Application Priority Data
Jul. 6, 2022    (KR) .................. 10-2022-0083161

(51) Int. Cl.
H10B 12/00    (2023.01)
H10D 64/27    (2025.01)

(52) U.S. Cl.
CPC ......... *H10B 12/488* (2023.02); *H10D 64/513* (2025.01)

(58) Field of Classification Search
CPC .... H10D 64/513; H10B 12/053; H10B 12/34; H10B 12/488; H10B 12/30
See application file for complete search history.

(56) References Cited

U.S. PATENT DOCUMENTS

| | | |
|---|---|---|
| 8,048,597 B2 | 11/2011 | Kim |
| 9,305,924 B2 | 4/2016 | Mikasa |
| 9,799,659 B2 | 10/2017 | Kim |
| 10,109,634 B2 | 10/2018 | Kim |
| 10,388,657 B2 | 8/2019 | Wu |
| 10,665,544 B2 | 5/2020 | Shin |
| 10,930,544 B2 | 2/2021 | Kang et al. |

(Continued)

FOREIGN PATENT DOCUMENTS

| | | |
|---|---|---|
| KR | 10-2020-0131191 | 11/2020 |
| TW | 202220143 A | 5/2022 |

OTHER PUBLICATIONS

Office Action of Taiwanese Patent Office in Application No. 112120956, dated Jul. 25, 2025.

*Primary Examiner* — Chad M Dicke
*Assistant Examiner* — Valerie N Newton
(74) *Attorney, Agent, or Firm* — Morgan, Lewis & Bockius LLP

(57) ABSTRACT

An integrated circuit device includes a word line on active regions and a device isolation film and extending in a first horizontal direction. The word line includes first conductive patterns spaced apart from each other in the first horizontal direction. Each of the first conductive patterns covers a pair of active regions that are immediately adjacent to each other in the first horizontal direction, and a first portion of the device isolation film between each active region of the pair of active regions. Second conductive patterns are arranged one-by-one between the first conductive patterns. Each of the second conductive patterns covers a second portion of the device isolation film. A first vertical distance from the substrate to a lowermost surface of each of the first conductive patterns is greater than a second vertical distance from the substrate to a lowermost surface of each of the second conductive patterns.

20 Claims, 65 Drawing Sheets

(56) References Cited

U.S. PATENT DOCUMENTS

| | | | |
|---|---|---|---|
| 11,056,175 B1 * | 7/2021 | Ikeda | ................. G11C 5/06 |
| 11,177,264 B2 | 11/2021 | Jeon et al. | |
| 11,226,552 B2 | 1/2022 | Ahn et al. | |
| 11,805,639 B2 | 10/2023 | Kim et al. | |
| 2014/0015043 A1 * | 1/2014 | Lee | ................. H10D 64/513 |
| | | | 257/331 |
| 2021/0193664 A1 | 6/2021 | Seong et al. | |

* cited by examiner

INTEGRATED CIRCUIT DEVICE

CROSS-REFERENCE TO RELATED APPLICATION

This application claims priority under 35 U.S.C. § 119 to Korean Patent Application No. 10-2022-0083161, filed on Jul. 6, 2022 in the Korean Intellectual Property Office, the disclosure of which is incorporated by reference in its entirety herein.

1. TECHNICAL FIELD

The present inventive concept relates to an integrated circuit device, and more particularly, to an integrated circuit device having buried word lines.

2. DISCUSSION OF RELATED ART

Along with an increased integration level of integrated circuit devices, the widths and pitches of a plurality of word lines buried in substrates have been fine-sized, and the aspect ratios of structures defining a plurality of trenches that are formed in the substrates to form the plurality of word lines, have been gradually increased. Therefore, there is a risk that during the process of fabricating integrated circuit devices, process defects, such as leaning or collapse of structures defining a plurality of trenches, may be generated in substrates.

SUMMARY

Embodiments of the present inventive concept provides an integrated circuit device, which has a device area reduced due to down-scaling, and which has a structure capable of, even when structures defining a plurality of trenches formed in a substrate to form a plurality of word lines have relatively small widths and relatively high aspect ratios, preventing the generation of process defects, such as a leaning or collapse of the structures, during the process of fabricating the integrated circuit device, the structure being capable of increasing the reliability of the integrated circuit device.

According to an embodiment of the present inventive concept, an integrated circuit device includes a substrate comprising a plurality of active regions arranged in a line in a first horizontal direction. Each of the plurality of active regions are spaced apart from each other. A device isolation film is arranged on the substrate to surround the plurality of active regions. A word line is arranged on the plurality of active regions and the device isolation film. The word line extends lengthwise in the first horizontal direction. The word line comprises a plurality of first conductive patterns spaced apart from each other in the first horizontal direction. Each of the plurality of first conductive patterns covers a first pair of active regions of the plurality of active regions that are immediately adjacent to each other in the first horizontal direction, and a first portion of the device isolation film between each active region of the first pair of active regions. Each active region of the first pair of active regions being spaced apart from each other by a first separation distance in the first horizontal direction. A plurality of second conductive patterns is arranged one-by-one between the plurality of first conductive patterns. Each of the plurality of second conductive patterns covers a second portion of the device isolation film between a second pair of active regions of the plurality of active regions that are immediately adjacent to each other in the first horizontal direction. Each active region of the second pair of active regions being spaced apart from each other by a second separation distance that is greater than the first separation distance in the first horizontal direction. A first vertical distance from a main surface of the substrate to a lowermost surface of each of the plurality of first conductive patterns is greater than a second vertical distance from the main surface of the substrate to a lowermost surface of each of the plurality of second conductive patterns.

According to an embodiment of the present inventive concept, an integrated circuit device includes a substrate comprising a plurality of active regions. Each active region of the plurality of active regions comprises an upper surface having a major axis and a minor axis. The plurality of active regions is repeatedly arranged spaced apart from each other in a major-axis direction that is parallel to the major axis and in a minor-axis direction that is parallel to the minor axis. A device isolation film surrounds the plurality active regions. A plurality of word lines extends lengthwise in a first horizontal direction that intersects with each of the major-axis direction and the minor-axis direction, across a group of active regions of the plurality of active regions and the device isolation film. The group of active regions is arranged in the first horizontal direction. Each of the plurality of word lines comprises a plurality of first conductive patterns spaced apart from each other in the first horizontal direction. Each of the plurality of first conductive patterns covers a first pair of active regions of the plurality of active regions that are immediately adjacent to each other in the first horizontal direction, and a first portion of the device isolation film between each active region of the first pair of active regions. Each active region of the first pair of active regions being spaced apart from each other by a first separation distance in the first horizontal direction. A plurality of second conductive patterns is arranged one-by-one between the plurality of first conductive patterns. Each of the plurality of second conductive patterns covers a second portion of the device isolation film between a second pair of active regions of the plurality of active regions that are immediately adjacent to each other in the first horizontal direction. Each active region of the second pair of active regions being spaced apart from each other by a second separation distance that is greater than the first separation distance in the first horizontal direction. A vertical level of a lowermost surface of each of the plurality of first conductive patterns is lower than a vertical level of a lowermost surface of each of the plurality of second conductive patterns.

According to an embodiment of the present inventive concept, an integrated circuit device includes a substrate comprising a plurality of active regions arranged in a line in a first horizontal direction. Each of the plurality of active regions are spaced apart from each other. A device isolation film is arranged on the substrate to surround the plurality of active regions. A word line is arranged on the plurality of active regions and the device isolation film. The word line extends lengthwise in the first horizontal direction. A plurality of gate dielectric films is arranged between portions of the word line that vertically overlap the plurality of active regions and the plurality of active regions. The word line comprises a plurality of first conductive patterns. Each first conductive pattern of the plurality of first conductive patterns covers a first pair of active regions of the plurality of active regions that are immediately adjacent to each other in the first horizontal direction, and a first portion of the device isolation film between each active region of the first pair of active regions. The plurality of first conductive patterns are spaced apart from each other in the first horizontal direction and are spaced apart from the first portion of the device isolation film with the plurality of gate dielectric films respectively therebetween. Each active region of the first pair of active regions being spaced apart from each other by a first separation distance in the first horizontal direction. A plurality of second conductive patterns is arranged one-by-one between the plurality of first conductive patterns. Each of the plurality of second conductive patterns covers a second portion of the device isolation film between a second pair of active regions of the plurality of active regions that are immediately adjacent to each other in the first horizontal direction. Each active region of the second pair of active regions being spaced apart from each other by a second separation distance that is greater than the first separation distance in the first horizontal direction. A doped polysilicon pattern covers upper surfaces of at least some of first conductive patterns of the plurality of first conductive patterns and second conductive patterns of the plurality of second conductive patterns. A first vertical distance from a main surface of the substrate to a lowermost surface of each of the plurality of first conductive patterns is greater than a second vertical distance from the main surface of the substrate to a lowermost surface of each of the plurality of second conductive patterns.

BRIEF DESCRIPTION OF THE DRAWINGS

Embodiments of the present inventive concept will be more clearly understood from the following detailed description taken in conjunction with the accompanying drawings in which:

FIG. 3A is a cross-sectional view illustrating some components in a region corresponding to a cross-section taken along a line X1-X1' of FIGS. 3C and 3D, FIG. 3B is a cross-sectional view illustrating some components in a region corresponding to a cross-section taken along a line Y1-Y1' of FIGS. 3C and 3D, FIG. 3C is a planar layout illustrating some components on a plane along a first vertical level of each of FIGS. 3A and 3B, and FIG. 3D is a planar layout illustrating some components on a plane along a second vertical level of each of FIGS. 3A and 3B;

DETAILED DESCRIPTION OF EMBODIMENTS

Figure 1:
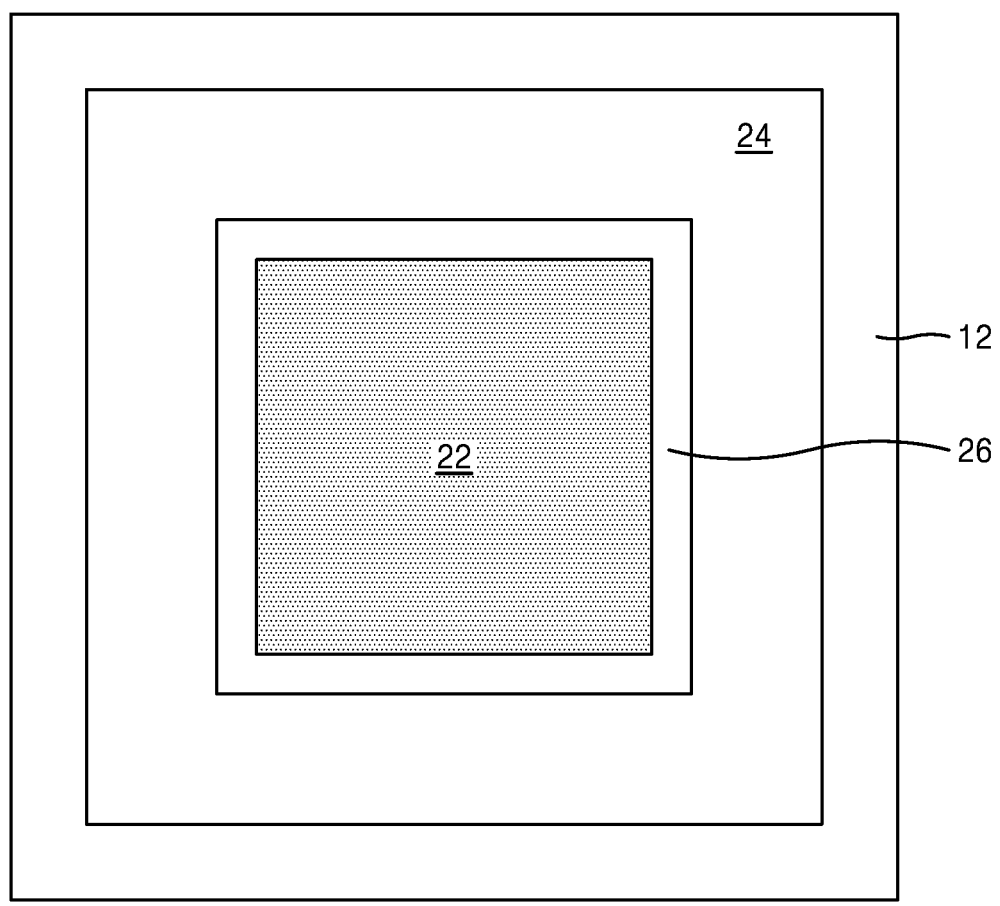
FIG. 1 is a plan view illustrating a schematic configuration of an integrated circuit device, according to some embodiments.

Hereinafter, embodiments of the present inventive concept will be described in detail with reference to the accompanying drawings. Like components are denoted by like reference numerals throughout the specification, and repeated descriptions thereof are omitted for economy of description.

FIG. 1 is a plan view illustrating a schematic configuration of an integrated circuit device 10, according to some embodiments.

Referring to FIG. 1, the integrated circuit device 10 may include a substrate 12, which includes a memory cell area 22, a peripheral circuit area 24 surrounding the memory cell area 22, and an interface area 26 between the memory cell area 22 and the peripheral circuit area 24.

In an embodiment, the substrate 12 may include, for example, a semiconductor element, such as Si or Ge, or at least one compound semiconductor selected from SiGe, SiC, GaAs, InAs, and InP. The substrate 12 may include a conductive region, for example, an impurity-doped well or an impurity-doped structure.

In some embodiments, the memory cell area 22 may include a memory cell area of dynamic random access memory (DRAM). The memory cell area 22 may include a plurality of unit memory cells, each having a transistor and a capacitor. The peripheral circuit area 24 may be an area in which peripheral circuits required to drive memory cells in the memory cell area 22 are arranged. In the interface area 26, a plurality of conductive lines providing the electrical connection between the memory cell area 22 and the peripheral circuit area 24, and insulating structures for insulation between the memory cell area 22 and the peripheral circuit area 24 may be arranged.

Figure 2:
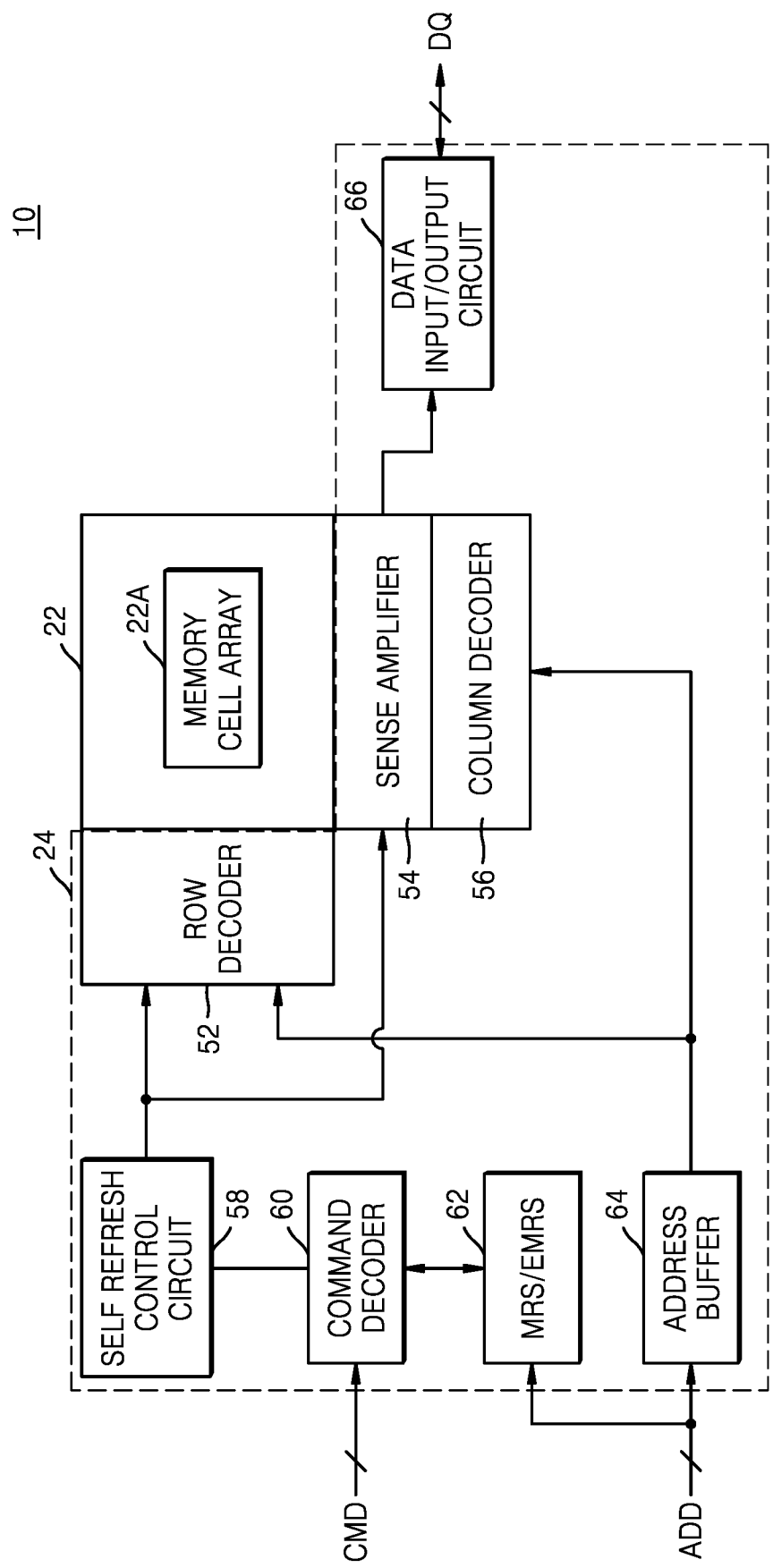
FIG. 2 is a block diagram illustrating an example of a configuration of an integrated circuit device including a dynamic random access memory (DRAM) device.

FIG. 2 is a block diagram illustrating an example of a configuration of the integrated circuit device 10 including a DRAM device.

Referring to FIG. 2, the memory cell area 22 may include a memory cell array 22A. A plurality of memory cells for storing data may be arranged in a row direction and a column direction in the memory cell array 22A. Each of the plurality of memory cells in the memory cell array 22A may include a cell capacitor and an access transistor. A gate of the access transistor may be connected to a word line corresponding thereto from among a plurality of word lines arranged in the row direction. One of a source and a drain of the access transistor may be connected to a bit line or a complementary bit line, which is arranged in the column direction, and the other may be connected to the cell capacitor.

The peripheral circuit area 24 may include a row decoder 52, a sense amplifier 54, a column decoder 56, a self refresh control circuit 58, a command decoder 60, a mode register set/extended mode register set (MRS/EMRS) circuit 62, an address buffer 64, and a data input/output circuit 66.

The sense amplifier 54 may sense and amplify data of a memory cell and may store data in the memory cell. The sense amplifier 54 may be implemented by a cross-coupled amplifier connected between a bit line and a complementary bit line, which are included in the memory cell array 22A.

Data DQ input through the data input/output circuit 66 may be written to the memory cell array 22A, based on an address signal ADD, and the data DQ read from the memory cell array 22A, based on the address signal ADD, may be output to the outside of the integrated circuit device 10 through the data input/output circuit 66. To designate a memory cell for data to be written to or to be read from, the address signal ADD may be input to the address buffer 64. The address buffer 64 may temporarily store the address signal ADD, which is input from outside thereof.

The row decoder 52 may decode a row address in the address signal ADD, which is output from the address buffer 64, to designate a word line connected to a memory cell for data to be input to or to be output from. For example, the row decoder 52, in a data write or read mode, may decode a row address output from the address buffer 64 and thus enable a word line corresponding to the row address. In addition, the row decoder 52, in a self refresh mode, may decode a row address generated by an address counter and thus enable a word line corresponding to the row address.

The column decoder 56 may decode a column address in the address signal ADD, which is output from the address buffer 64, to designate a bit line connected to a memory cell for data to be input to or to be output from. The memory cell array 22A may output data from or write data to a memory cell designated by the row and column addresses.

The command decoder 60 may receive a command signal CMD applied from outside thereof and may internally generate a decoded command signal, for example, a self refresh enter command or a self refresh exit command, by decoding such signals.

The MRS/EMRS circuit 62 may set a mode register internal thereto in response to an MRS/EMRS command for designating an operation mode of the integrated circuit device 10.

The integrated circuit device 10 may further include a clock circuit for generating a clock signal, a power supply circuit generating or distributing internal voltages by receiving power supply voltages applied from outside thereof, or the like.

The self refresh control circuit 58 may control a self refresh operation of the integrated circuit device 10, in response to a command that is output from the command decoder 60. In an embodiment, the command decoder 60 may include an address counter, a timer, and a core voltage generator. The address counter may generate a row address for designating a row address targeted by self refresh, in response to a self refresh enter command output from the command decoder 60, and apply the row address to the row decoder 52. The address counter may stop a counting operation, in response to a self refresh exit command output from the command decoder 60.

Figure 3A:
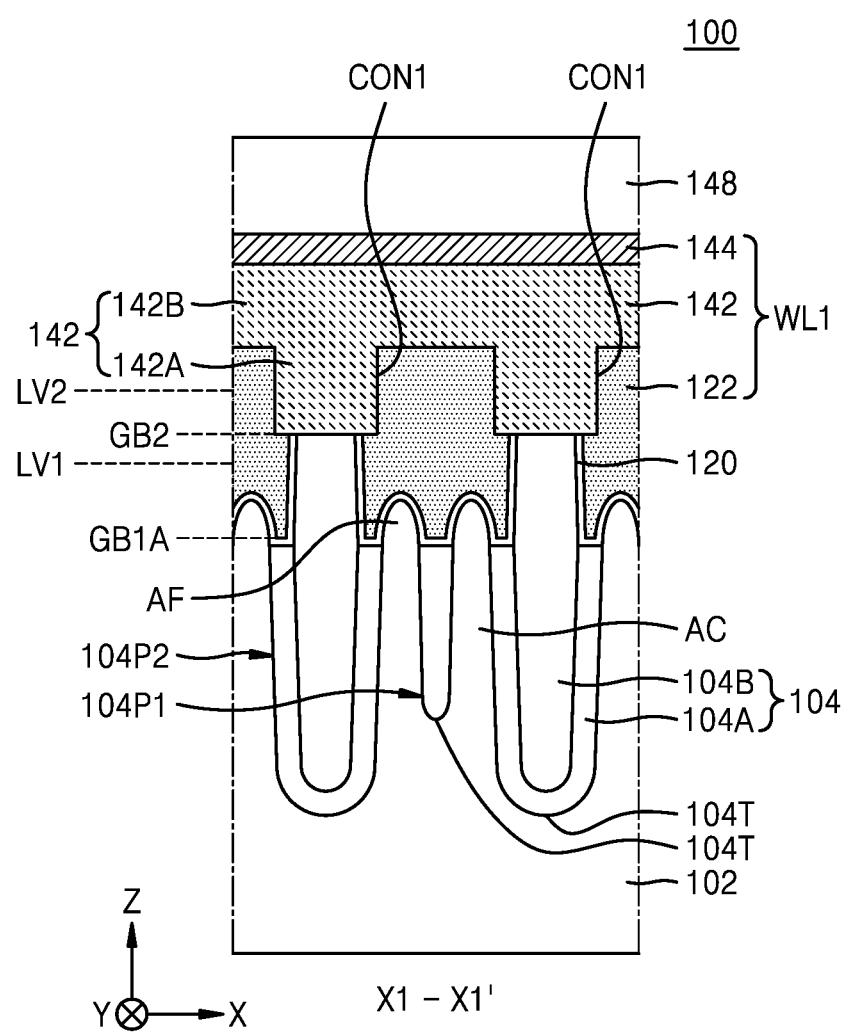
FIGS. 3A to 3D are diagrams illustrating an integrated circuit device according to some embodiments, and in particular.
Figure 3B:
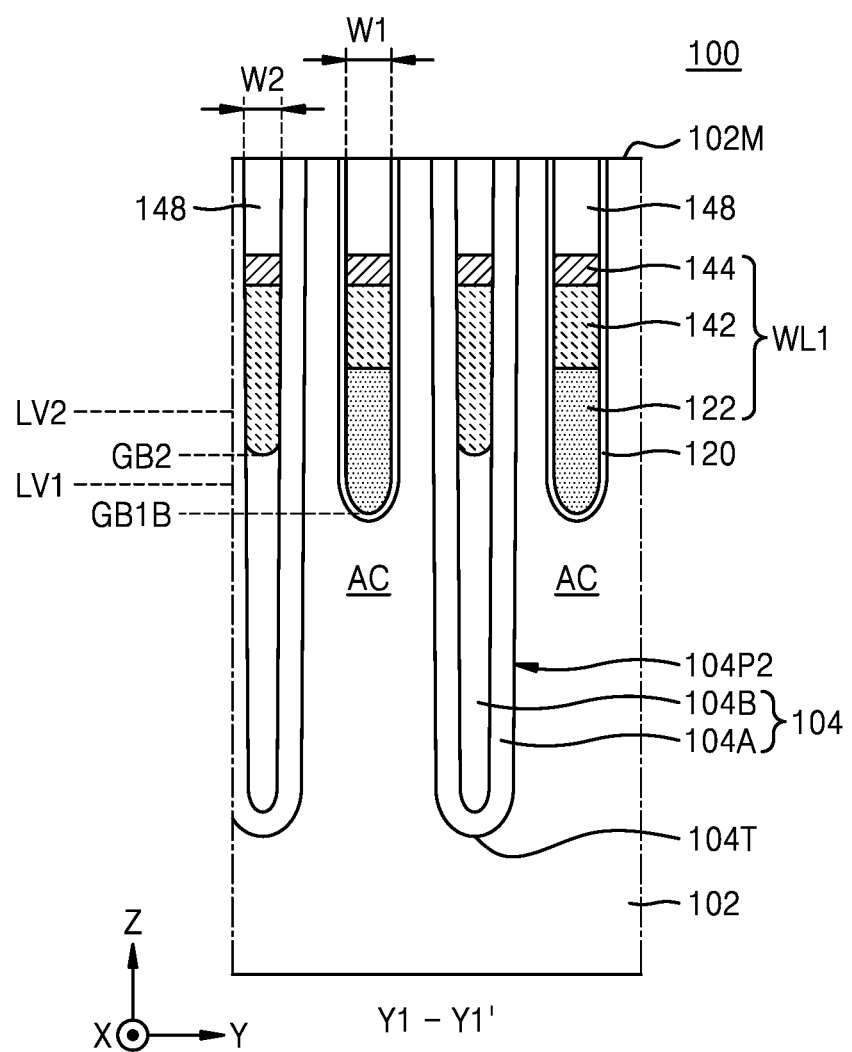
Figure 3C:
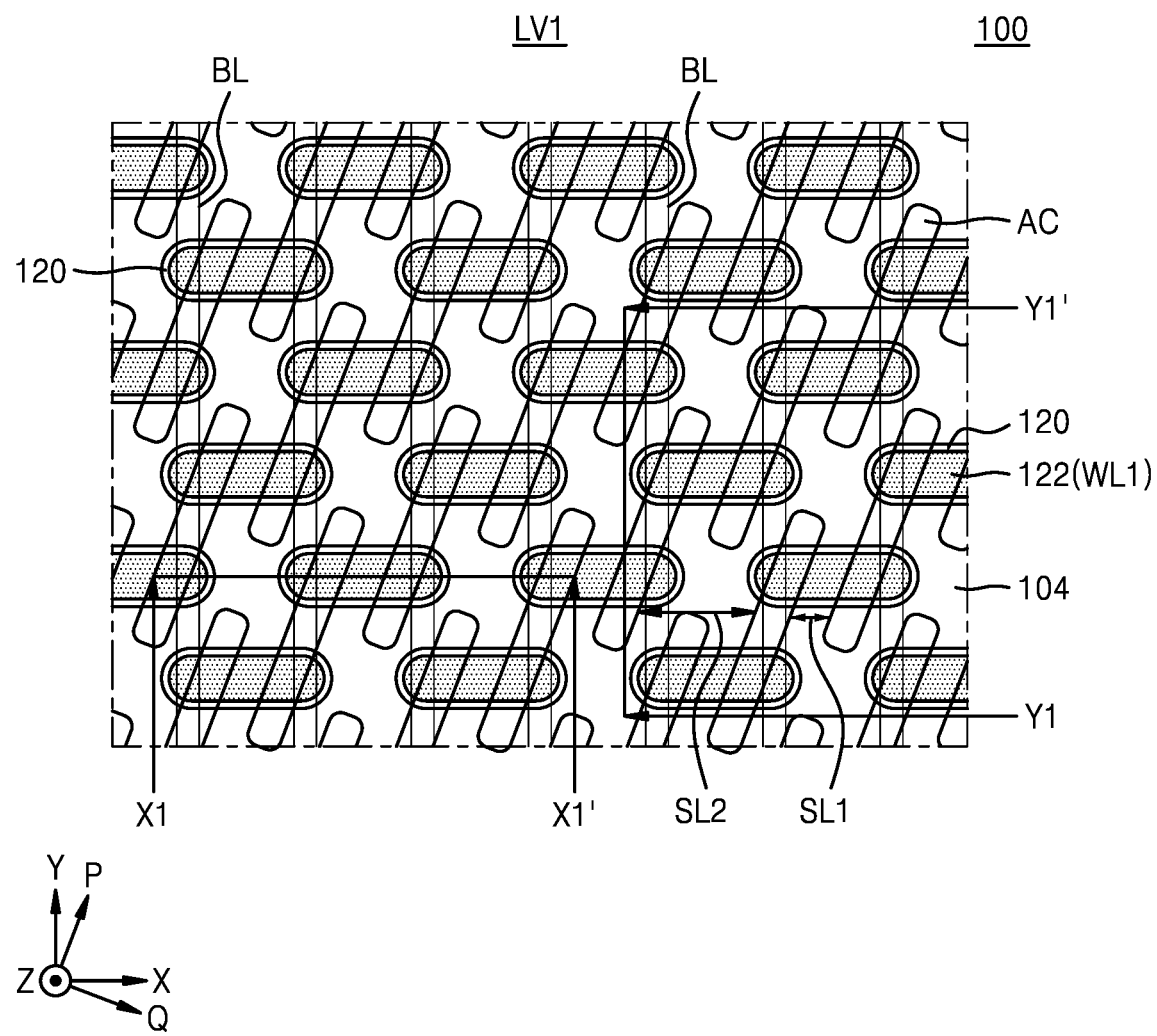
Figure 3D:
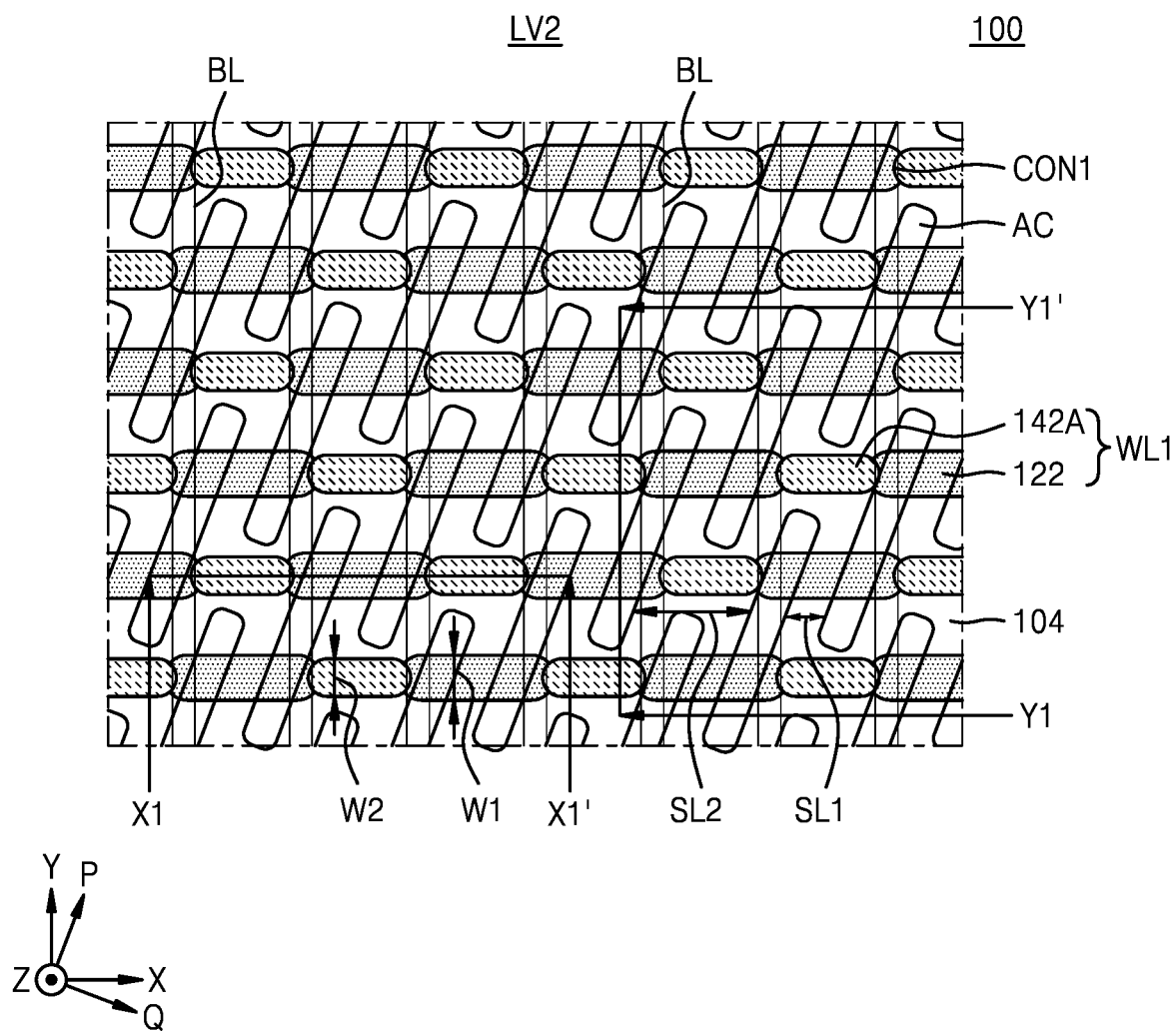

FIGS. 3A to 3D are diagrams illustrating an integrated circuit device 100 according to some embodiments. More specifically, FIG. 3A is a cross-sectional view illustrating some components of the integrated circuit device 100, which correspond to a cross-section taken along a line X1-X1' of FIGS. 3C and 3D, FIG. 3B is a cross-sectional view illustrating some components of the integrated circuit device 100, which correspond to a cross-section taken along a line Y1-Y1' of FIGS. 3C and 3D, FIG. 3C is a planar layout of the integrated circuit device 100, which illustrates some components of the integrated circuit device 100 on a plane along a first vertical level LV1 of each of FIGS. 3A and 3B, and FIG. 3D is a planar layout of the integrated circuit device 100, which illustrates some components of the integrated circuit device 100 on a plane along a second vertical level LV2 of each of FIGS. 3A and 3B.

Referring to FIGS. 3A to 3D, the integrated circuit device 100 may constitute the memory cell area 22 shown in FIGS. 1 and 2. The integrated circuit device 100 may include a substrate 102, in which a plurality of active regions AC are defined by a device isolation trench 104T. The device isolation trench 104T may be filled with a device isolation film 104. The device isolation film 104 may be arranged on the substrate 102 to surround the plurality of active regions AC. In an embodiment, the device isolation film 104 may include a silicon oxide film, a silicon nitride film, or a combination thereof.

A vertical level of a lower surface of the device isolation trench 104T may vary depending on a horizontal width of the device isolation trench 104T. For example, in an embodiment, the lower surface of the device isolation trench 104T may be positioned at a lower vertical level as the horizontal width of the device isolation trench 104T increases. As used herein, the term "vertical level" refers to a height in a vertical direction (Z direction or −Z direction) from a main surface 102M of the substrate 102.

In an embodiment, the substrate 102 may include silicon, for example, single-crystal silicon, polycrystalline silicon, or amorphous silicon. In some embodiments, the substrate 102 may include at least one selected from Ge, SiGe, SiC, GaAs, InAs, and InP. In some embodiments, the substrate 102 may include a conductive region, for example, a dopant-doped well or a dopant-doped structure.

As shown in FIGS. 3C and 3D, each of the plurality of active regions AC may include an upper surface having a minor axis and a major axis in horizontal directions, and the plurality of active regions AC may be repeatedly arranged apart from each other in a major-axis direction (P direction) of the active region AC and a minor-axis direction (Q direction) of the active region AC. In an embodiment, the center points of active regions AC immediately adjacent to each other in the Q direction may be offset from each other (e.g., in the P direction).

A pair of active regions AC closest to (e.g., adjacent) to each other in a first horizontal direction (X direction) from among the plurality of active regions AC may be spaced apart from each other by as much as a first separation distance SL1 in the first horizontal direction (X direction). The plurality of active regions AC may include a plurality of pairs of active regions AC which each include a pair of active regions AC that are spaced apart from each other by as much as the first separation distance SL1, and the plurality of pairs of active regions AC may be spaced apart from each other by as much as a second separation distance SL2, which is greater than the first separation distance SL1, in the first horizontal direction (X direction).

As shown in FIGS. 3A and 3B, the device isolation film 104 may include a first insulating film 104A and a second insulating film 104B, which include different materials from each other. In an embodiment, portions of a plurality of device isolation trenches 104T, which have relatively small horizontal widths, may be filled with only the first insulating film 104A out of the first insulating film 104A and the second insulating film 104B, and portions of the plurality of device isolation trenches 104T, which have relatively large horizontal widths, may be filled with the first insulating film 104A and the second insulating film 104B. In the portions of the plurality of device isolation trenches 104T, which have relatively large horizontal widths, the second insulating film 104B may be arranged on the first insulating film 104A and fill the remaining portions of the device isolation trenches 104T, which are defined by the first insulating film 104A. For example, the second insulating film 104B may directly contact a bottom surface and inner lateral surfaces of the first insulating film 104A.

The integrated circuit device 100 may include a plurality of word lines WL1 extending lengthwise along a straight line in the first horizontal direction (X direction), which intersects with each of the major-axis direction (P direction) and the minor-axis direction (Q direction) of the plurality of active regions AC. Each of the plurality of word lines WL1 may be arranged on a group of active regions AC, which are arranged in a line in the first horizontal direction (X direction), and the device isolation film 104 may be arranged therebetween. Each of the plurality of word lines WL1 may extend lengthwise in the first horizontal direction (X direction), across the group of active regions AC of the plurality of active regions AC and arranged in the first horizontal direction (X direction), and the device isolation film 104 may be disposed therebetween.

Each of the plurality of word lines WL1 may include a plurality of first conductive patterns 122 and a plurality of second conductive patterns 142A, which are alternately arranged one-by-one in the first horizontal direction (X direction), a conductive line portion 142B covering an upper surface of each of the plurality of first conductive patterns 122 and the plurality of second conductive patterns 142A, and a doped semiconductor pattern 144 covering an upper surface of the conductive line portion 142B. In each of the plurality of word lines WL1, the plurality of second conductive patterns 142A may be integrally connected to the conductive line portion 142B. In each of the plurality of word lines WL1, the plurality of second conductive patterns 142A and the conductive line portion 142B may constitute one connecting line 142. In each of the plurality of word lines WL1, each of the plurality of first conductive patterns 122 and the plurality of second conductive patterns 142A may have a major axis, which is parallel to the first horizontal direction (X direction), and a minor axis, which is parallel to a second horizontal direction (Y direction) that is perpendicular to the first horizontal direction (X direction).

In each of the plurality of word lines WL1, the plurality of first conductive patterns 122 may be spaced apart from each other in the first horizontal direction (X direction). In an embodiment, each of the plurality of first conductive patterns 122 may cover a pair of active regions AC of the plurality of active regions AC, and a first portion 104P1 (see FIG. 3A) of the device isolation film 104 between each active region AC of the pair of active regions AC, the pair of active regions AC being spaced apart from each other by as much as the first separation distance SL1 in the first horizontal direction (X direction) and closest to each other (e.g., immediately adjacent to each other) in the first horizontal direction (X direction).

In each of the plurality of word lines WL1, the plurality of second conductive patterns 142A may be spaced apart from each other in the first horizontal direction (X direction). The plurality of second conductive patterns 142A may be arranged one-by-one between the plurality of first conductive patterns 122. Each of the plurality of second conductive patterns 142A may cover a second portion 104P2 (see FIGS. 3A and 3B) of the device isolation film 104 between an active region AC of a first pair of active regions AC and an active region AC of an immediately-adjacent second pair of active regions AC, which are spaced apart from each other by as much as the second separation distance SL2 that is greater than the first separation distance SL1 in the first horizontal direction (X direction).

As shown in FIGS. 3A and 3B, a vertical distance from the main surface 102M of the substrate 102 to a lowermost surface GB1A of each of the plurality of first conductive patterns 122 may be greater than a vertical distance from the main surface 102M of the substrate 102 to a lowermost surface GB2 of each of the plurality of second conductive patterns 142A. As used herein, the term "vertical distance" refers to a distance in the vertical direction (Z direction). A vertical level of the lowermost surface GB1A of each of the plurality of first conductive patterns 122 may be lower than a vertical level of the lowermost surface GB2 of each of the plurality of second conductive patterns 142A.

As shown in FIG. 3D, in the second horizontal direction (Y direction), a first width W1 of each of the plurality of first conductive patterns 122 may be greater than a second width W2 of each of the plurality of second conductive patterns 142A. In some embodiments, in the second horizontal direction (Y direction), the width of the conductive line portion 142B shown in FIGS. 3A and 3B may be equal to or similar to the second width W2 of each of the plurality of second conductive patterns 142A. In some embodiments, portions of the plurality of first conductive patterns 122, which overlap the first portion 104P1 of the device isolation film 104 in the vertical direction (Z direction), may each have the first width W1 in the second horizontal direction (Y direction). Portions of the plurality of second conductive patterns 142A, which overlap the second portion 104P2 of the device isolation film 104 in the vertical direction (Z direction), may each have the second width W2, which is less than the first width W1, in the second horizontal direction (Y direction).

As shown in FIG. 3D, in each of the plurality of word lines WL1, each of the plurality of first conductive patterns 122 and the plurality of second conductive patterns 142A may have a major axis in the first horizontal direction (X direction) and may have a shape extending lengthwise in the first horizontal direction (X direction). As such, in an embodiment in which each of the plurality of first conductive patterns 122 and the plurality of second conductive patterns 142A has a major axis in the first horizontal direction (X direction), an alignment margin may be maintained when pattern formation processes are performed for alternately arranging the plurality of first conductive patterns 122 and the plurality of second conductive patterns 142A one-by-one such that the plurality of first conductive patterns 122 and the plurality of second conductive patterns 142A are consecutively connected to each other without interruption in the first horizontal direction (X direction).

As shown in FIGS. 3A and 3D, each of the plurality of word lines WL1 may include a plurality of contact surfaces CON1 between the plurality of first conductive patterns 122 and the plurality of second conductive patterns 142A. Each of the plurality of contact surfaces CON1 may be a contact surface between one first conductive pattern 122 of the plurality of first conductive patterns 122, and one second conductive pattern 142A of the plurality of second conductive patterns 142A.

In some embodiments, each of the plurality of first conductive patterns 122, the plurality of second conductive patterns 142A, and the conductive line portion 142B may include, but is not necessarily limited to, Ti, TiN, Ta, TaN, W, WN, Mo, TiSiN, WSiN, or a combination thereof. In some embodiments, the plurality of first conductive patterns 122, the plurality of second conductive patterns 142A, and the conductive line portion 142B may include the same material. In some embodiments, at least some of the plurality of first conductive patterns 122, the plurality of second conductive patterns 142A, and the conductive line portion 142B may include different materials from each other. For example, in an embodiment each of the plurality of first conductive patterns 122, the plurality of second conductive patterns 142A, and the conductive line portion 142B may include TiN. In an embodiment, the plurality of first conductive patterns 122 may include TiN, and each of the plurality of second conductive patterns 142A and the conductive line portion 142B may include W or Mo.

In some embodiments, the plurality of second conductive patterns 142A may include a material having a lower resistivity than a constituent material of the plurality of first conductive patterns 122. For example, in an embodiment the plurality of first conductive patterns 122 may include a metal or a conductive metal nitride, which has a first resistivity, and each of the plurality of second conductive patterns 142A and the conductive line portion 142B may include a metal or a conductive metal nitride, which has a second resistivity that is less than the first resistivity.

In an embodiment, the plurality of first conductive patterns 122 may include a TiN film having a first average grain size, and each of the plurality of second conductive patterns 142A and the conductive line portion 142B may include a TiN film having a second average grain size that is greater than the first average grain size. The TiN film may have a lower resistivity with the increasing average grain size thereof. To control the average grain size of the TiN film, process conditions, such as a deposition temperature, a deposition pressure, and the like, may be controlled in a process of forming the TiN film.

In an embodiment, the plurality of first conductive patterns 122 may include a TiN film having a first surface roughness, and each of the plurality of second conductive patterns 142A and the conductive line portion 142B may include a TiN film having a second surface roughness that is less than the first surface roughness. The TiN film may have a lower resistivity with the decreasing surface roughness thereof. To control the surface roughness of the TiN film, process conditions, such as a deposition temperature, a deposition pressure, and the like, may be controlled in a process of forming the TiN film.

As shown in FIGS. 3A and 3B, in each of the plurality of word lines WL1, the doped semiconductor pattern 144 may cover (e.g., is disposed directly thereon) the upper surface of the conductive line portion 142B. The doped semiconductor pattern 144 may have a shape extending lengthwise in the first horizontal direction (X direction), over or on each of the plurality of first conductive patterns 122 and the plurality of second conductive patterns 142A. The doped semiconductor pattern 144 may directly contact the upper surface of the conductive line portion 142B and may be spaced apart from the plurality of first conductive patterns 122 in the vertical direction (Z direction) with the conductive line portion 142B therebetween. In some embodiments, the doped semiconductor pattern 144 may include a doped polysilicon pattern.

As shown in FIGS. 3A and 3B, the integrated circuit device 100 may include a plurality of gate dielectric films 120 between the plurality of first conductive patterns 122 and each active region AC of the substrate 102. The plurality of gate dielectric films 120 under one word line WL1 may be arranged to be spaced apart from each other in the first horizontal direction (X direction). The plurality of gate dielectric films 120 may be spaced apart from each other with the second portion 104P2 of the device isolation film 104 and a second conductive pattern 142A of the plurality of second conductive patterns 142A therebetween. The second conductive pattern 142A between the plurality of gate dielectric films 120 may overlap the second portion 104P2 of the device isolation film 104 in the vertical direction (Z direction).

As shown in FIG. 3A, each of the plurality of active regions AC may include an active fin region AF surrounded by the first conductive pattern 122 included in the word line WL1. Each of the plurality of gate dielectric films 120 may be arranged between the word line WL1 and the active fin region AF of the active region AC and between the word line WL1 and the first portion 104P1 of the device isolation film 104. Each of the plurality of gate dielectric films 120 may include a portion directly contacting the active fin region AF to surround the active fin region AF of the active region AC, a portion directly contacting the first portion 104P1 of the device isolation film 104, and a portion arranged between the second portion 104P2 of the device isolation film 104 and the first conductive pattern 122 to directly contact each of the second portion 104P2 of the device isolation film 104 and the first conductive pattern 122. Each of the plurality of gate dielectric films 120 may not be arranged between the plurality of second conductive patterns 142A and the device isolation film 104. For example, a lower portion of the plurality of second conductive patterns 142A may directly contact the device isolation film 104.

In the plurality of word lines WL1, each of the plurality of first conductive patterns 122 may be spaced apart from the active fin region AF of the active region AC with the gate dielectric film 120 therebetween. As shown in FIGS. 3A and 3B, the lowermost surface GB1A of each of the plurality of first conductive patterns 122 may be located at a position, which vertically overlaps the device isolation film 104, such as the second insulating film 104B, and a vertical level of a lower surface GB1B of a portion of the first conductive pattern 122, which vertically overlaps the active region AC, may be higher than the vertical level of the lowermost surface GB1A of each of the plurality of first conductive patterns 122.

In some embodiments, each of the plurality of gate dielectric films 120 may include a silicon oxide film, a silicon nitride film, an oxide/nitride/oxide (ONO) film, a metal oxide film including a high-k dielectric film, or a combination thereof. The high-k dielectric film, which is a film having a higher dielectric constant than a silicon oxide film, may have a dielectric constant of about 10 to about 25 and may include, but is not necessarily limited to, for example, $HfO_2$, $Al_2O_3$, $HfAlO_3$, $Ta_2O_3$, or $TiO_2$.

As shown in FIGS. 3C and 3D, two first conductive patterns 122 adjacent to each other in the second horizontal direction (Y direction) may be arranged over one active region AC. In FIGS. 3C and 3D, a plurality of bit lines BL arranged on the main surface 102M of the substrate 102 are illustrated. Each of the plurality of bit lines BL may extend lengthwise in the second horizontal direction (Y direction). Each of the plurality of bit lines BL may include portions respectively overlapping the active regions AC in the vertical direction (Z direction). In each of the plurality of bit lines BL, each of the portions respectively overlapping the active regions AC in the vertical direction (Z direction) may be located between two first conductive patterns 122 adjacent to each other in the second horizontal direction (Y direction).

As shown in FIGS. 3A and 3B, the upper surface of each of the plurality of word lines WL may be covered by a buried insulating film 148. In an embodiment, the buried insulating film 148 may include a silicon nitride film, a silicon oxynitride film, a silicon oxide film, or a combination thereof. In the plurality of active regions AC, a plurality of source/drain regions may be arranged on both sides of each of the plurality of word lines WL1.

The integrated circuit device 100 shown in FIGS. 3A to 3D includes the plurality of word lines WL1, which extend lengthwise in the first horizontal direction (X direction) across the group of active regions AC including the plurality of active regions AC arranged in the first horizontal direction (X direction) and across the device isolation film 104 between the plurality of active regions AC. Each of the plurality of word lines WL1 may include the plurality of first conductive patterns 122 and the plurality of second conductive patterns 142A, which are alternately arranged one-by-one in the first horizontal direction (X direction), the conductive line portion 142B covering the upper surface of each of the plurality of first conductive patterns 122 and the plurality of second conductive patterns 142A, and the doped semiconductor pattern 144 covering the upper surface of the conductive line portion 142B. To form the plurality of word lines WL1 in the integrated circuit device 100, a process of forming the plurality of first conductive patterns 122 and a process of forming the plurality of second conductive patterns 142A may be separately performed. To form the plurality of first conductive patterns 122, when structures defining a plurality of first trenches are formed by performing an etching process for forming the plurality of first trenches, for example, a plurality of first trenches T1A shown in FIGS. 13A to 13E, portions of the substrate 102 and the device isolation film 104, which occupy regions for the plurality of second conductive patterns 142A to be formed in, may support the structures defining the plurality of first trenches. Accordingly, even when the structures defining the plurality of first trenches have relatively small widths and relatively high aspect ratios, process defects, such as leaning or collapse of the structures defining the plurality of first trenches, may be prevented from being generated in the substrate 102 and the device isolation film 104. In addition, to form the plurality of second conductive patterns 142A, when structures defining a plurality of second trenches are formed by performing an etching process for forming the plurality of second trenches, for example, a plurality of second trenches T1B shown in FIGS. 21A to 21C, portions filling the plurality of first trenches may support the structures defining the plurality of second trenches. Accordingly, even when the structures defining the plurality of second trenches have relatively small widths and relatively high aspect ratios, process defects, such as the leaning or collapse of the structures defining the plurality of second trenches, may be prevented from being generated in the substrate 102 and the device isolation film 104. Therefore, the reliability of the integrated circuit device 100 may be increased.

In addition, in the integrated circuit device 100, the constituent material of the plurality of second conductive patterns 142A may be independently employed regardless of the constituent material of the plurality of first conductive patterns 122. Accordingly, a material having a relatively low resistivity may be used as the constituent material of the plurality of second conductive patterns 142A, and in this embodiment, the resistance in the plurality of word lines WL1 may be further reduced.

In addition, the integrated circuit device 100 may have a structure in which, in the second horizontal direction (Y direction), the second width W2 of each of the plurality of second conductive patterns 142A is less than the first width W1 of each of the plurality of first conductive patterns 122. Accordingly, each of the plurality of second conductive patterns 142A may be arranged only on the second portion 104P2 of the device isolation film 104 without overlapping the active region AC, which is adjacent thereto in the second horizontal direction (Y direction), in the vertical direction (Z direction). In addition, the vertical distance from the main surface 102M of the substrate 102 to the lowermost surface GB2 of each of the plurality of second conductive patterns 142A may be less than the vertical distance from the main surface 102M of the substrate 102 to the lowermost surface GB1A of each of the plurality of first conductive patterns 122. Accordingly, a passing gate effect may be suppressed. The passing gate effect is a phenomenon in which, when a word line WL1 passing through one active region AC is enabled, a cell transistor of another word line WL1 passing through another active region AC adjacent to the one active region AC undergoes a reduction in the threshold voltage thereof. Therefore, the reliability of the integrated circuit device 100 may be increased.

Figure 4A:
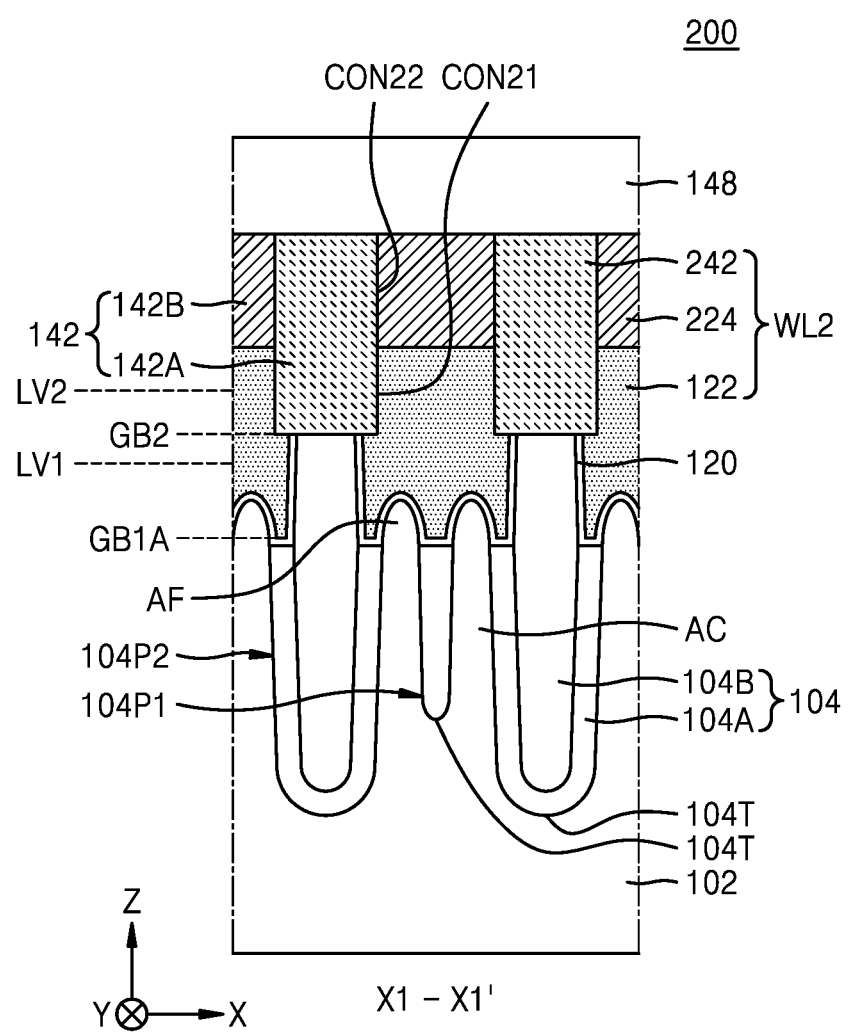
FIGS. 4A and 4B are cross-sectional views illustrating an integrated circuit device according to some embodiments.
Figure 4B:
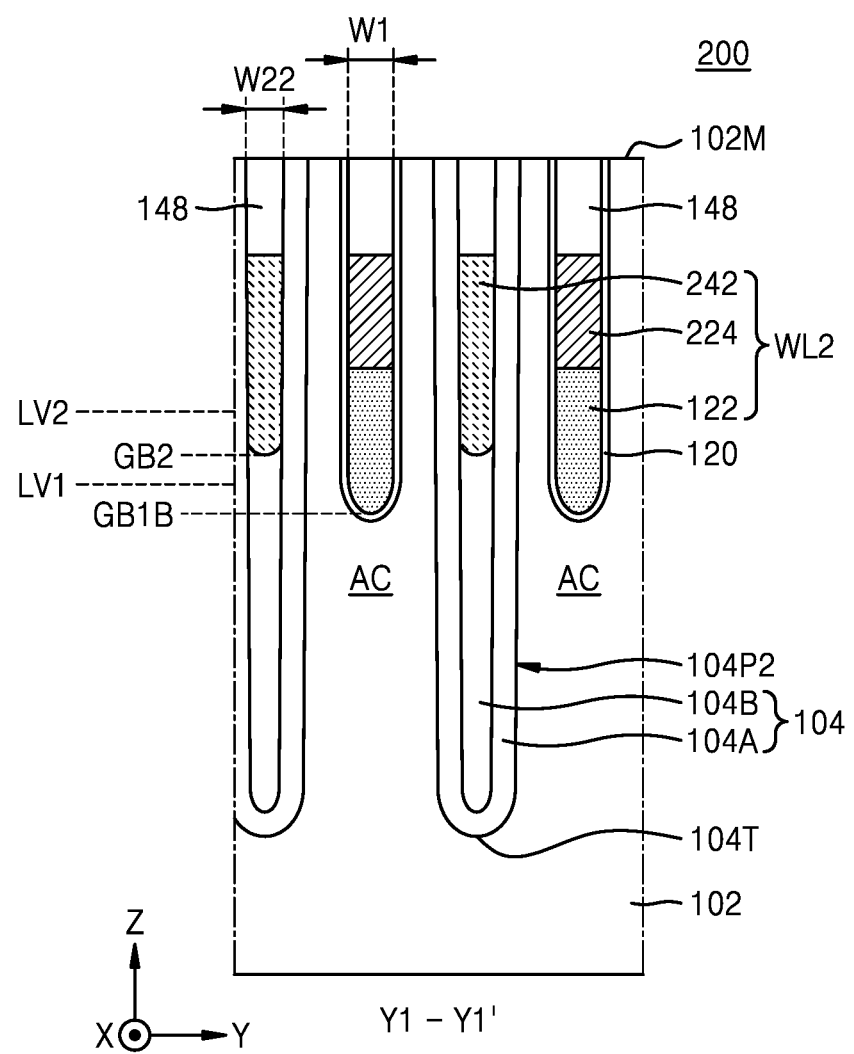

FIGS. 4A and 4B are cross-sectional views illustrating an integrated circuit device 200 according to some embodiments, and in particular, FIG. 4A is a cross-sectional view illustrating some components in a region corresponding to a cross-section taken along the line X1-X1' of FIGS. 3C and 3D, and FIG. 4B is a cross-sectional view illustrating some components in a region corresponding to a cross-section taken along the line Y1-Y1' of FIGS. 3C and 3D. Regarding FIGS. 4A and 4B, the same reference numerals as in FIGS. 3A to 3D respectively denote the same members, and here, repeated descriptions thereof are omitted for economy of description.

Referring to FIGS. 4A and 4B, the integrated circuit device 200 may constitute the memory cell area 22 shown in FIGS. 1 and 2. The integrated circuit device 200 may have substantially the same configuration as the integrated circuit device 100 described with reference to FIGS. 3A to 3D. In each of FIGS. 4A and 4B, a planar structure along the first vertical level LV1 is substantially the same as shown in FIG. 3C, and a planar structure along the second vertical level LV2 is substantially the same as shown in FIG. 3D. However, the integrated circuit device 200 includes a plurality of word lines WL2 and does not include the plurality of word lines WL1.

The plurality of word lines WL2 have substantially the same configuration as the plurality of word lines WL1 described with reference to FIGS. 3A to 3D. However, each of the plurality of word lines WL2 may include the plurality of first conductive patterns 122 and a plurality of second conductive patterns 242, which are alternately arranged one-by-one in the first horizontal direction (X direction), and a plurality of doped semiconductor patterns 224 respectively covering upper surfaces of the plurality of first conductive patterns 122, upper portions of lateral side surfaces of the plurality of second conductive patterns 242 and not covering upper surfaces of the plurality of second conductive patterns 242. In one word line WL2, the plurality of doped semiconductor patterns 224 may be arranged to be spaced apart from each other in the first horizontal direction (X direction) with a second conductive pattern 242 therebetween. An upper surface of each of the plurality of word lines WL2 may covered by the buried insulating film 148.

In the plurality of word lines WL2, each of the plurality of first conductive patterns 122 and the plurality of second conductive patterns 242 may have a major axis, which is parallel to the first horizontal direction (X direction), and a minor axis, which is parallel to the second horizontal direction (Y direction). At the first vertical level LV1, planar shapes of the plurality of first conductive patterns 122 may be substantially the same as shown in FIG. 3C. At the second vertical level LV2, respective planar shapes of the plurality of first conductive patterns 122 and the plurality of second conductive patterns 242 may be substantially the same as shown in FIG. 3D. A more detailed configuration of the plurality of first conductive patterns 122 is the same as described with reference to FIGS. 3A and 3B and is not repeated for economy of description.

In each of the plurality of word lines WL2, the plurality of second conductive patterns 242 may be spaced apart from each other in the first horizontal direction (X direction). The plurality of second conductive patterns 242 may be arranged one-by-one between the plurality of first conductive patterns 122. Similar to the description made regarding the plurality of second conductive patterns 142A with reference to FIG. 3D, each of the plurality of second conductive patterns 242 may cover the second portion 104P2 of the device isolation film 104 between a pair of active regions AC (see FIG. 3D), which are spaced apart from each other by as much as the second separation distance SL2 in the first horizontal direction (X direction).

The vertical distance from the main surface 102M of the substrate 102 to the lowermost surface GB1A of each of the plurality of first conductive patterns 122 may be greater than the vertical distance from the main surface 102M of the substrate 102 to the lowermost surface GB2 of each of the plurality of second conductive patterns 242. The vertical level of the lowermost surface GB1A of each of the plurality of first conductive patterns 122 may be lower than the vertical level of the lowermost surface GB2 of each of the plurality of second conductive patterns 242. As shown in FIG. 4B, in the second horizontal direction (Y direction), the first width W1 of each of the plurality of first conductive patterns 122 may be greater than a second width W22 of each of the plurality of second conductive patterns 242.

As shown in FIG. 4A, each of the plurality of word lines WL2 may include a plurality of contact surfaces CON21 between the plurality of first conductive patterns 122 and the plurality of second conductive patterns 242, and a plurality of contact surfaces CON22 between the plurality of second conductive patterns 242 and the plurality of doped semiconductor patterns 224.

In some embodiments, the plurality of second conductive patterns 242 may include a material having a lower resistivity than the constituent material of the plurality of first conductive patterns 122. The constituent material of the plurality of second conductive patterns 242 is the same as described regarding the constituent material of the plurality of second conductive patterns 142A with reference to FIGS. 3A and 3D. A constituent material of each of the plurality of doped semiconductor patterns 224 is the same as described regarding the constituent material of the doped semiconductor pattern 144 with reference to FIGS. 3A and 3D.

The integrated circuit device 200 may include the plurality of gate dielectric films 120 between the plurality of first conductive patterns 122 and each active region AC of the substrate 102. Each of the plurality of gate dielectric films 120 may be arranged between the word line WL2 and the active fin region AF of the active region AC and between the word line WL2 and the first portion 104P1 of the device isolation film 104. Each of the plurality of gate dielectric films 120 may not be arranged between the plurality of second conductive patterns 242 and the device isolation film 104.

The lowermost surface GB1A of each of the plurality of first conductive patterns 122 may be located at a position, which vertically overlaps the device isolation film 104 and the vertical level of the lower surface GB1B of the portion of the first conductive pattern 122, which vertically overlaps the active region AC, may be higher than the vertical level of the lowermost surface GB1A of each of the plurality of first conductive patterns 122.

The integrated circuit device 200 shown in FIGS. 4A and 4B may include the plurality of word lines WL2, and each of the plurality of word lines WL2 may include the plurality of first conductive patterns 122 and the plurality of second conductive patterns 242, which are alternately arranged one-by-one in the first horizontal direction (X direction), and the plurality of doped semiconductor patterns 224 respectively covering the upper surfaces of the plurality of first conductive patterns 122. To form the plurality of word lines WL2 in the integrated circuit device 200, a process of forming the plurality of first conductive patterns 122 and a process of forming the plurality of second conductive patterns 242 may be separately performed. Accordingly, similar to the description of the integrated circuit device 100 shown in FIGS. 3A to 3D, after an etching process for forming the structures defining the plurality of first trenches in the substrate 102 is performed to form the plurality of first conductive patterns 122, and after an etching process for forming the structures defining the plurality of second trenches in the substrate 102 is performed to form the plurality of second conductive patterns 242, even when the structures have relatively small widths and relatively high aspect ratios, process defects, such as the leaning or collapse of the structures, may be prevented from being generated in the substrate 102. In addition, in the integrated circuit device 200, by using a material having a relatively low resistivity as the constituent material of the plurality of second conductive patterns 242, the resistance in the plurality of word lines WL2 may be reduced. In addition, since the integrated circuit device 200 has a structure in which, in the second horizontal direction (Y direction), the second width W22 of each of the plurality of second conductive patterns 242 is less than the first width W1 of each of the plurality of first conductive patterns 122, and in which the vertical distance from the main surface 102M of the substrate 102 to the lowermost surface GB2 of each of the plurality of second conductive patterns 242 is less than the vertical distance from the main surface 102M of the substrate 102 to the lowermost surface GB1A of each of the plurality of first conductive patterns 122, the passing gate effect may be suppressed. Therefore, the reliability of the integrated circuit device 200 may be increased.

Figure 5A:
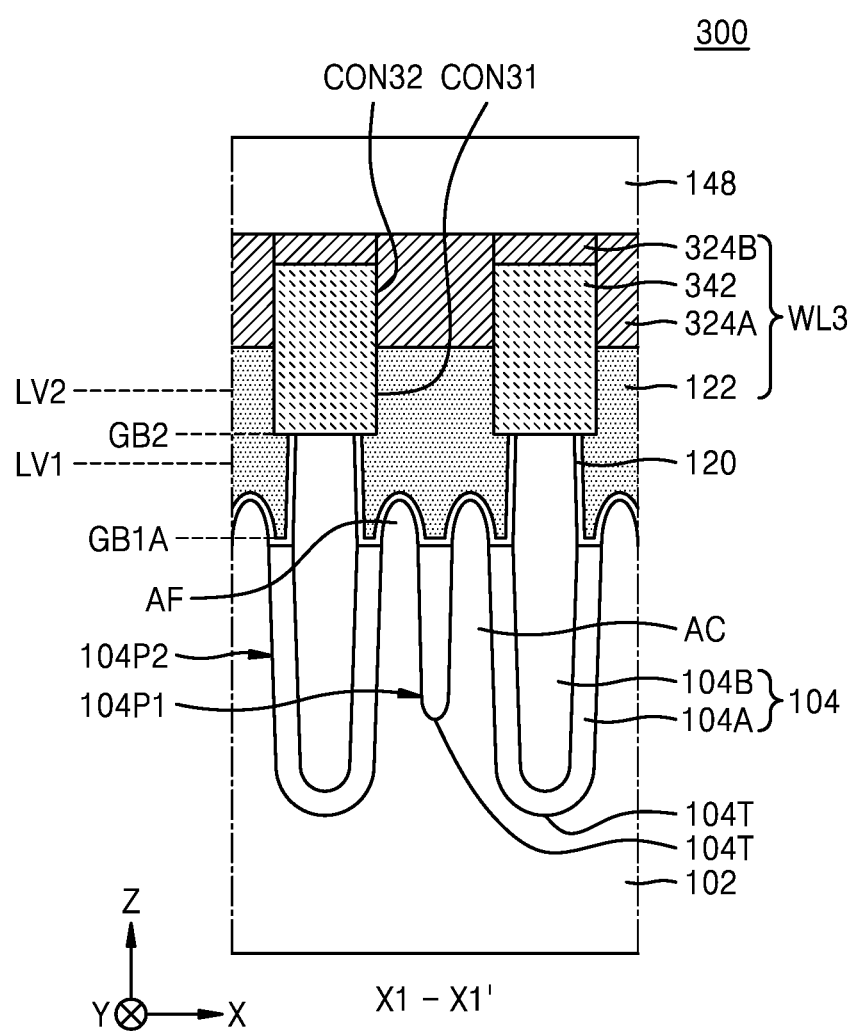
FIGS. 5A and 5B are cross-sectional views illustrating an integrated circuit device according to some embodiments.
Figure 5B:
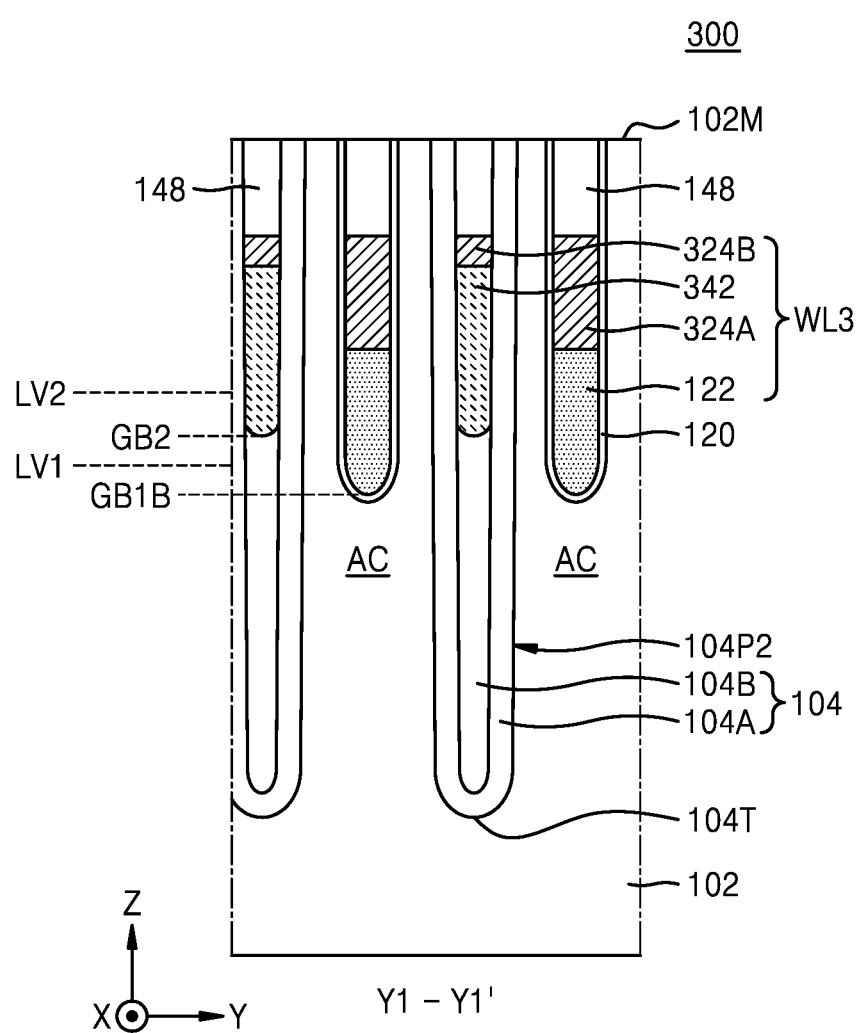

FIGS. 5A and 5B are cross-sectional views illustrating an integrated circuit device 300 according to some embodiments, and in particular, FIG. 5A is a cross-sectional view illustrating some components in a region corresponding to a cross-section taken along the line X1-X1' of FIGS. 3C and 3D, and FIG. 5B is a cross-sectional view illustrating some components in a region corresponding to a cross-section taken along the line Y1-Y1' of FIGS. 3C and 3D. Regarding FIGS. 5A and 5B, the same reference numerals as in FIGS. 3A to 3D respectively denote the same members, and here, repeated descriptions thereof are omitted for economy of description.

Referring to FIGS. 5A and 5B, the integrated circuit device 300 may constitute the memory cell area 22 shown in FIGS. 1 and 2. The integrated circuit device 300 may have substantially the same configuration as the integrated circuit device 100 described with reference to FIGS. 3A to 3D. In each of FIGS. 5A and 5B, a planar structure along the first vertical level LV1 is substantially the same as shown in FIG. 3C, and a planar structure along the second vertical level LV2 is substantially the same as shown in FIG. 3D. However, the integrated circuit device 300 includes a plurality of word lines WL3 and does not include a plurality of word lines WL1.

The plurality of word lines WL3 have substantially the same configuration as the plurality of word lines WL1 described with reference to FIGS. 3A to 3D. However, each of the plurality of word lines WL3 may include the plurality of first conductive patterns 122 and a plurality of second conductive patterns 342, which are alternately arranged one-by-one in the first horizontal direction (X direction), a plurality of first doped semiconductor patterns 324A respectively covering the upper surfaces of the plurality of first conductive patterns 122 and not covering upper surfaces of the plurality of second conductive patterns 342, and a plurality of second doped semiconductor patterns 324B respectively covering the upper surfaces of the plurality of second conductive patterns 342 and not covering the upper surfaces of the plurality of first conductive patterns 122. An upper surface of each of the plurality of word lines WL3 may be covered by the buried insulating film 148.

In one word line WL3, the plurality of first doped semiconductor patterns 324A may be arranged to be spaced apart from each other in the first horizontal direction (X direction) with a second conductive pattern 342 and a second doped semiconductor pattern 324B therebetween. In one word line WL3, the plurality of second doped semiconductor patterns 324B may be arranged to be spaced apart from each other in the first horizontal direction (X direction) with a first doped semiconductor pattern 324A therebetween. In one word line WL3, the plurality of first doped semiconductor patterns 324A and the plurality of second doped semiconductor patterns 324B may be alternately arranged one-by-one in the first horizontal direction (X direction) to be connected to each other.

In some embodiments, the plurality of first doped semiconductor patterns 324A and the plurality of second doped semiconductor patterns 324B may include the same material. For example, each of the plurality of first doped semiconductor patterns 324A and the plurality of second doped semiconductor patterns 324B may include doped polysilicon. In some embodiments, the plurality of first doped semiconductor patterns 324A and the plurality of second doped semiconductor patterns 324B may include different materials from each other. For example, in an embodiment each of the plurality of first doped semiconductor patterns 324A and the plurality of second doped semiconductor patterns 324B includes doped polysilicon and a doping concentration in the plurality of first doped semiconductor patterns 324A may be different from a doping concentration in the plurality of second doped semiconductor patterns 324B.

As shown in FIG. 5A, each of the plurality of word lines WL3 may include a plurality of contact surfaces CON31 between the plurality of first conductive patterns 122 and the plurality of second conductive patterns 342, and a plurality of contact surfaces CON32 between the plurality of second conductive patterns 342 and the plurality of first doped semiconductor patterns 324A.

In some embodiments, the plurality of second conductive patterns 342 may include a material having a lower resistivity than the constituent material of the plurality of first conductive patterns 122. The constituent material of the plurality of second conductive patterns 342 is the same as described regarding the constituent material of the plurality of second conductive patterns 142A with reference to FIGS. 3A and 3D. A detailed configuration of the plurality of second conductive patterns 342 in each of the plurality of word lines WL3 is substantially the same as described regarding the plurality of second conductive patterns 242 with reference to FIGS. 4A and 4B and a repeated description will be omitted for economy of description.

The integrated circuit device 300 may include the plurality of gate dielectric films 120 between the plurality of first conductive patterns 122 and each active region AC of the substrate 102. Each of the plurality of gate dielectric films 120 may be arranged between the word line WL3 and the active fin region AF of the active region AC and between the word line WL3 and the first portion 104P1 of the device isolation film 104. Each of the plurality of gate dielectric films 120 may not be arranged between the plurality of second conductive patterns 342 and the device isolation film 104.

The lowermost surface GB1A of each of the plurality of first conductive patterns 122 may be located at a position, which vertically overlaps the device isolation film 104, and the vertical level of the lower surface GB1B of the portion of the first conductive pattern 122, which vertically overlaps the active region AC, may be higher than the vertical level of the lowermost surface GB1A of each of the plurality of first conductive patterns 122.

To form the plurality of word lines WL3 during the process of fabricating the integrated circuit device 300 shown in FIGS. 5A and 5B, a process of forming the plurality of first conductive patterns 122 and a process of forming the plurality of second conductive patterns 342 may be separately performed. Accordingly, similar to the description of the integrated circuit device 100 shown in FIGS. 3A to 3D, after an etching process for forming the structures defining the plurality of first trenches in the substrate 102 is performed to form the plurality of first conductive patterns 122, and after an etching process for forming the structures defining the plurality of second trenches in the substrate 102 is performed to form the plurality of second conductive patterns 342, even when the structures have relatively small widths and relatively high aspect ratios, process defects, such as the leaning or collapse of the structures, may be prevented from being generated in the substrate 102. In addition, in the integrated circuit device 300, by using a material having a relatively low resistivity as the constituent material of the plurality of second conductive patterns 342, the resistance in the plurality of word lines WL3 may be reduced. In addition, since the integrated circuit device 300 has a structure in which, in the second horizontal direction (Y direction), the width of each of the plurality of second conductive patterns 342 is less than the width of each of the plurality of first conductive patterns 122, and in which the vertical distance from the main surface 102M of the substrate 102 to the lowermost surface GB2 of each of the plurality of second conductive patterns 342 is less than the vertical distance from the main surface 102M of the substrate 102 to the lowermost surface GB1A of each of the plurality of first conductive patterns 122, the passing gate effect may be suppressed. Therefore, the reliability of the integrated circuit device 300 may be increased.

Figure 6A:
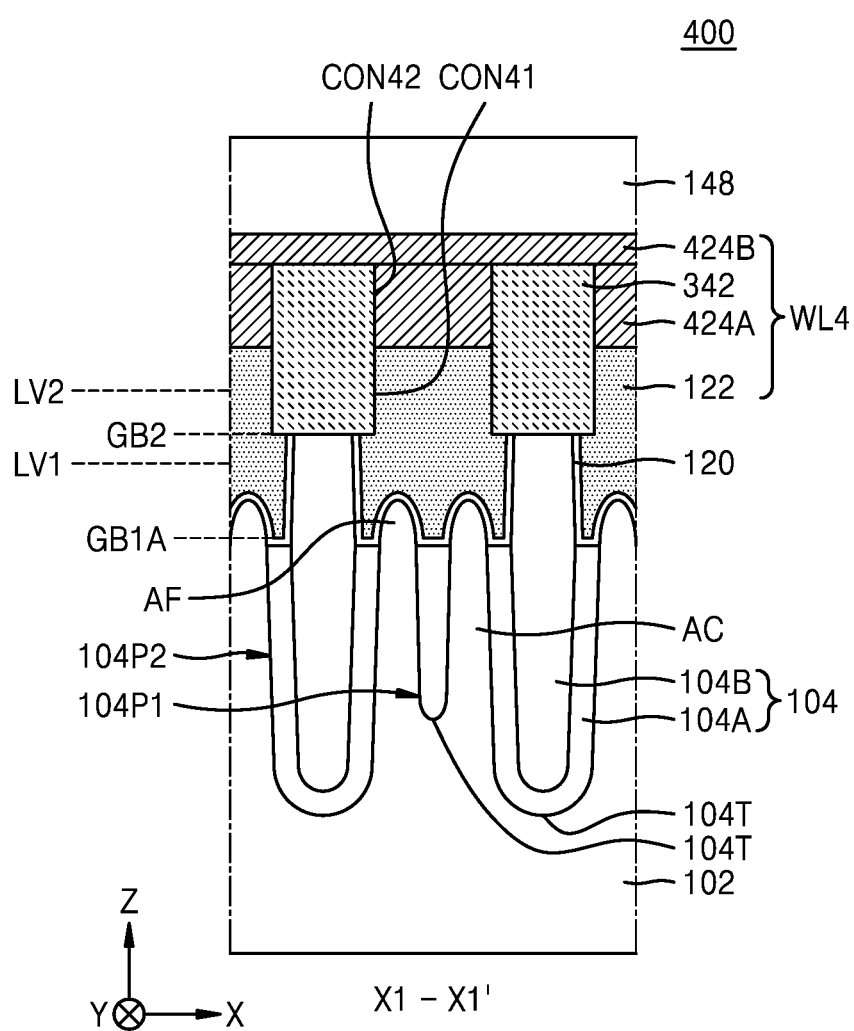
FIGS. 6A and 6B are cross-sectional views illustrating an integrated circuit device according to some embodiments.
Figure 6B:
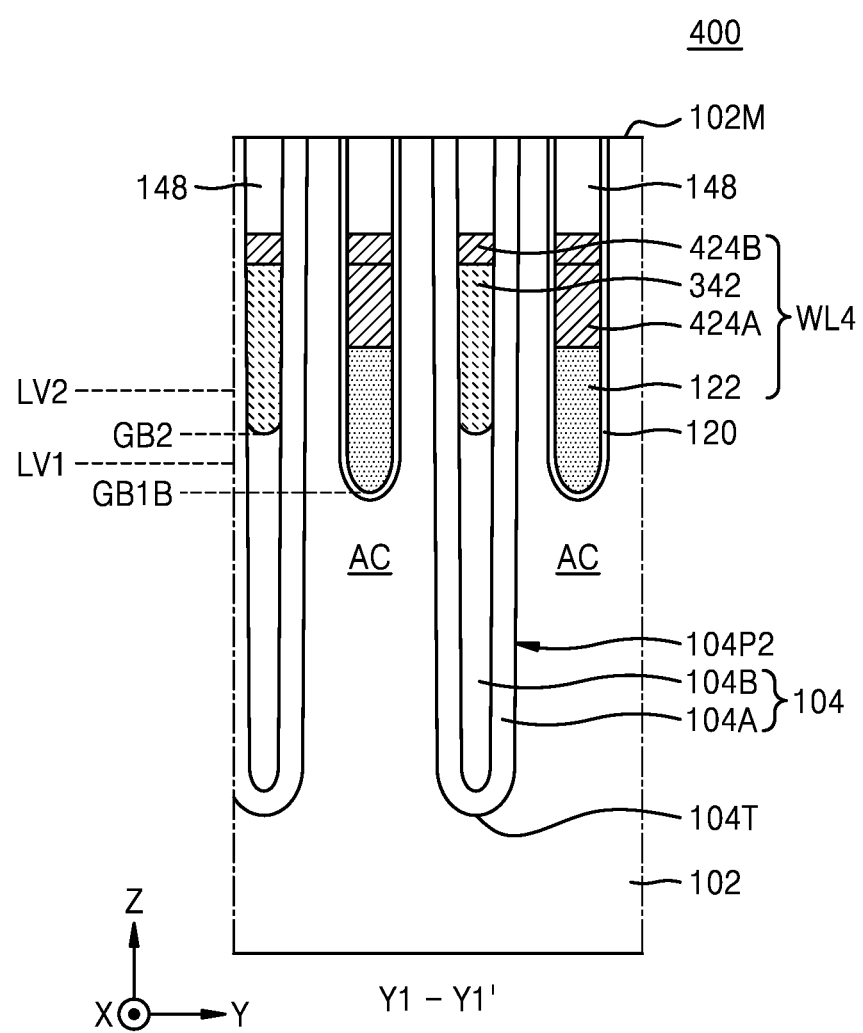

FIGS. 6A and 6B are cross-sectional views illustrating an integrated circuit device 400 according to some embodiments, and in particular, FIG. 6A is a cross-sectional view illustrating some components in a region corresponding to a cross-section taken along the line X1-X1' of FIGS. 3C and 3D, and FIG. 6B is a cross-sectional view illustrating some components in a region corresponding to a cross-section taken along the line Y1-Y1' of FIGS. 3C and 3D. Regarding FIGS. 6A and 6B, the same reference numerals as in FIGS. 3A to 3D respectively denote the same members, and here, repeated descriptions thereof are omitted for economy of description.

Referring to FIGS. 6A and 6B, the integrated circuit device 400 may constitute the memory cell area 22 shown in FIGS. 1 and 2. The integrated circuit device 400 may have substantially the same configuration as the integrated circuit device 100 described with reference to FIGS. 3A to 3D. In each of FIGS. 6A and 6B, a planar structure along the first vertical level LV1 is substantially the same as shown in FIG. 3C, and a planar structure along the second vertical level LV2 is substantially the same as shown in FIG. 3D. However, the integrated circuit device 400 includes a plurality of word lines WL4 and does not include the plurality of word lines WL1.

The plurality of word lines WL4 have substantially the same configuration as the plurality of word lines WL1 described with reference to FIGS. 3A to 3D. However, each of the plurality of word lines WL4 may include the plurality of first conductive patterns 122 and the plurality of second conductive patterns 342, which are alternately arranged one-by-one in the first horizontal direction (X direction), a plurality of first doped semiconductor patterns 424A respectively covering the upper surfaces of the plurality of first conductive patterns 122 and not covering the upper surfaces of the plurality of second conductive patterns 342, and a second doped semiconductor pattern 424B covering an upper surface of each of the plurality of second conductive patterns 342 and the plurality of first doped semiconductor patterns 424A. An upper surface of each of the plurality of word lines WL4 may be covered by the buried insulating film 148.

A detailed configuration of the plurality of second conductive patterns 342 is the same as described with reference to FIGS. 5A and 5B and a repeated description is omitted for economy of description. A detailed configuration of the plurality of first doped semiconductor patterns 424A is substantially the same as described regarding the plurality of first doped semiconductor patterns 324A with reference to FIGS. 5A and 5B. However, a vertical level of the upper surface of each of the plurality of first doped semiconductor patterns 424A may be equal to or similar to the vertical level of the upper surface of each of the plurality of second conductive patterns 342. The second doped semiconductor pattern 424B may directly contact the upper surface of each of the plurality of second conductive patterns 342 and the plurality of first doped semiconductor patterns 424A. In some embodiments, the plurality of first doped semiconductor patterns 424A and the second doped semiconductor pattern 424B may include the same material. For example, the plurality of first doped semiconductor patterns 424A and the second doped semiconductor pattern 424B may each include doped polysilicon. In some embodiments, the plurality of first doped semiconductor patterns 424A and the second doped semiconductor pattern 424B may include different materials from each other. For example, while the plurality of first doped semiconductor patterns 424A and the second doped semiconductor pattern 424B may each include doped polysilicon, a doping concentration in the plurality of first doped semiconductor patterns 424A may be different from a doping concentration in the second doped semiconductor pattern 424B.

As shown in FIG. 6A, each of the plurality of word lines WL4 may include a plurality of contact surfaces CON41 between the plurality of first conductive patterns 122 and the plurality of second conductive patterns 342, and a plurality of contact surfaces CON42 between the plurality of second conductive patterns 342 and the plurality of first doped semiconductor patterns 424A. The integrated circuit device 400 shown in FIGS. 6A and 6B may provide the same effects as described regarding the integrated circuit device 200 with reference to FIGS. 5A and 5B.

Figure 7:
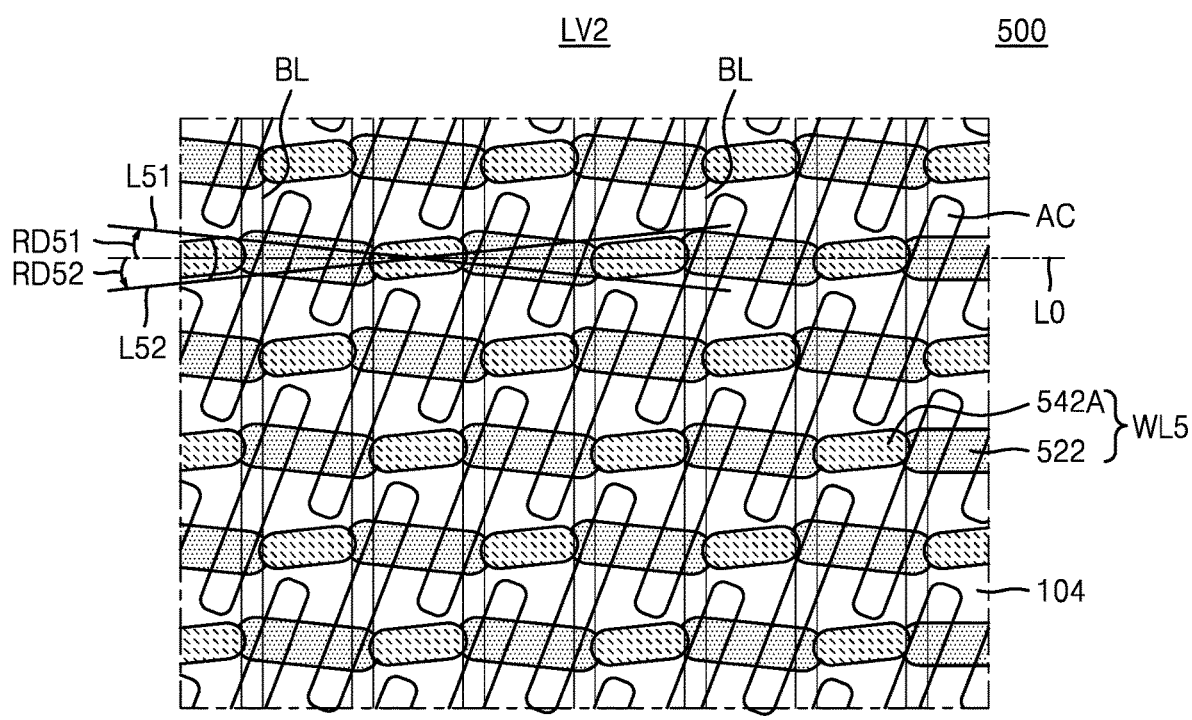
FIG. 7 is a planar layout illustrating an integrated circuit device according to some embodiments.
Figure 7:
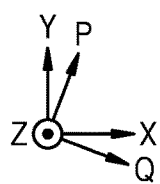

FIG. 7 is a planar layout illustrating an integrated circuit device 500 according to some embodiments. Regarding FIG. 7, the same reference numerals as in FIGS. 3A to 3D respectively denote the same members, and here, repeated descriptions thereof are omitted for economy of description.

Referring to FIG. 7, the integrated circuit device 500 may constitute the memory cell area 22 shown in FIGS. 1 and 2. The integrated circuit device 500 may have substantially the same configuration as the integrated circuit device 100 described with reference to FIGS. 3A to 3D. However, the integrated circuit device 500 includes a plurality of word lines WL5 and does not include the plurality of word lines WL1. Each of the plurality of word lines WL5 may include a plurality of first conductive patterns 522 and a plurality of second conductive patterns 542A, which are alternately arranged one-by-one in the first horizontal direction (X direction). The plurality of word lines WL5 may extend in a zigzag manner in the first horizontal direction (X direction).

In each of the plurality of word lines WL5, the plurality of first conductive patterns 522 and the plurality of second conductive patterns 542A have substantially the same configurations as described regarding the plurality of first conductive patterns 122 and the plurality of second conductive patterns 142A with reference to FIGS. 3A to 3D, respectively. However, in each of the plurality of word lines WL5, each of the plurality of first conductive patterns 522 and the plurality of second conductive patterns 542A may have a major axis making an acute angle with the first horizontal direction (X direction). More specifically, each of the plurality of first conductive patterns 522 may have a planar shape extending lengthwise along a first major-axis line L51, which makes an acute angle in a first rotation direction RD51 from a straight line L0 extending in the first horizontal direction (X direction). In each of the plurality of word lines WL5, each of the plurality of second conductive patterns 542A may have a planar shape extending lengthwise along a second major-axis line L52, which makes an acute angle in a second rotation direction RD52 from the straight line L0 extending in the first horizontal direction (X direction), the second rotation direction RD52 is opposite to the first rotation direction RD51. In an embodiment, the acute angle of the plurality of second conductive patterns 542A in the second rotation direction RD52 may be substantially equal to the acute angle of the plurality of first conductive patterns 522 in the first rotation direction RD51. However, embodiments of the present inventive concept are not necessarily limited thereto.

The integrated circuit device 500 shown in FIG. 7 may provide the same effects as described regarding the integrated circuit device 100 with reference to FIGS. 3A to 3D. In addition, in the integrated circuit device 500, each of the plurality of first conductive patterns 522 may have a planar shape extending lengthwise along the first major-axis line L51, which makes an acute angle in the first rotation direction RD51 from the straight line L0 extending in the first horizontal direction (X direction), such that the overlapping area in the vertical direction (Z direction) between the first conductive pattern 522 and two active regions AC, through which the first conductive pattern 522 passes, may be increased, and such that the areas of the two active regions AC, which are surrounded by the first conductive pattern 522, may be increased. Each of the plurality of second conductive patterns 542A may have a planar shape extending lengthwise along the second major-axis line L52, which makes an acute angle in the second rotation direction RD52 from the straight line L0 extending in the first horizontal direction (X direction), such that the second conductive pattern 542A may make an optimum connection between the plurality of first conductive patterns 522 without deviations according to positions over the substrate 102. Therefore, the reliability of the integrated circuit device 500 may be further increased.

Figure 8:
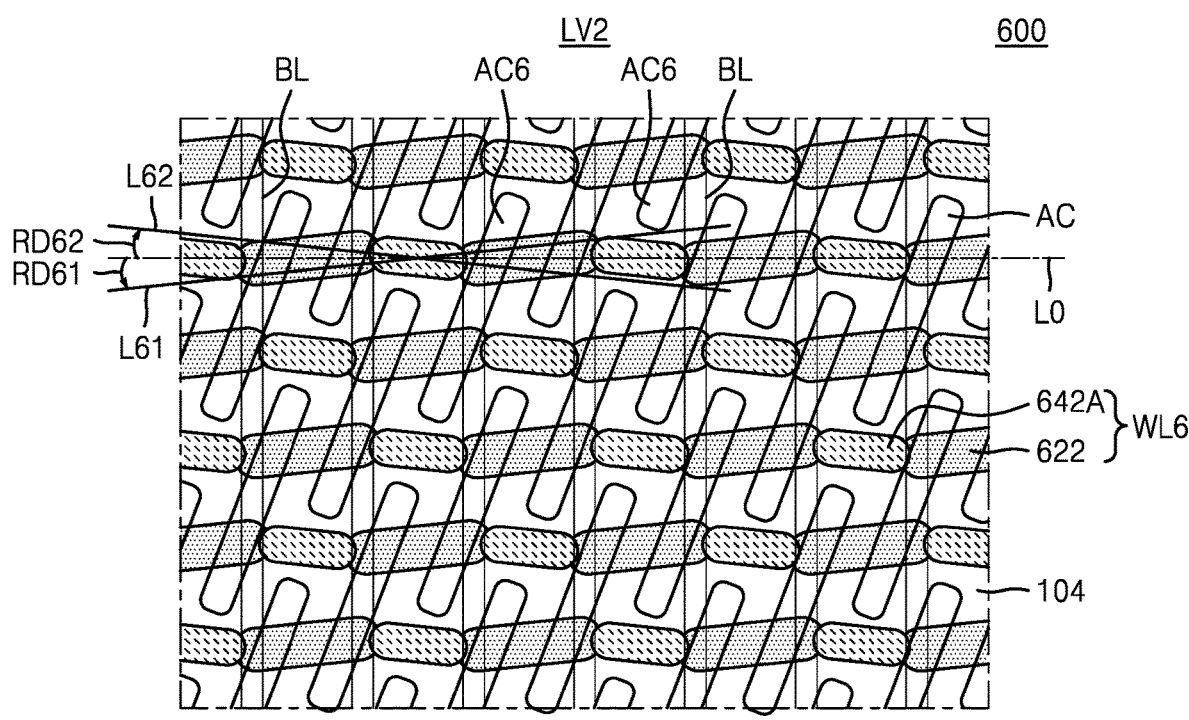
FIG. 8 is a planar layout illustrating an integrated circuit device according to some embodiments.

FIG. 8 is a planar layout illustrating an integrated circuit device 600 according to some embodiments. Regarding FIG. 8, the same reference numerals as in FIGS. 3A to 3D respectively denote the same members, and here, repeated descriptions thereof are omitted for economy of description.

Referring to FIG. 8, the integrated circuit device 600 may constitute the memory cell area 22 shown in FIGS. 1 and 2. The integrated circuit device 600 may have substantially the same configuration as the integrated circuit device 100 described with reference to FIGS. 3A to 3D. However, the integrated circuit device 600 includes a plurality of word lines WL6. Each of the plurality of word lines WL6 may include a plurality of first conductive patterns 622 and a plurality of second conductive patterns 642A, which are alternately arranged one-by-one in the first horizontal direction (X direction). The plurality of word lines WL6 may extend in a zigzag manner in the first horizontal direction (X direction).

In each of the plurality of word lines WL6, the plurality of first conductive patterns 622 and the plurality of second conductive patterns 642A have substantially the same configurations as described regarding the plurality of first conductive patterns 122 and the plurality of second conductive patterns 142A with reference to FIGS. 3A to 3D, respectively. However, in each of the plurality of word lines WL6, each of the plurality of first conductive patterns 622 and the plurality of second conductive patterns 642A may have a major axis making an acute angle with the first horizontal direction (X direction). More specifically, each of the plurality of first conductive patterns 622 may have a planar shape extending lengthwise along a first major-axis line L61, which makes an acute angle in a first rotation direction RD61 from the straight line L0 extending in the first horizontal direction (X direction). In each of the plurality of word lines WL6, each of the plurality of second conductive patterns 642A may have a planar shape extending lengthwise along a second major-axis line L62, which makes an acute angle in a second rotation direction RD62 from the straight line L0 extending in the first horizontal direction (X direction), the second rotation direction RD62 being opposite to the first rotation direction RD61. The first rotation direction RD61 shown in FIG. 8 may be an opposite direction to the first rotation direction RD51 shown in FIG. 7, and the second rotation direction RD62 shown in FIG. 8 may be an opposite direction to the second rotation direction RD52 shown in FIG. 7. In an embodiment, the acute angle of the plurality of second conductive patterns 642A in the second rotation direction RD62 may be substantially equal to the acute angle of the plurality of first conductive patterns 622 in the first rotation direction RD61.

The integrated circuit device 600 shown in FIG. 8 may provide the same effects as described regarding the integrated circuit device 100 with reference to FIGS. 3A to 3D. In addition, in the integrated circuit device 600, each of the plurality of first conductive patterns 622 may have a planar shape extending lengthwise along the first major-axis line L61, which makes an acute angle in the first rotation direction RD61 from the straight line L0 extending in the first horizontal direction (X direction), such that the area of a local active region AC6 connected to a buried contact for respectively connecting two active regions AC, through which the first conductive pattern 622 passes, to capacitors may be increased. Each of the plurality of second conductive patterns 642A may have a planar shape extending lengthwise along the second major-axis line L62, which makes an acute angle in the second rotation direction RD62 from the straight line L0 extending in the first horizontal direction (X direction), such that each second conductive pattern 642A may make an optimum connection between the plurality of first conductive patterns 622 without deviations according to positions over the substrate 102. Therefore, the reliability of the integrated circuit device 600 may be further increased.

Figure 9:
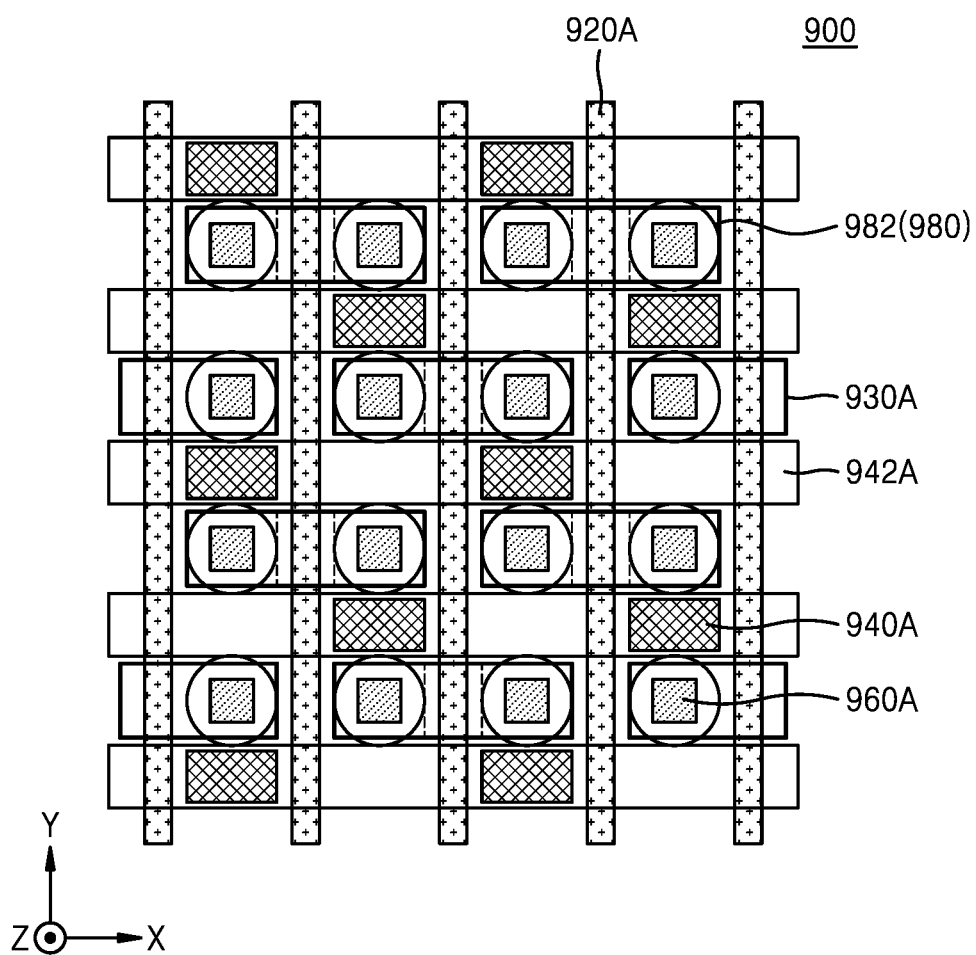
FIG. 9 is a layout illustrating an integrated circuit device according to some embodiments.
Figure 10:
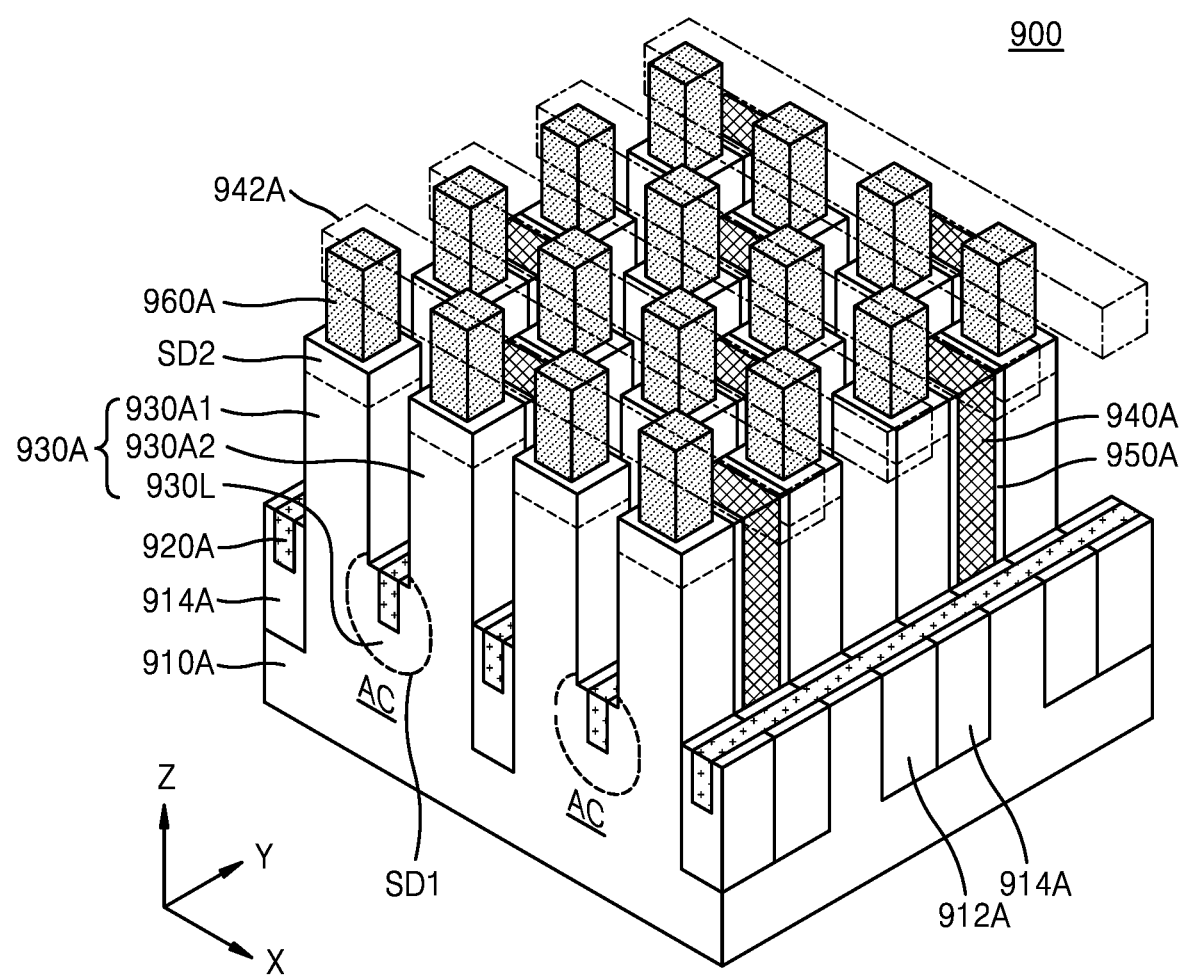
FIG. 10 is a perspective view of the integrated circuit device shown in FIG. 9.

FIG. 9 is a layout illustrating an integrated circuit device 900 according to some embodiments, and FIG. 10 is a perspective view of the integrated circuit device 900.

Referring to FIGS. 9 and 10, the integrated circuit device 900 may include a substrate 910A, a plurality of first conductive lines 920A, a channel structure 930A, a contact gate electrode 940A, a plurality of second conductive lines 942A, and a capacitor structure 980. The integrated circuit device 900 may include a memory device including a vertical channel transistor (VCT).

The plurality of active regions AC may be defined in the substrate 910A by a first device isolation film 912A and a second device isolation film 914A. The channel structure 930A may be arranged in each of the plurality of active regions AC. The channel structure 930A may include a first active pillar 930A1 and a second active pillar 930A2, each extending in the vertical direction (Z direction), and a connecting portion 930L connected to a bottom portion of the first active pillar 930A1 and a bottom portion of the second active pillar 930A2. A first source/drain region SD1 may be arranged in the connecting portion 930L, and a second source/drain region SD2 may be arranged in upper portions of the first and second active pillars 930A1 and 930A2. Each of the first active pillar 930A1 and the second active pillar 930A2 may constitute an independent unit memory cell.

The plurality of first conductive lines 920A may extend in a direction intersecting with each of the plurality of active regions AC, for example, in the second horizontal direction (Y direction). One of the plurality of first conductive lines 920A may be arranged on the connecting portion 930L between the first active pillar 930A1 and the second active pillar 930A2, and the one first conductive line 920A may be arranged on the first source/drain region SD1. Another first conductive line 920A adjacent to the one first conductive line 920A may be arranged between two channel structures 930A. One of the plurality of first conductive lines 920A may function as a common bit line included in two unit memory cells respectively constituted by the first active pillar 930A1 and the second active pillar 930A2, which are arranged on both sides of the one first conductive line 920A.

One contact gate electrode 940A may be arranged between two channel structures 930A adjacent to each other in the second horizontal direction (Y direction). For example, the contact gate electrode 940A may be arranged between the first active pillar 930A1 included in one channel structure 930A and the second active pillar 930A2 of the channel structure 930A adjacent thereto, and one contact gate electrode 940A may be shared by the first active pillar 930A1 and the second active pillar 930A2, which are arranged on both sidewalls thereof. A gate insulating layer 950A may be arranged between the contact gate electrode 940A and the first active pillar 930A1 and between the contact gate electrode 940A and the second active pillar 930A2. The plurality of second conductive lines 942A may extend in the first horizontal direction (X direction) on upper surfaces of the contact gate electrodes 940A. The plurality of second conductive lines 942A may function as word lines of the integrated circuit device 900.

A capacitor contact 960A may be arranged on the channel structure 930A. The capacitor contact 960A may be arranged on the second source/drain region SD2. The capacitor structure 980 may be arranged on the capacitor contact 960A.

In the integrated circuit device 900 shown in FIGS. 9 and 10, each of the plurality of first conductive lines 920A may have the same structure as at least one word line of the word lines WL1, WL2, WL3, WL4, WL5, and WL6 described with reference to FIGS. 3A to 8 and word lines having structures variously modified and changed therefrom without departing from the scope of the present inventive concept.

Although an example of a configuration of the integrated circuit device 900, which includes a memory device including a VCT, has been described with reference to FIGS. 9 and 10, embodiments of the present inventive concept are not necessarily limited thereto. For example, at least one word line of the word lines WL1, WL2, WL3, WL4, WL5, and WL6 described with reference to FIGS. 3A to 8 and word lines having structures variously modified and changed therefrom without departing from the scope of the present inventive concept, may also constitute a portion of a vertically stacked DRAM device, in which a plurality of memory cells are repeatedly arranged in a vertical direction and a horizontal direction.

Next, a method of fabricating an integrated circuit device according to some embodiments will be described in detail with reference to particular examples.

Figure 11A:
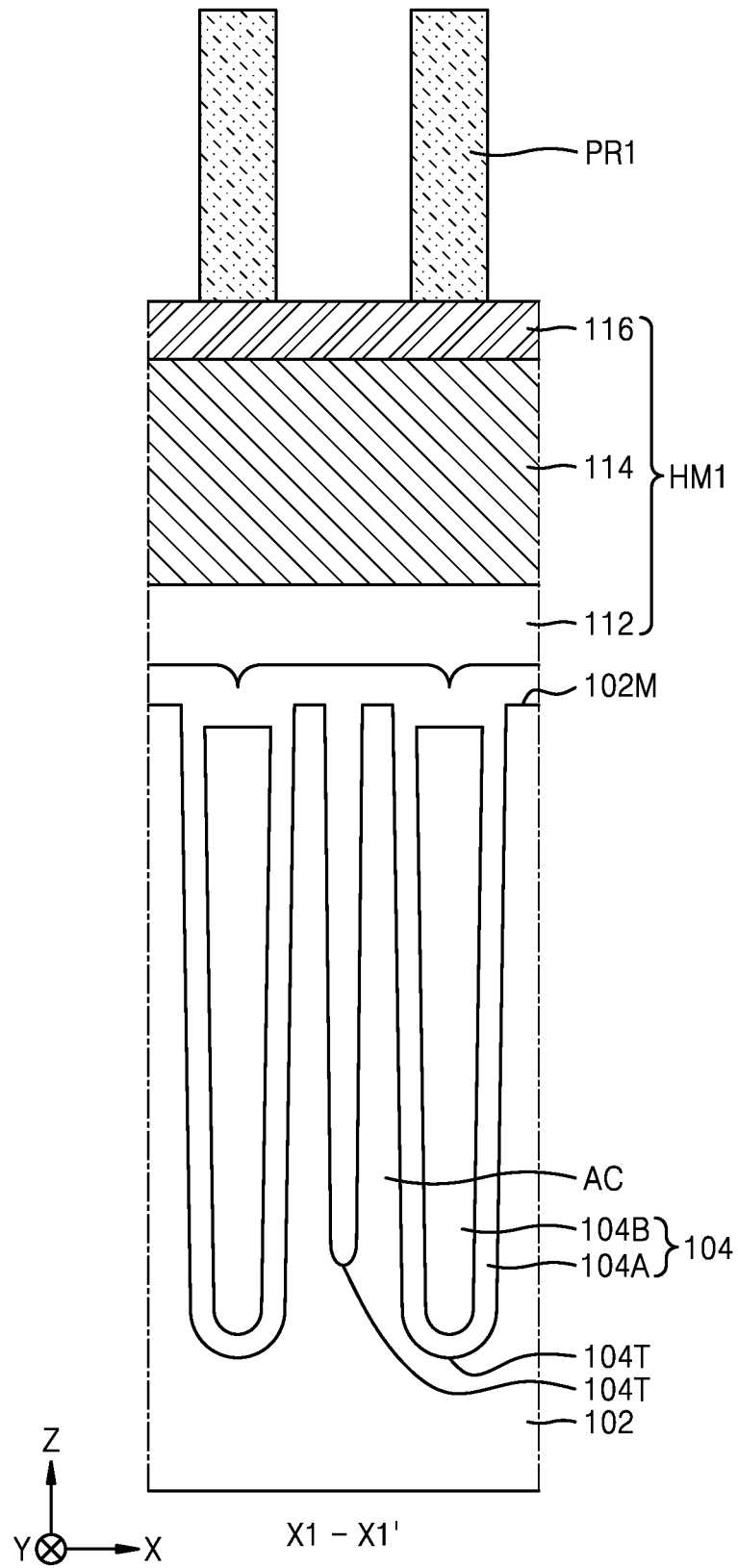
FIGS. 11A to 26B are diagrams respectively illustrating a sequence of processes of a method of fabricating an integrated circuit device, according to some embodiments, and in particular, FIGS. 11A, 12A, . . . , and 26A respectively illustrate cross-sectional views of some components in a region corresponding to a cross-section taken along the line X1-X1' of FIGS. 3C and 3D according to the sequence of processes, FIGS. 11B, 12B, . . . , and 26B respectively illustrate cross-sectional views of some components in a region corresponding to a cross-section taken along the line Y1-Y1' of FIGS. 3C and 3D according to the sequence of processes.
Figure 11B:
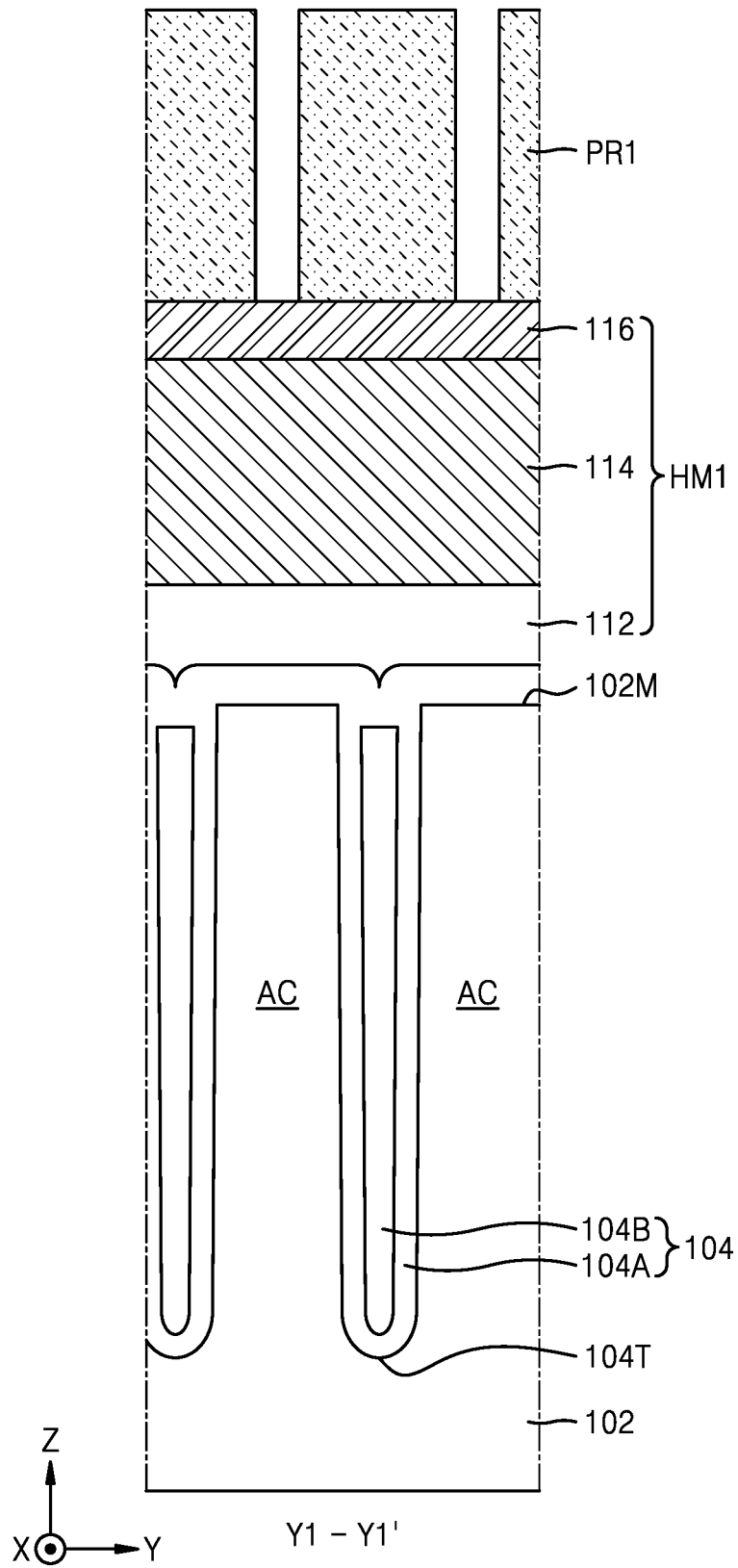
FIGS. 11C, 13C, and 21C are planar layouts each illustrating some components in a process corresponding thereto.
Figure 11C:
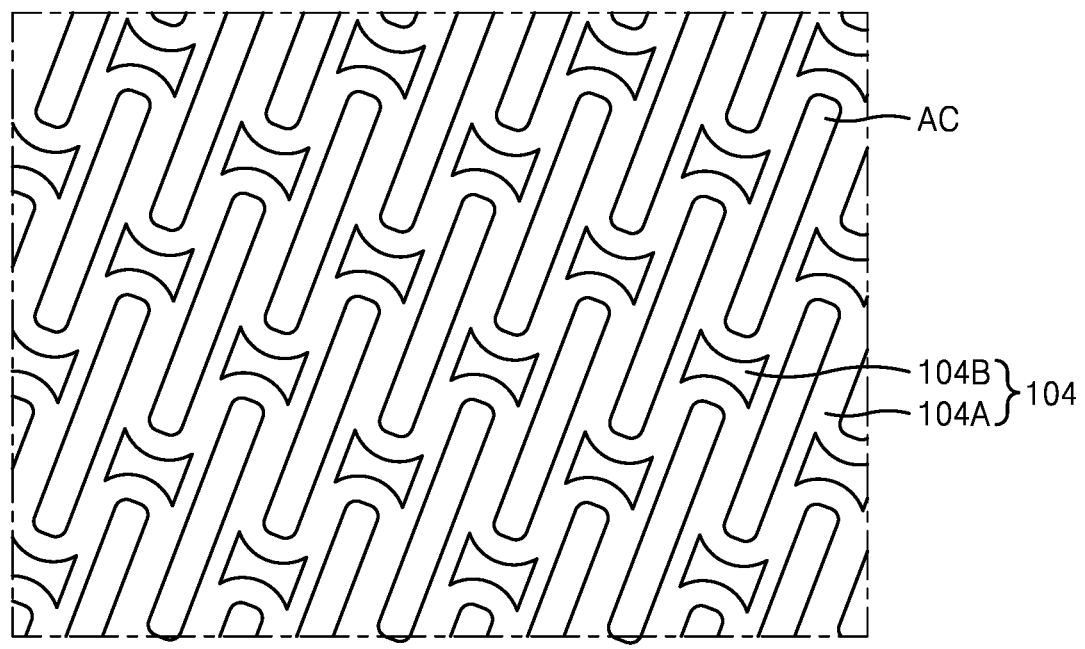
Figure 12A:
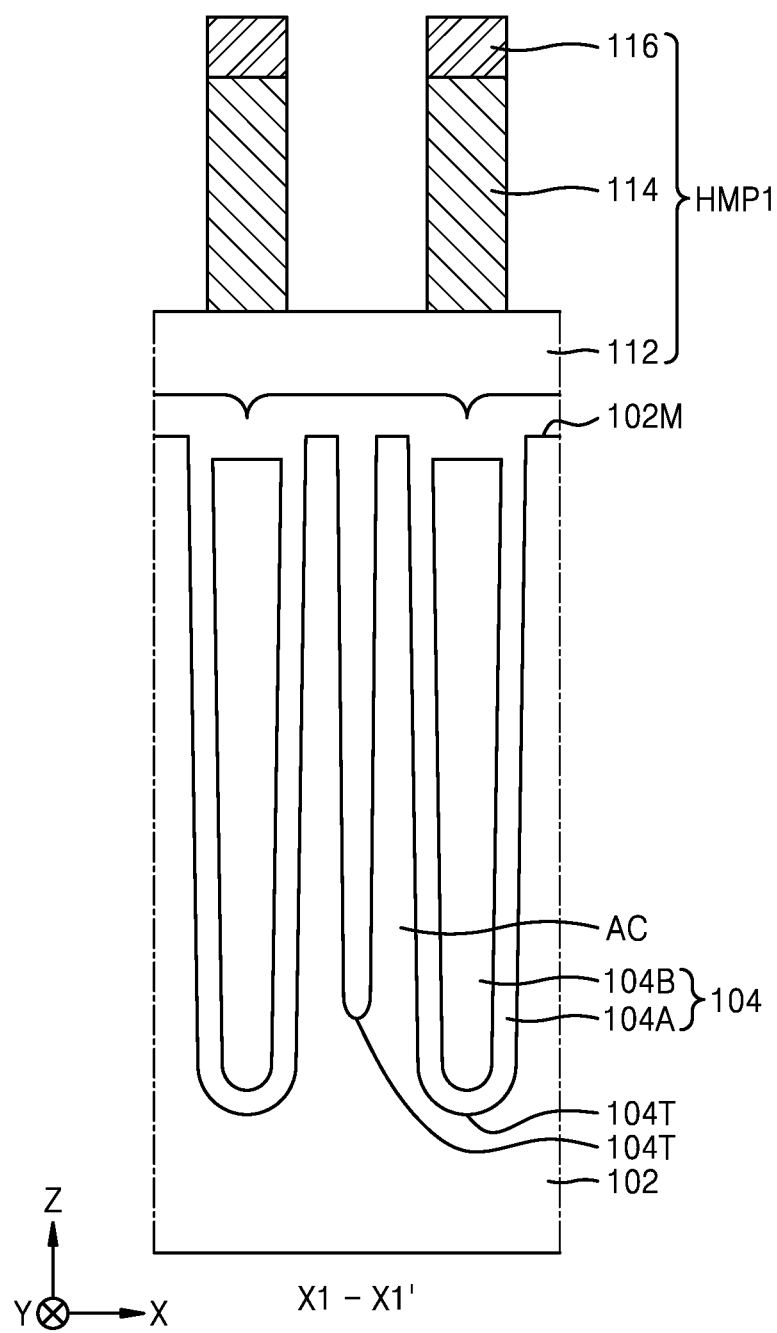
Figure 12B:
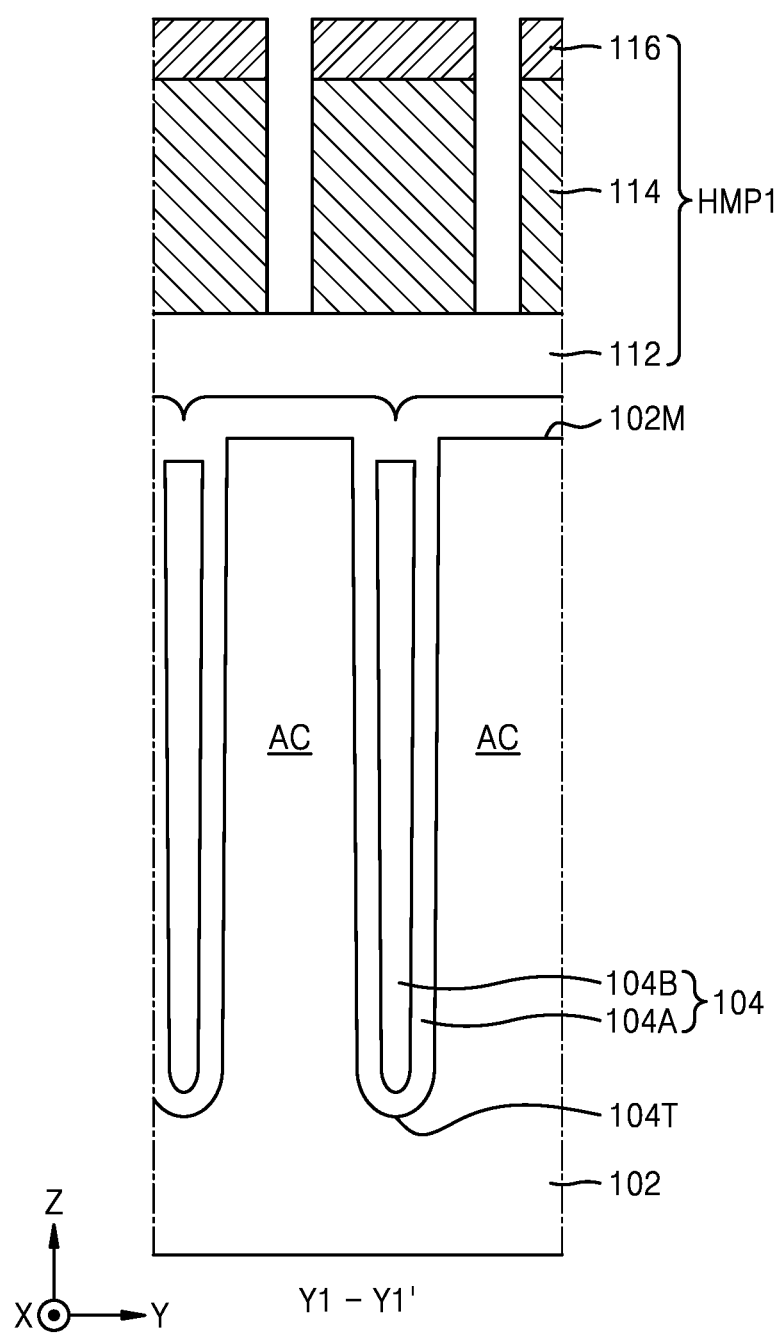
Figure 13A:
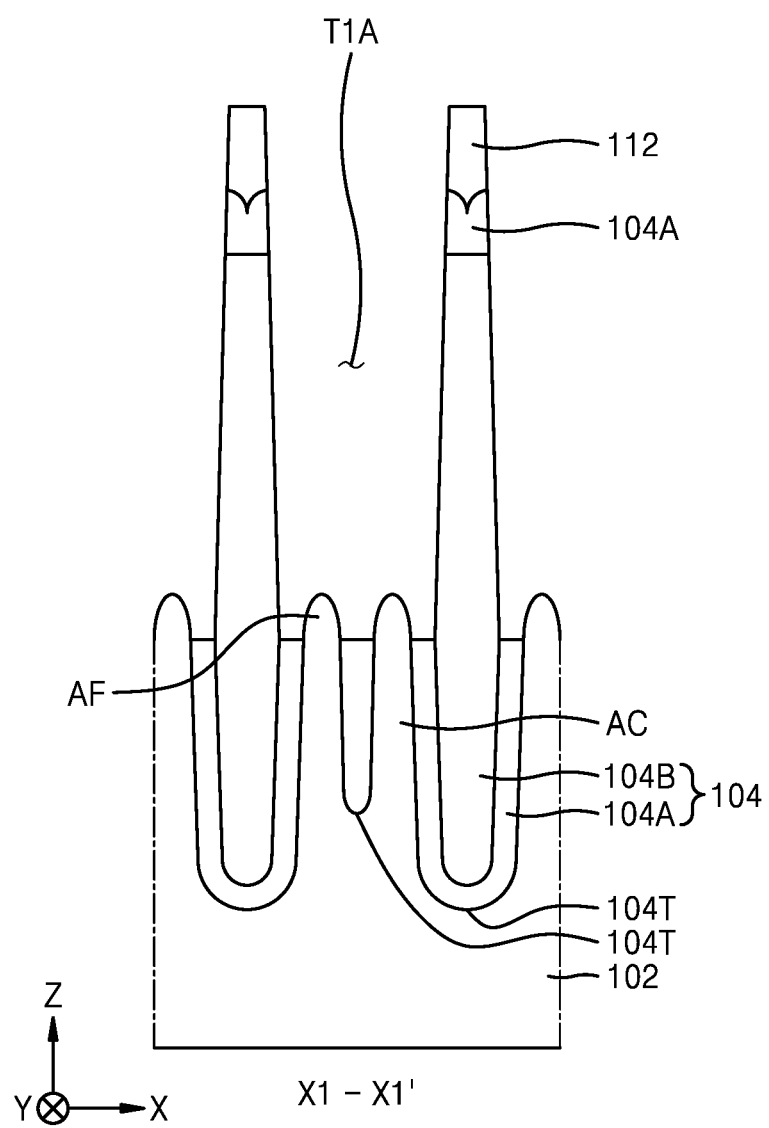
FIGS. 13D and 13E are planar layouts respectively illustrating various methods of forming a plurality of first trenches shown in FIG. 13C.
Figure 13B:
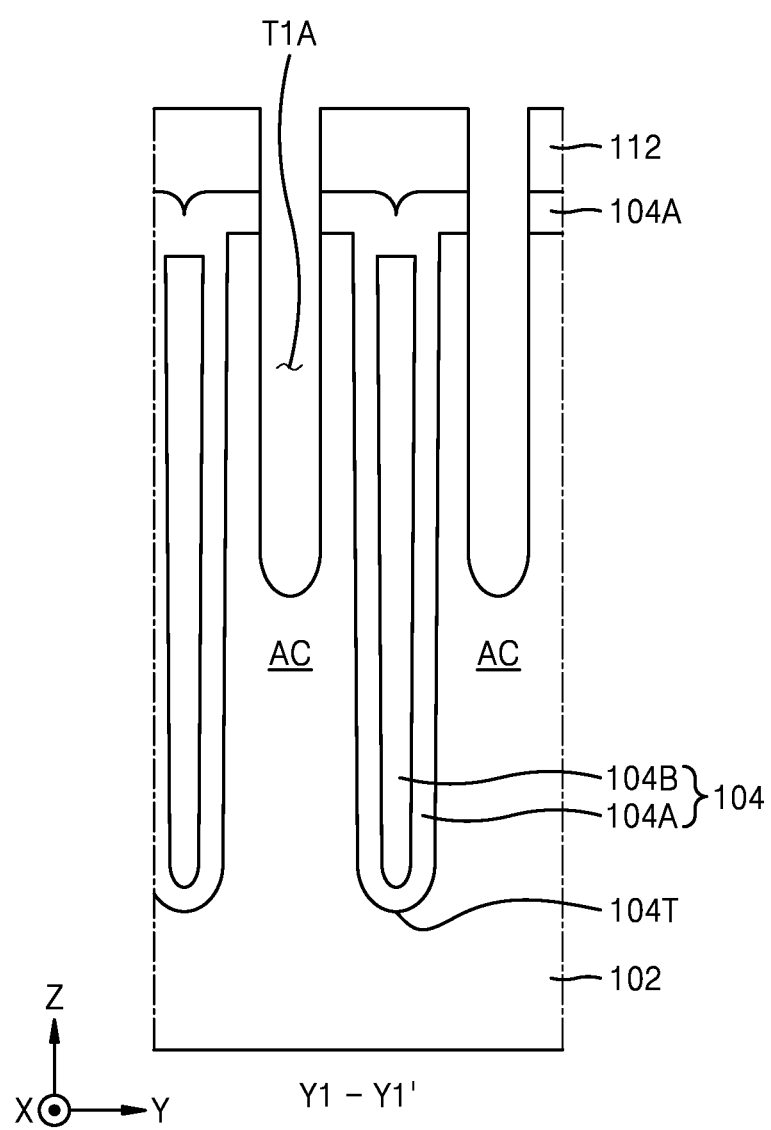
Figure 13C:
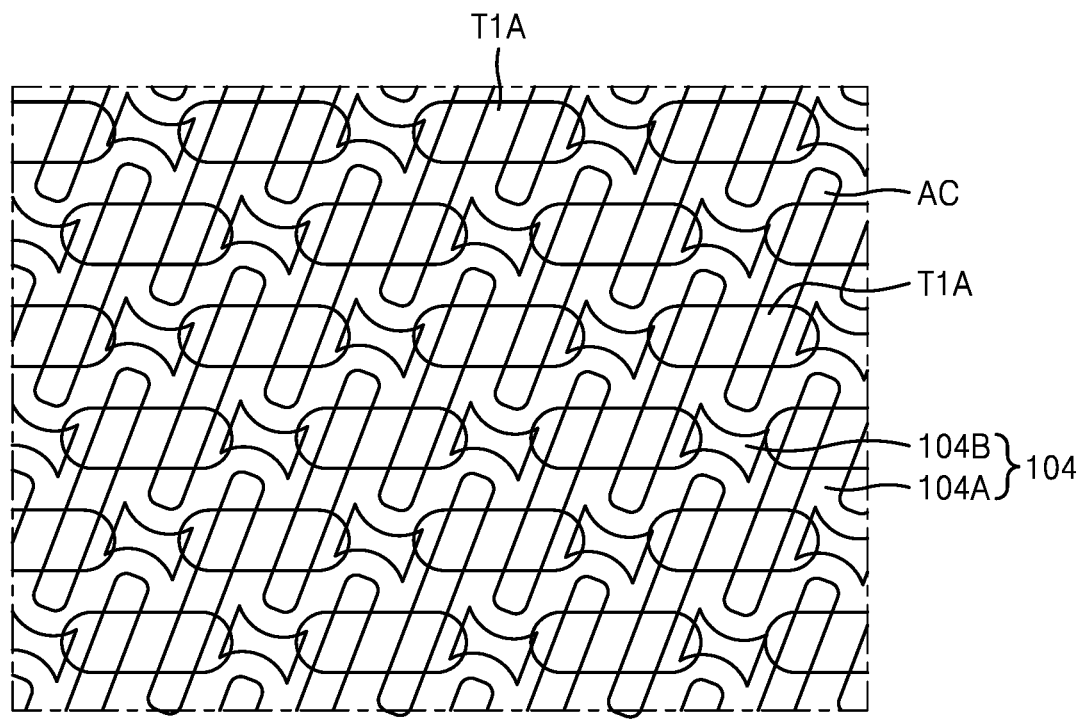
Figure 13D:
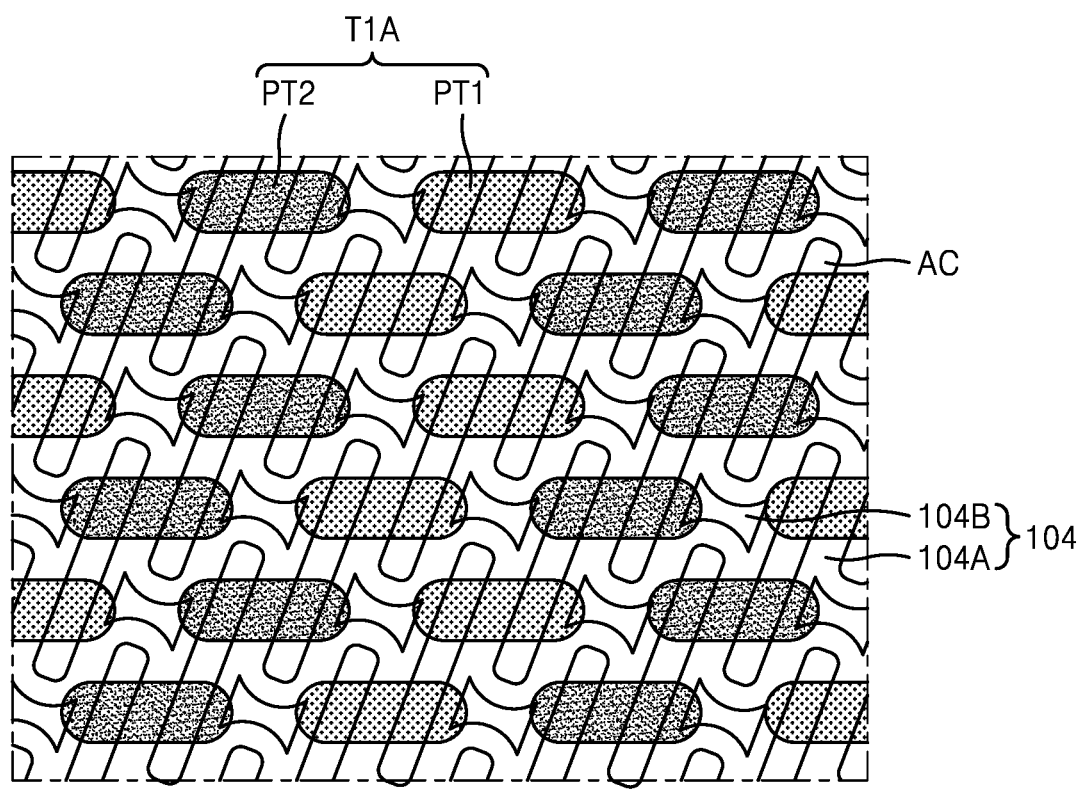
Figure 13E:
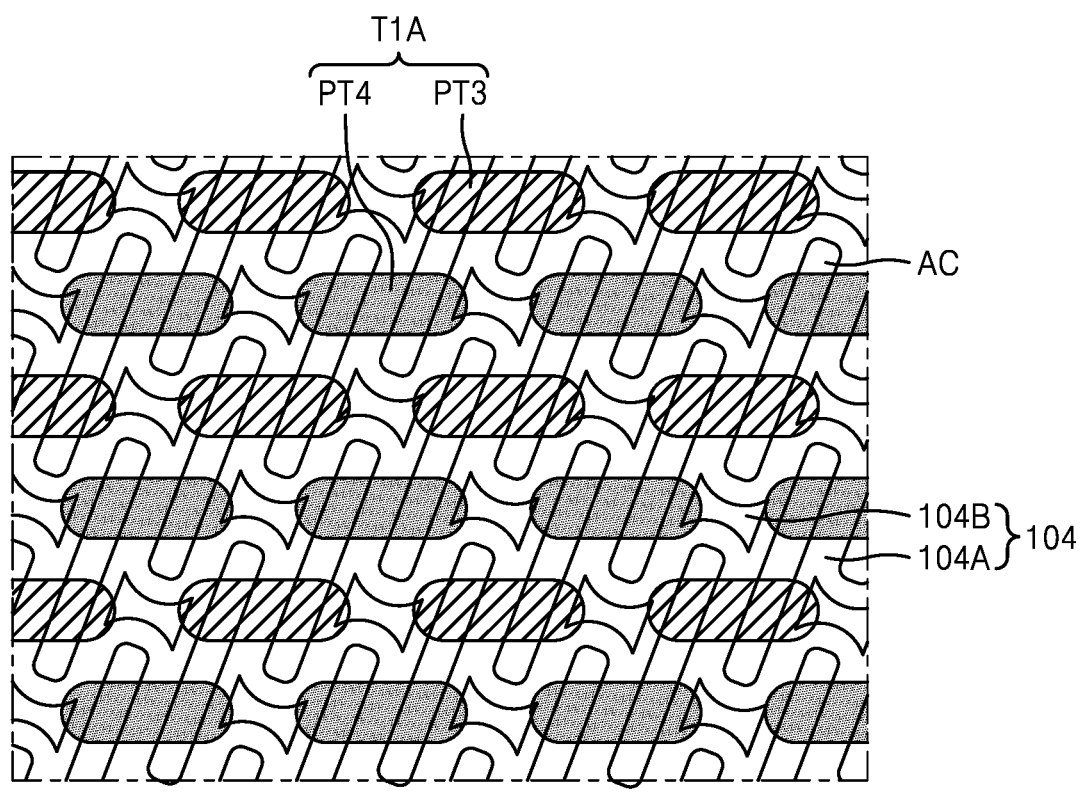
Figure 20A:
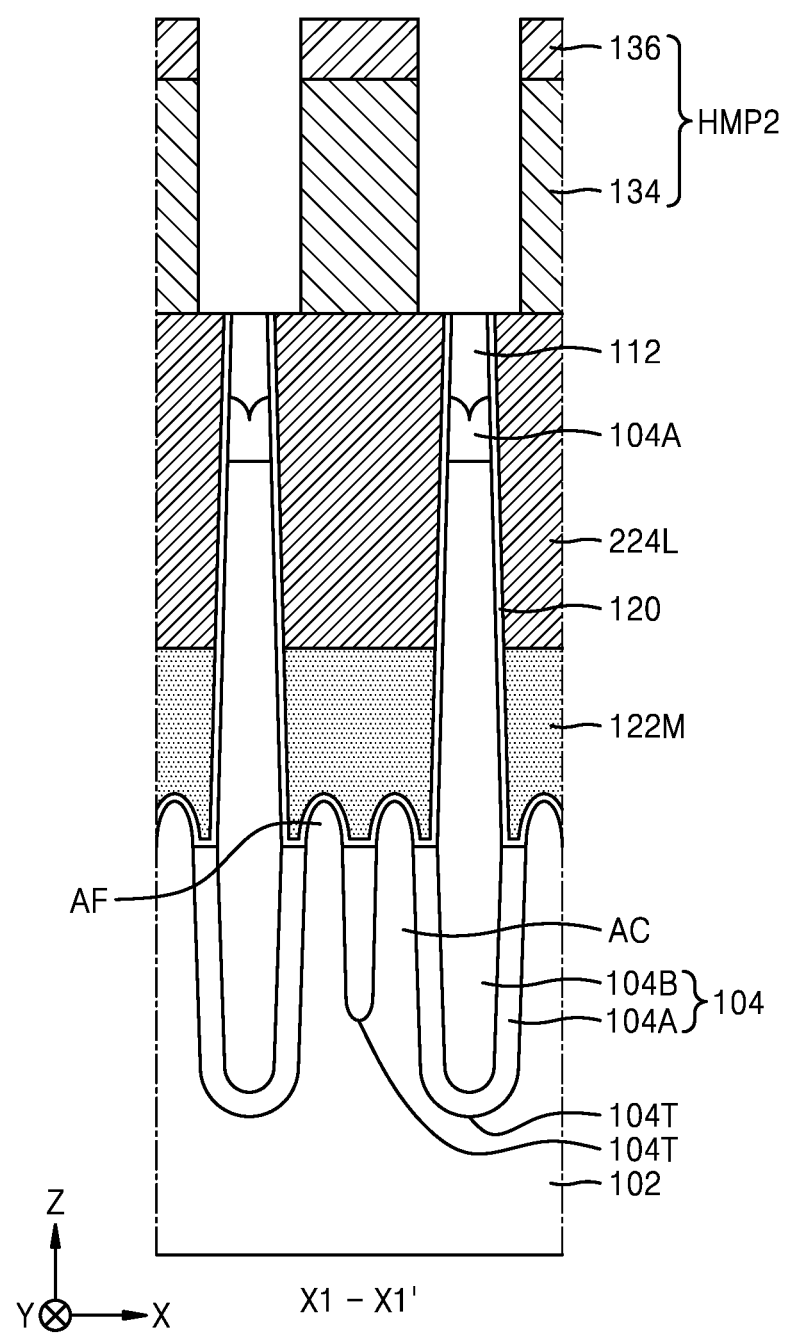
Figure 20B:
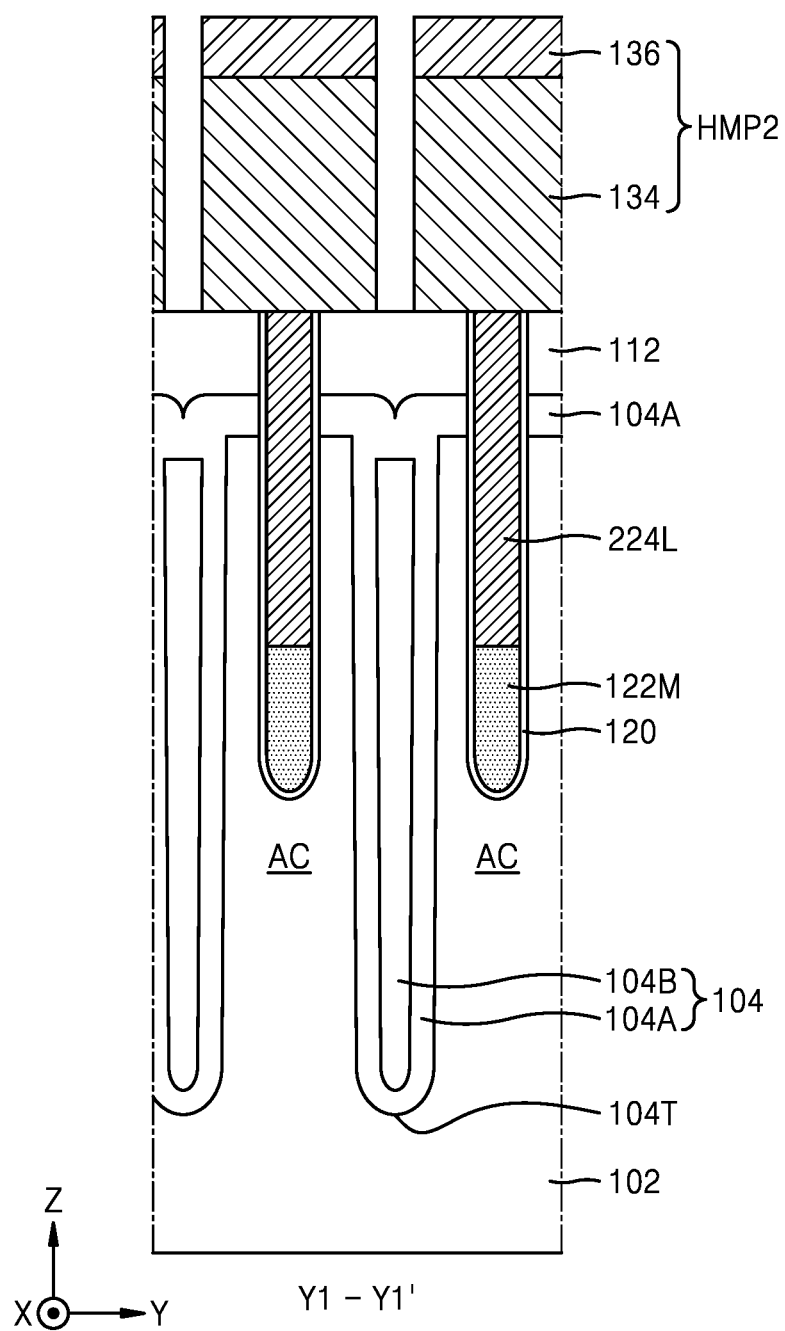
Figure 21A:
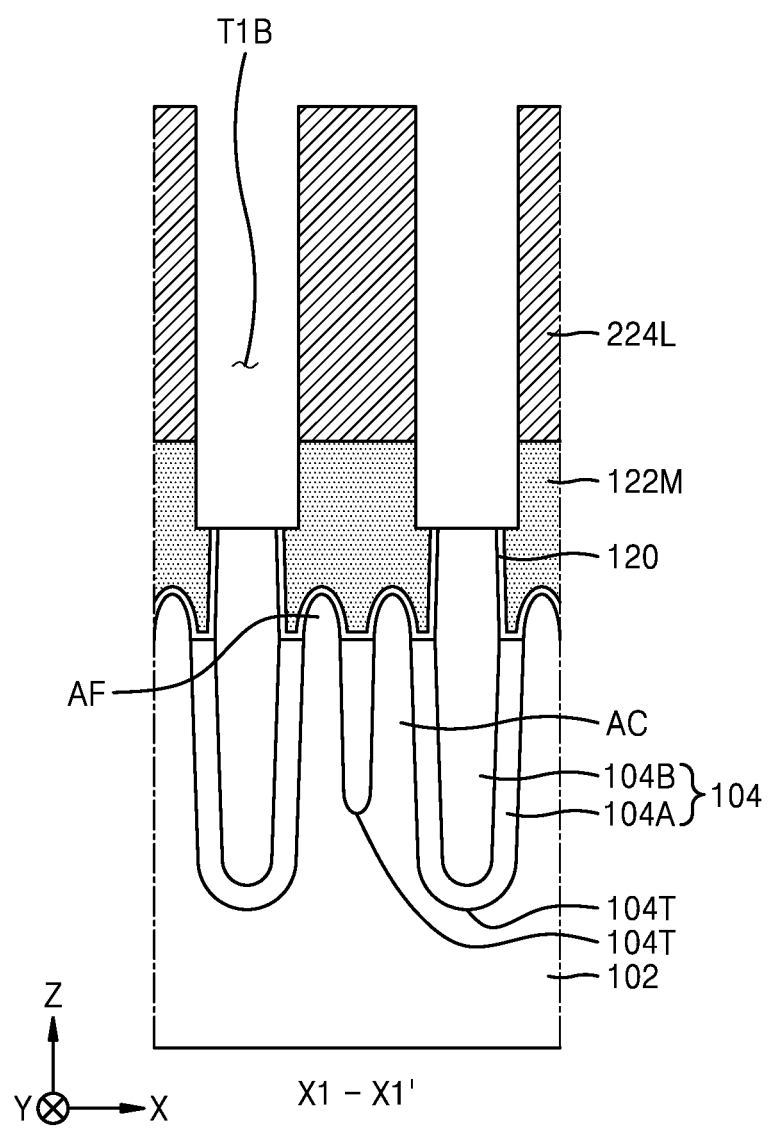
Figure 21B:
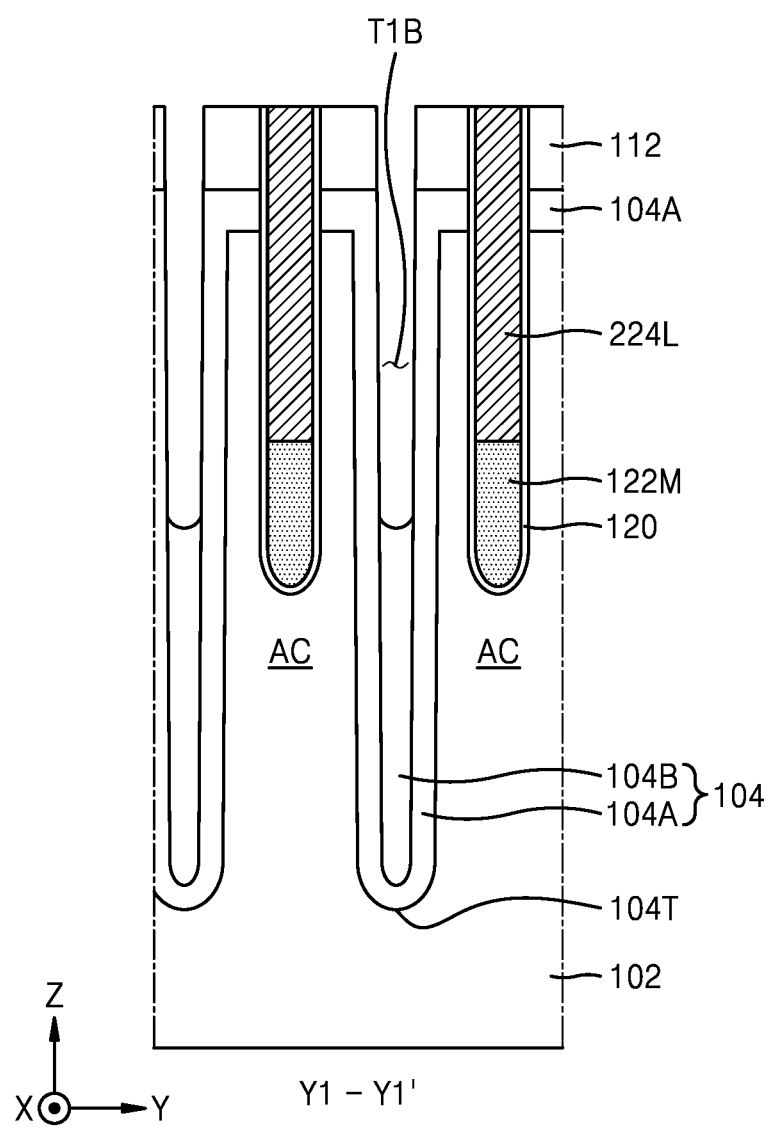
Figure 21C:
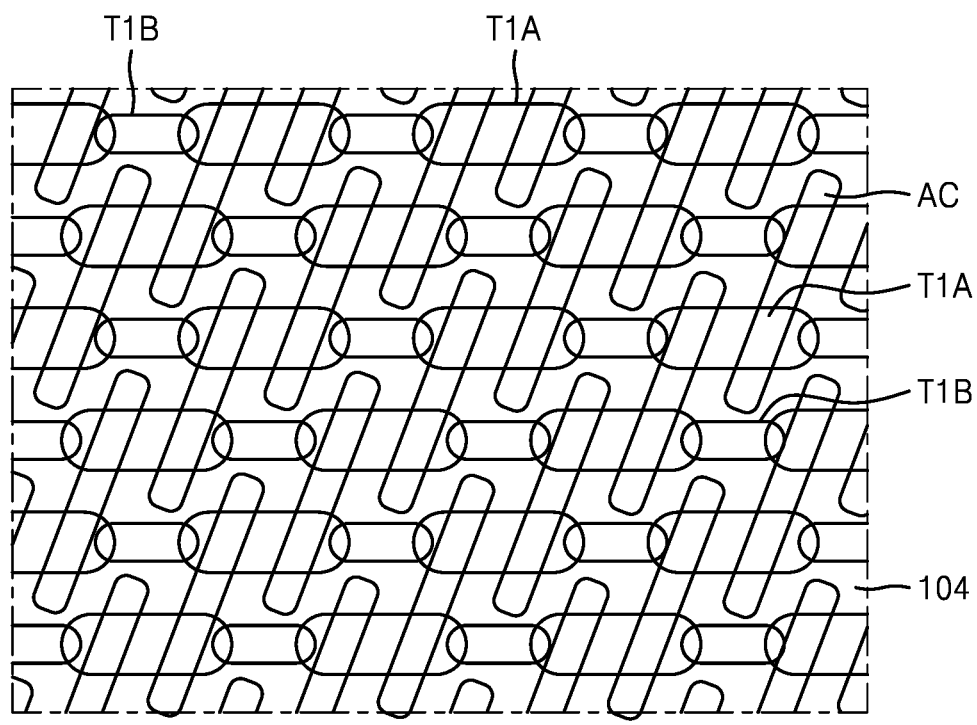

FIGS. 11A to 26B are diagrams respectively illustrating a sequence of processes of a method of fabricating an integrated circuit device, according to some embodiments, and in particular, FIGS. 11A, 12A, . . . , and 26A respectively illustrate cross-sectional views of some components in a region corresponding to a cross-section taken along the line X1-X1' of FIGS. 3C and 3D according to the sequence of processes, FIGS. 11B, 12B, . . . , and 26B respectively illustrate cross-sectional views of some components in a region corresponding to a cross-section taken along the line Y1-Y1' of FIGS. 3C and 3D according to the sequence of processes, FIGS. 11C, 13C, and 21C are planar layouts each illustrating some components in a process corresponding thereto, and FIGS. 13D and 13E are planar layouts respectively illustrating various methods of forming a plurality of first trenches T1A shown in FIG. 13C. An example of a method of fabricating the integrated circuit device 100 shown in FIGS. 3C and 3D is described with reference to FIGS. 11A to 26B.

Referring to FIGS. 11A, 11B, and 11C, the plurality of active regions AC are defined in the substrate 102 by forming the device isolation trench 104T in the substrate 102, and the device isolation trench 104T may then be filled with the device isolation film 104. In an embodiment, the device isolation film 104 may include the first insulating film 104A and the second insulating film 104B. As shown in FIG. 11C, when viewed in an X-Y plane, the second insulating film 104B may be surrounded by the first insulating film 104A. After the device isolation film 104 is formed, a portion of the first insulating film 104A may cover the main surface 102M of the substrate 102.

In an embodiment, after the device isolation film 104 is formed, an ion implantation process for forming a plurality of source/drain regions in the substrate 102 may then be performed. The portion of the first insulating film 104A, which covers the main surface 102M of the substrate 102, may protect the main surface 102M of the substrate 102 in the ion implantation process for forming a plurality of source/drain regions or in an etching process subsequent thereto.

A hardmask layer HM1 may be formed on the device isolation film 104, and a photoresist pattern PR1 may be formed on the hardmask layer HM1. In an embodiment, the hardmask layer HM1 may include multiple layers obtained by stacking a plurality of material layers different from each other. For example, the hardmask layer HM1 may include a silicon oxide film 112, a carbon-containing film 114, and a silicon nitride film 116, which are stacked on the device isolation film 104 in the stated order (e.g., in the Z direction). In an embodiment, the carbon-containing film 114 may include an amorphous carbon layer (ACL) or a carbon-based spin-on hardmask (C-SOH).

Referring to FIGS. 12A and 12B, in a resulting product of FIGS. 11A, 11B, and 11C, a hardmask pattern HMP1 may be formed by etching the hardmask layer HM1 by using the photoresist pattern PR1 as an etch mask.

Referring to FIGS. 13A, 13B, and 13C, in a resulting product of FIGS. 12A and 12B, the plurality of first trenches T1A may be formed by etching the silicon oxide film 112, the substrate 102, and the device isolation film 104 by using the hardmask pattern HMP1 as an etch mask, and the hardmask pattern HMP1 may be removed. During the formation of the plurality of first trenches T1A, a plurality of active fin regions AF may be formed in the plurality of active regions AC exposed at bottom surfaces of the plurality of first trenches T1A, respectively.

To form the plurality of first trenches T1A, a first etching process is performed for etching the substrate 102 and the device isolation film 104 from the main surface 102M of the substrate 102 such that respective etch rates of the substrate 102 and the device isolation film 104 are approximately equal to each other, and a second etching process is performed for etching the substrate 102 and the device isolation film 104 such that the etch rate of the device isolation film 104 is greater than the etch rate of the substrate 102. The first and second etching processes may be sequentially performed in the stated order. As a result, in each of the plurality of first trenches T1A, a vertical level of the bottom surface exposing the device isolation film 104 may be lower than a vertical level of the bottom surface exposing the substrate 102.

In some embodiments, the plurality of first trenches T1A shown in FIG. 13C may be simultaneously formed.

In some embodiments, some first trenches T1A of the plurality of first trenches T1A may be formed first, and then, some other first trenches T1A of the plurality of first trenches T1A may be subsequently formed.

In an example, as shown in FIG. 13D, the plurality of first trenches T1A may include a first group of trenches PT1 and a second group of trenches PT2, which are alternately formed in the first horizontal direction (X direction). In an embodiment, to form the plurality of first trenches T1A, one group out of the first group of trenches PT1 and the second group of trenches PT2 may be formed first, followed by forming the other group.

However, embodiments of the present inventive concept are not necessarily limited thereto. For example, in an embodiment, as shown in FIG. 13E, the plurality of first trenches T1A may include a third group of trenches PT3 and a fourth group of trenches PT4, which are alternately formed in the second horizontal direction (Y direction). In an embodiment, to form the plurality of first trenches T1A, one group out of the third group of trenches PT3 and the fourth group of trenches PT4 may be formed first, followed by forming the other group.

The methods of forming the plurality of first trenches T1A, described with reference to FIGS. 13D and 13E, are merely examples, and the plurality of first trenches T1A may be formed by dividing the plurality of first trenches T1A into a plurality of groups and then sequentially forming the plurality of groups, according to variously modified and changed methods without departing from the scope of the present inventive concept. As such, by dividing the plurality of first trenches T1A into a plurality of groups and then sequentially forming the plurality of groups, a sufficient exposure margin and/or a sufficient etching margin may be secured during the process of forming the plurality of first trenches T1A.

Figure 14A:
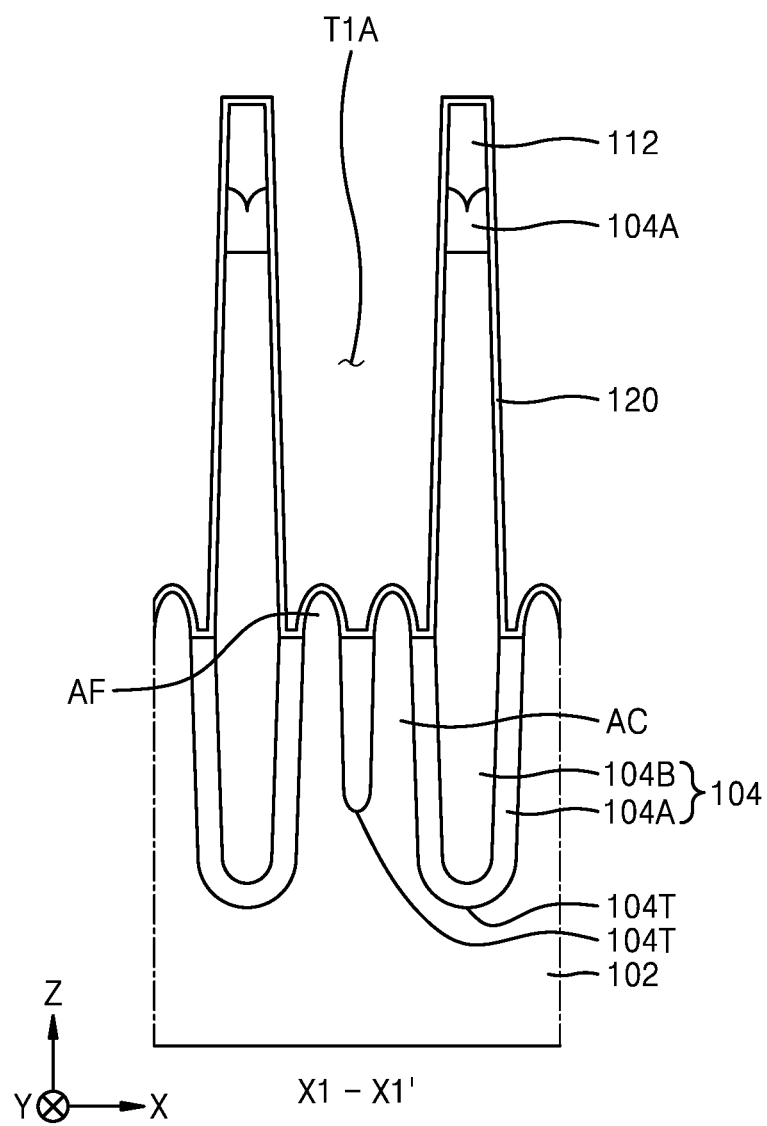
Figure 14B:
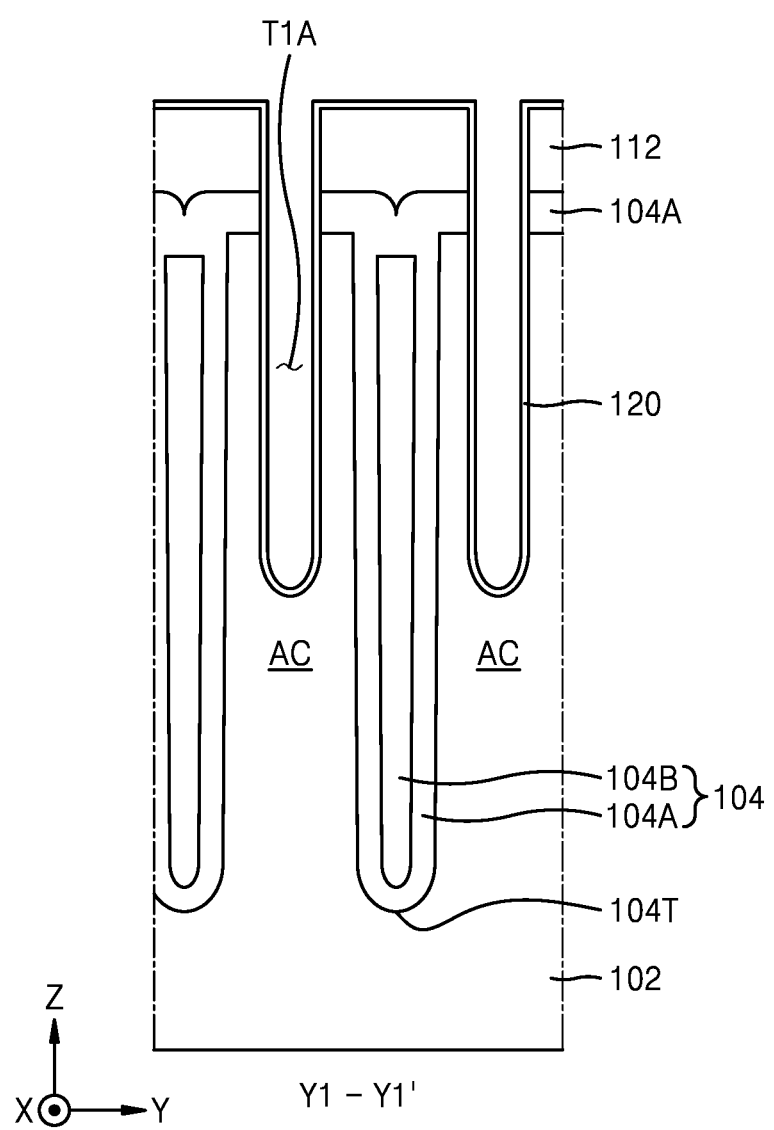

Referring to FIGS. 14A and 14B, a gate dielectric film 120 may be formed on a resulting product of FIGS. 13A, 13B, and 13C. The gate dielectric film 120 may be formed to conformally cover exposed surfaces of the resulting product of FIGS. 13A, 13B, and 13C.

In an embodiment, a process of forming the gate dielectric film 120 may be performed by using a radial line slot antenna (RLSA) microwave plasma processing apparatus, a remote plasma-type plasma processing apparatus, an inductively coupled plasma (ICP) plasma-type plasma processing apparatus, an electron cyclotron resonance (ECR) plasma-type plasma processing apparatus, a surface reflected wave plasma-type plasma processing apparatus, a magnetron plasma-type plasma processing apparatus, or the like. In an embodiment, the gate dielectric film 120 may have a thickness in a range of about 10 Å to about 40 Å. However, embodiments of the present inventive concept are not necessarily limited thereto.

Figure 15A:
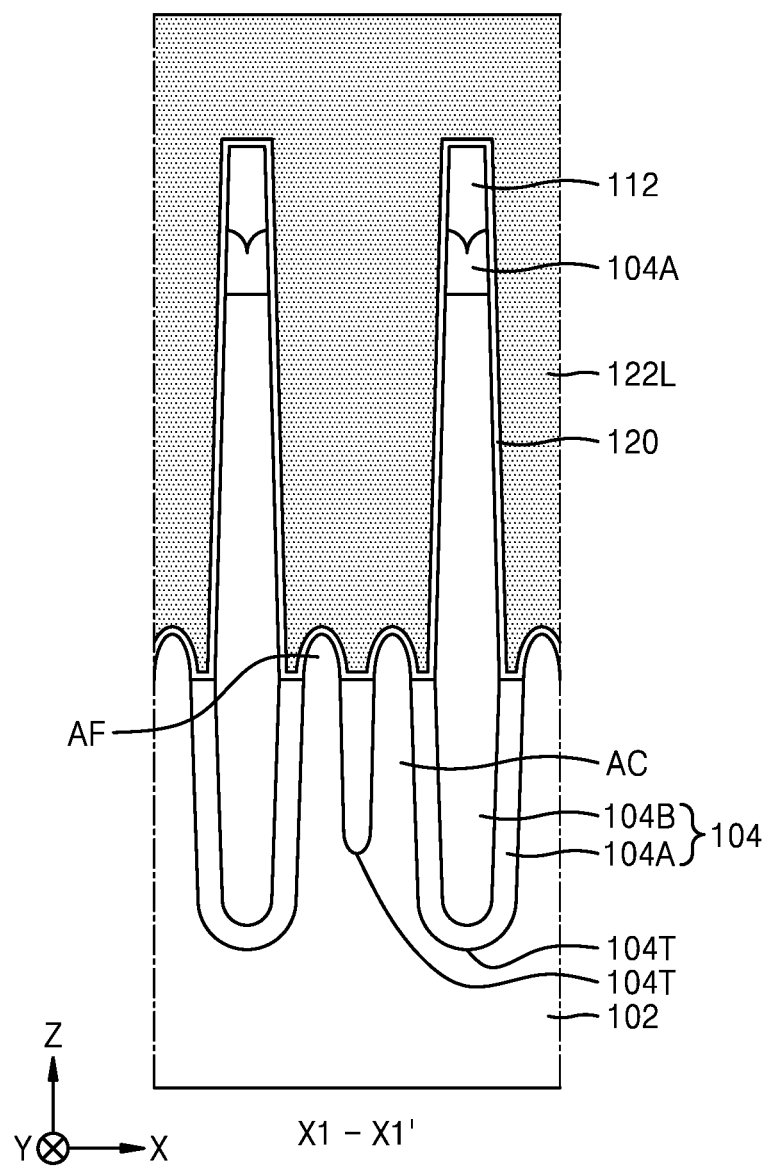
Figure 15B:
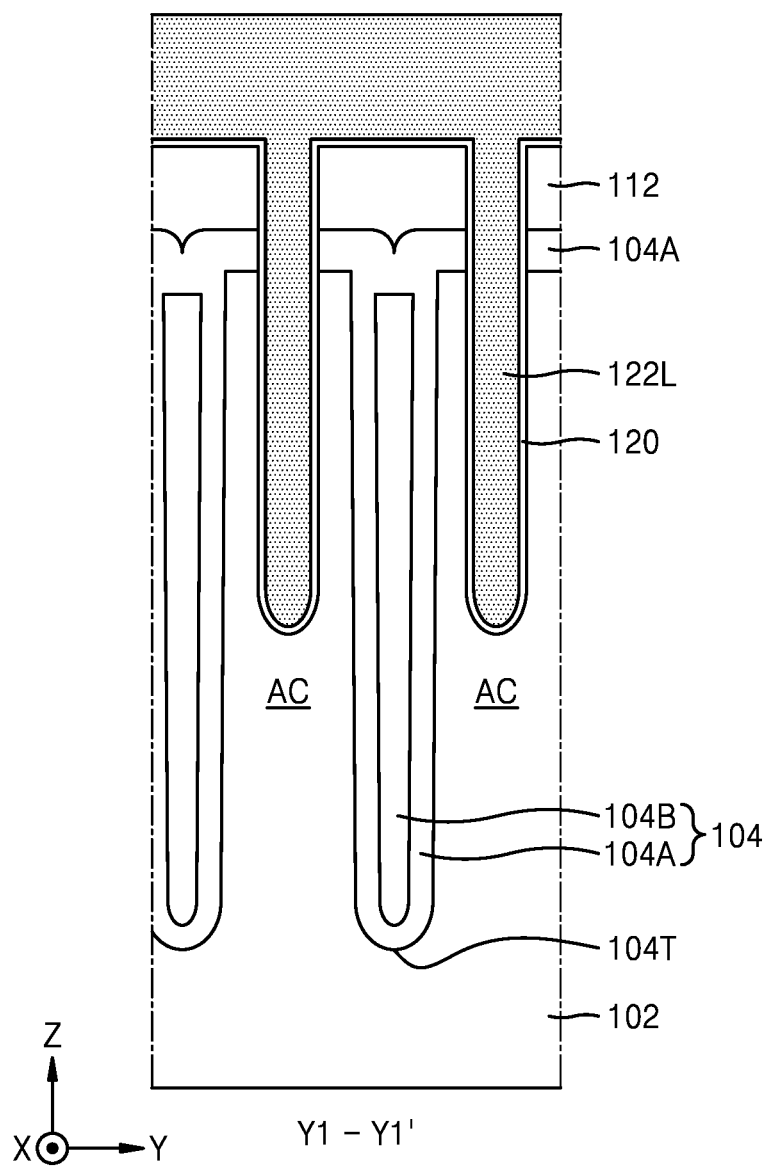

Referring to FIGS. 15A and 15B, a conductive layer 122L may be formed on a resulting product of FIGS. 14A and 14B. The conductive layer 122L may be formed, on the gate dielectric film 120, to a thickness sufficient to fill the plurality of first trenches T1A. In an embodiment, the conductive layer 122L may include, but is not necessarily limited to, Ti, TiN, Ta, TaN, W, WN, Mo, TiSiN, WSiN, or a combination thereof.

Figure 16A:
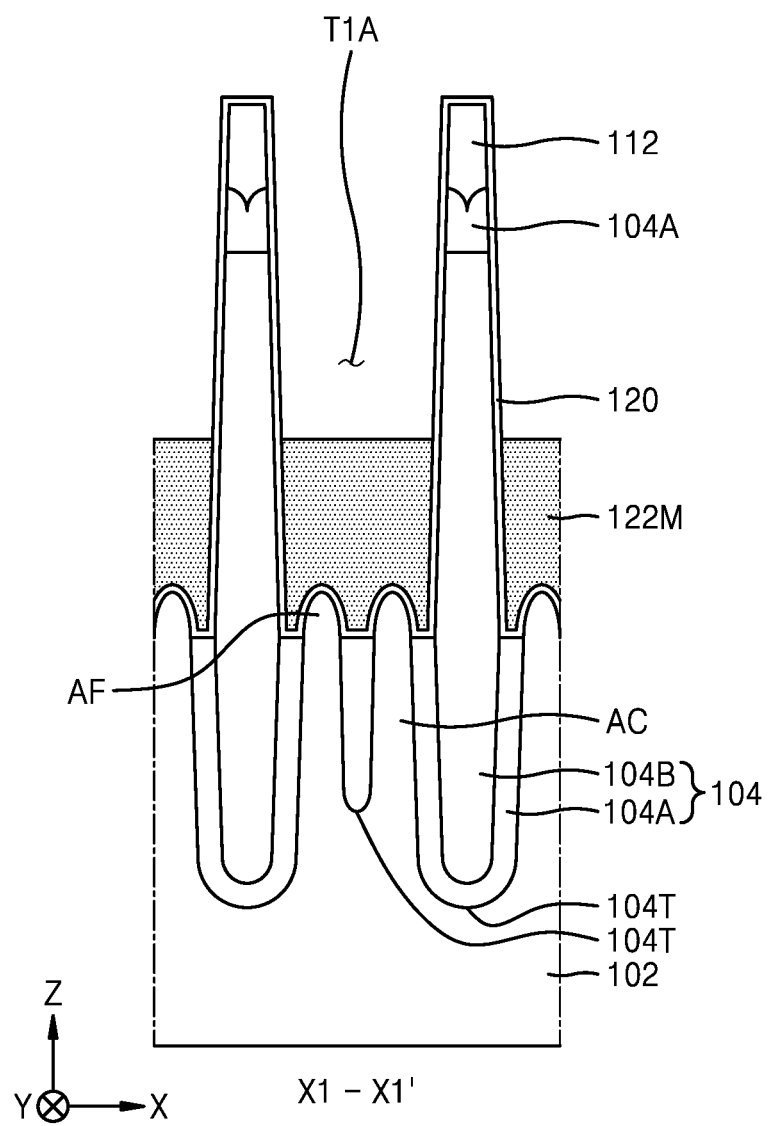
Figure 16B:
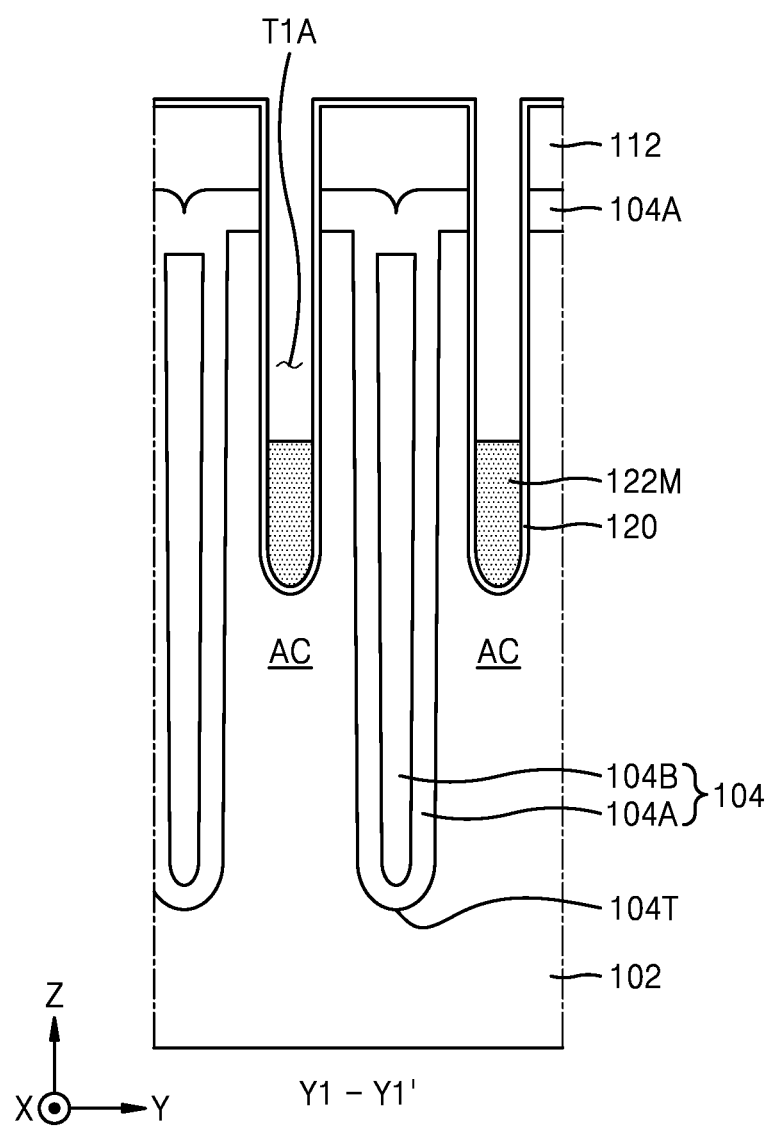

Referring to FIGS. 16A and 16B, in a resulting product of FIGS. 15A and 15B, the conductive layer 122L may be etched back. As a result, the conductive layer 122L may be separated into a plurality of conductive layers 122M, which partially fill the plurality of first trenches T1A, respectively. A portion of the first trench T1A over each of the plurality of conductive layers 122M may remain empty.

Figure 17A:
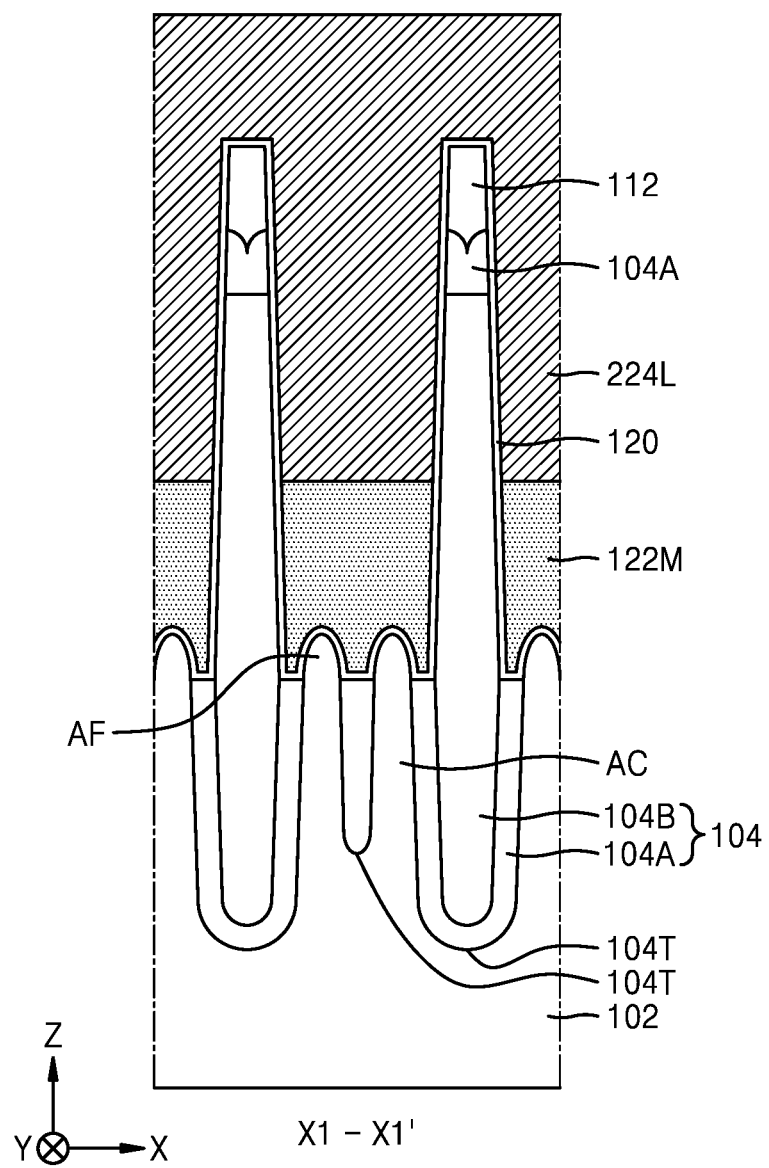
Figure 17B:
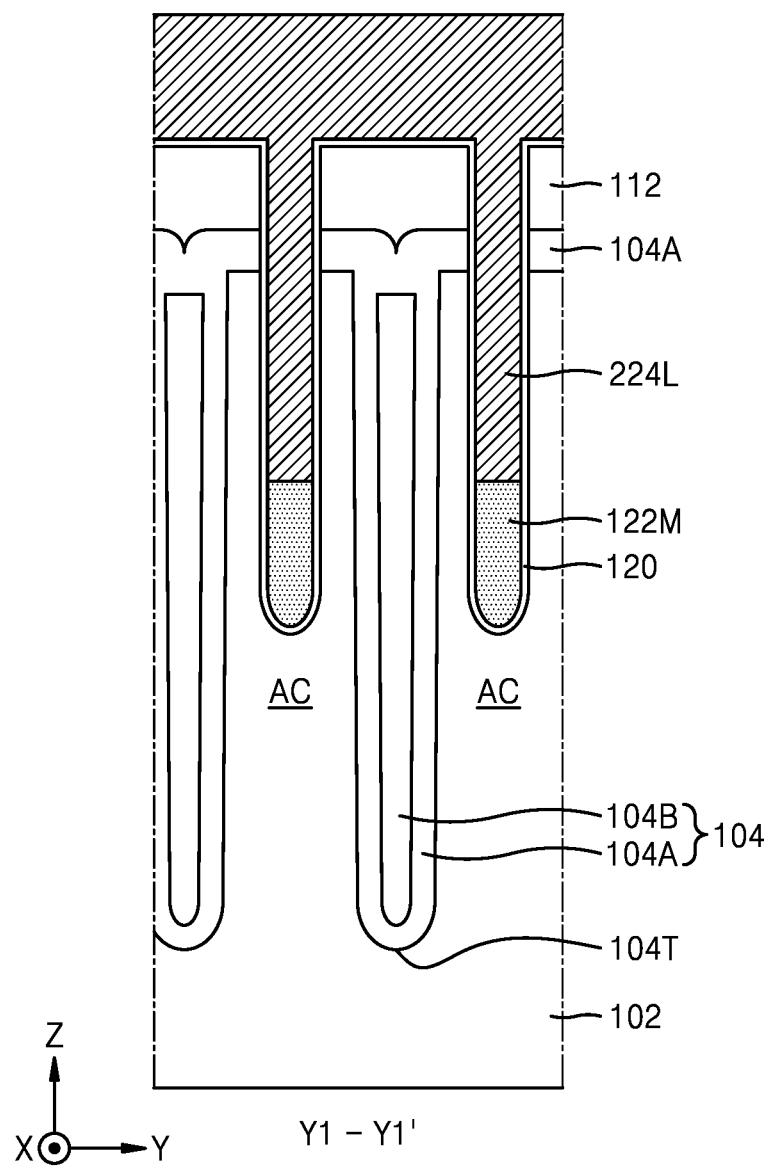

Referring to FIGS. 17A and 17B, a doped semiconductor layer 224L may be formed on a resulting product of FIGS. 16A and 16B. In some embodiments, the doped semiconductor layer 224L may include doped polysilicon.

Figure 18A:
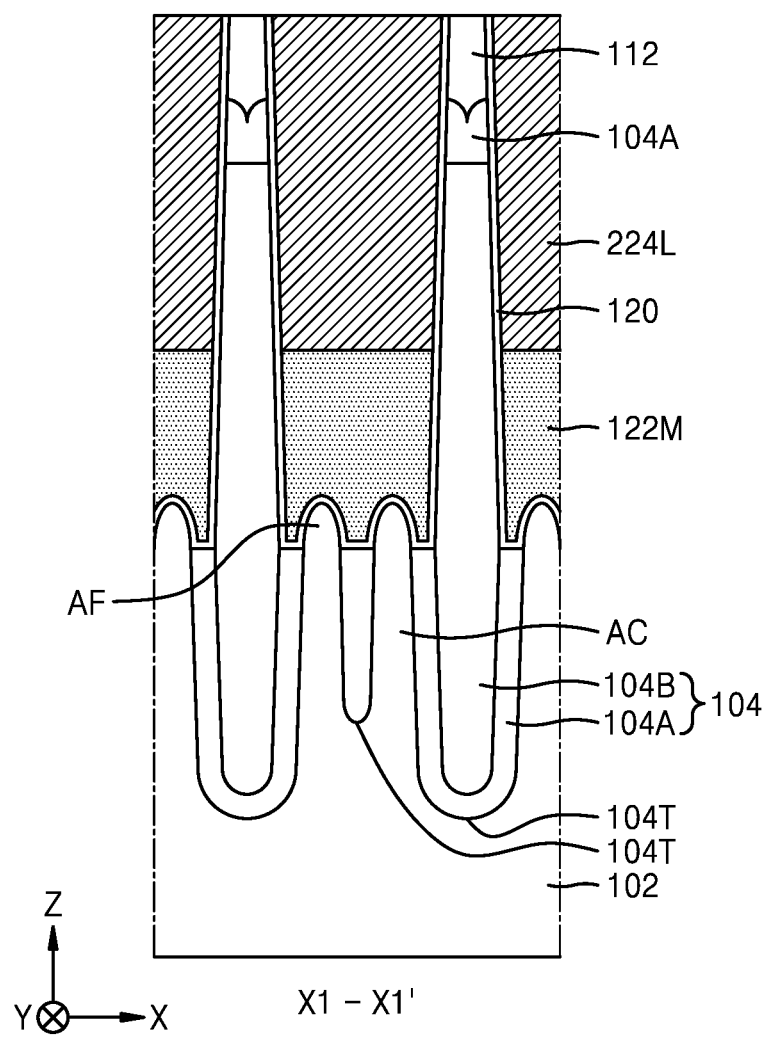
Figure 18B:
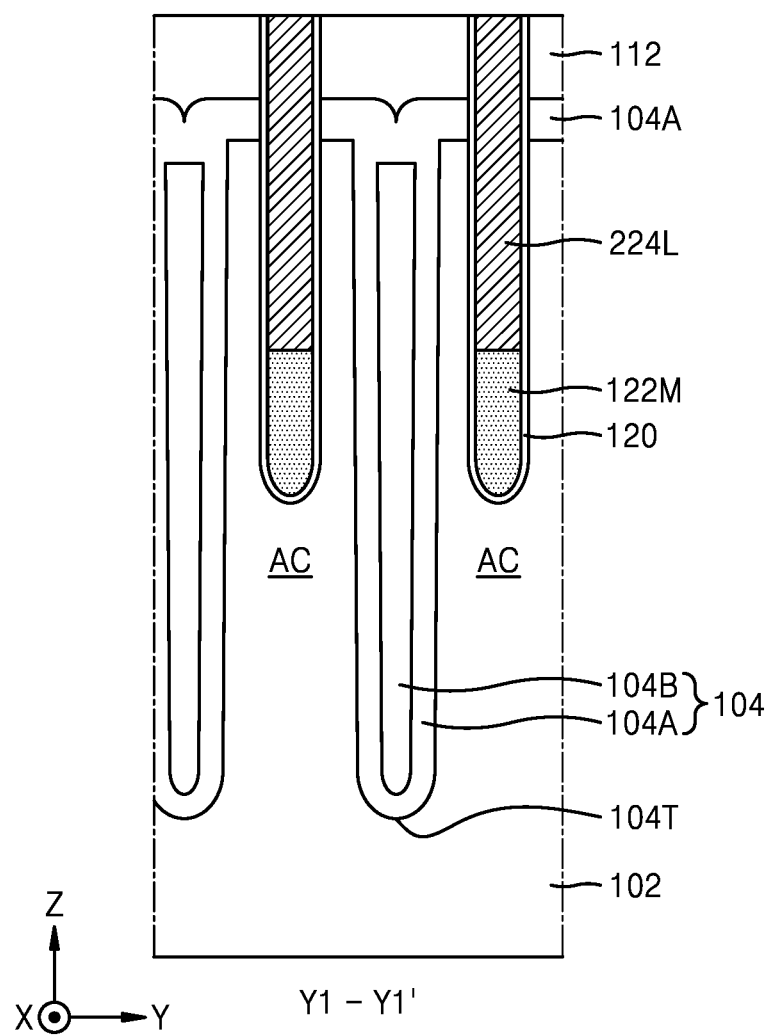

Referring to FIGS. 18A and 18B, in a resulting product FIGS. 17A and 17B, the doped semiconductor layer 224L may be planarized by a chemical mechanical polishing (CMP) process such that an upper surface of the silicon oxide film 112 is exposed.

Figure 19A:
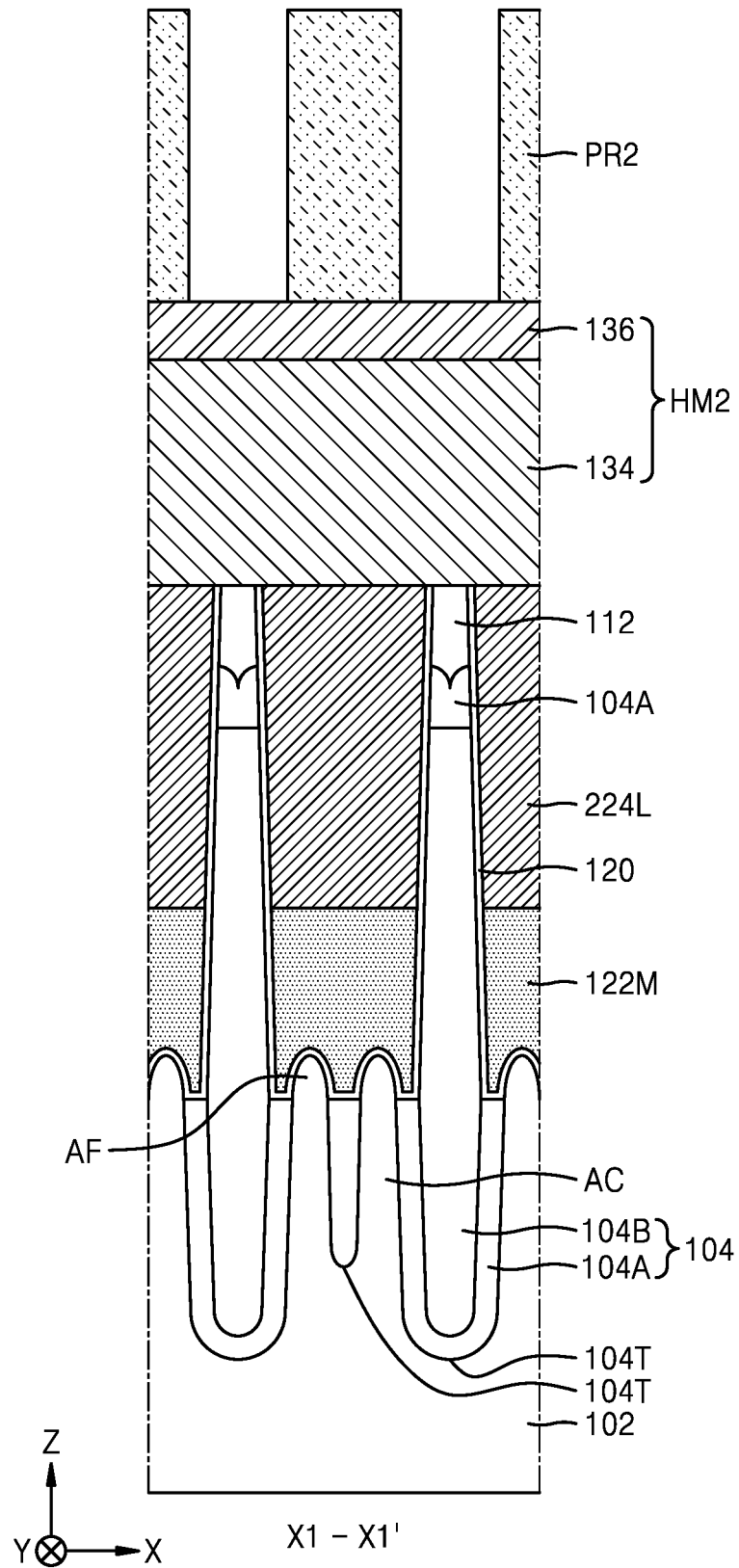
Figure 19B:
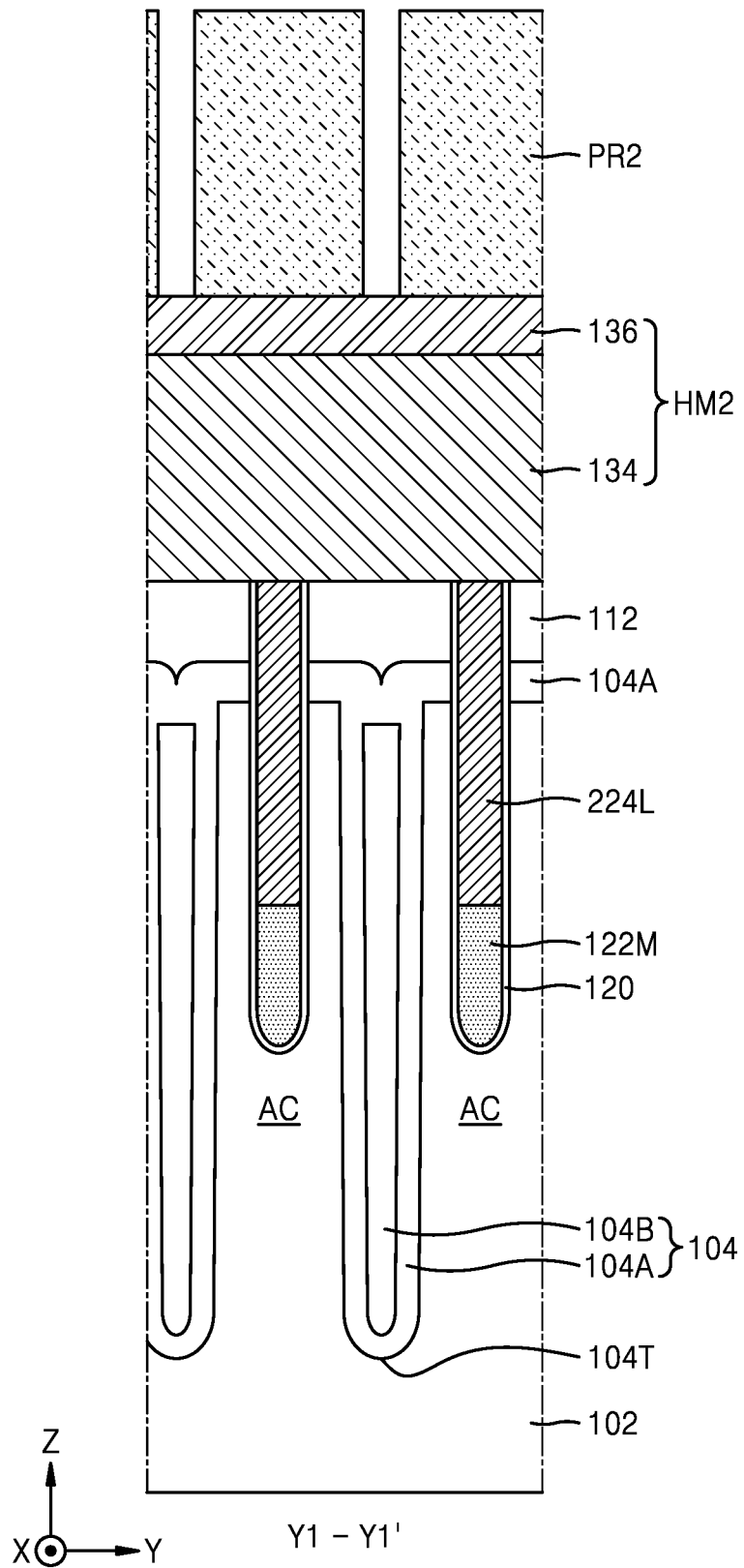

Referring to FIGS. 19A and 19B, a hardmask layer HM2 may be formed on a resulting product of FIGS. 18A and 18B, and a photoresist pattern PR2 may be formed on the hardmask layer HM2. The hardmask layer HM2 may include multiple layers in which a plurality of material layers different from each other are stacked (e.g., in the Z direction). For example, in an embodiment the hardmask layer HM2 may include a carbon-containing film 134 and a silicon nitride film 136, which are stacked in the stated order (e.g., in the Z direction) on a planarized upper surface of each of the silicon oxide film 112 and the doped semiconductor layer 224L. In an embodiment, the carbon-containing film 134 may include an ACL or a C-SOH.

Referring to FIGS. 20A and 20B, in a resulting product of FIGS. 19A and 19B, a hardmask pattern HMP2 may be formed by etching the hardmask layer HM2 by using the photoresist pattern PR2 as an etch mask.

Referring to FIGS. 21A, 21B, and 21C, in a resulting product of FIGS. 20A and 20B, the plurality of second trenches T1B may be formed by etching a portion of the doped semiconductor layer 224L, a portion of each of the plurality of conductive layers 122M, a portion of the gate dielectric film 120, and a portion of the device isolation film 104 by using the hardmask pattern HMP2 as an etch mask, and the hardmask layer HM2 may be removed. After the plurality of second trenches T1B are formed, only portions of the gate dielectric film 120, which respectively cover surfaces of the plurality of conductive layers 122M, may remain on the substrate 102.

In some embodiments, the plurality of second trenches T1B shown in FIG. 21C may be simultaneously formed. However, embodiments of the present inventive concept are not necessarily limited thereto.

In some embodiments, some second trenches T1B of the plurality of second trenches T1B may be formed first, and then, some other second trenches T1B of the plurality of second trenches T1B may be subsequently formed. In this embodiment, to form the plurality of second trenches T1B, the method described regarding the formation of the plurality of first trenches T1A with reference to FIG. 13D, the method described regarding the formation of the plurality of first trenches T1A with reference to FIG. 13E, or methods, which are variously modified and changed therefrom without departing from the scope of the present inventive concept, may be used. As such, by dividing the plurality of second trenches T1B into a plurality of groups and sequentially forming the plurality of groups, a sufficient exposure margin and/or a sufficient etching margin may be secured during the process of forming the plurality of second trenches T1B.

Figure 22A:
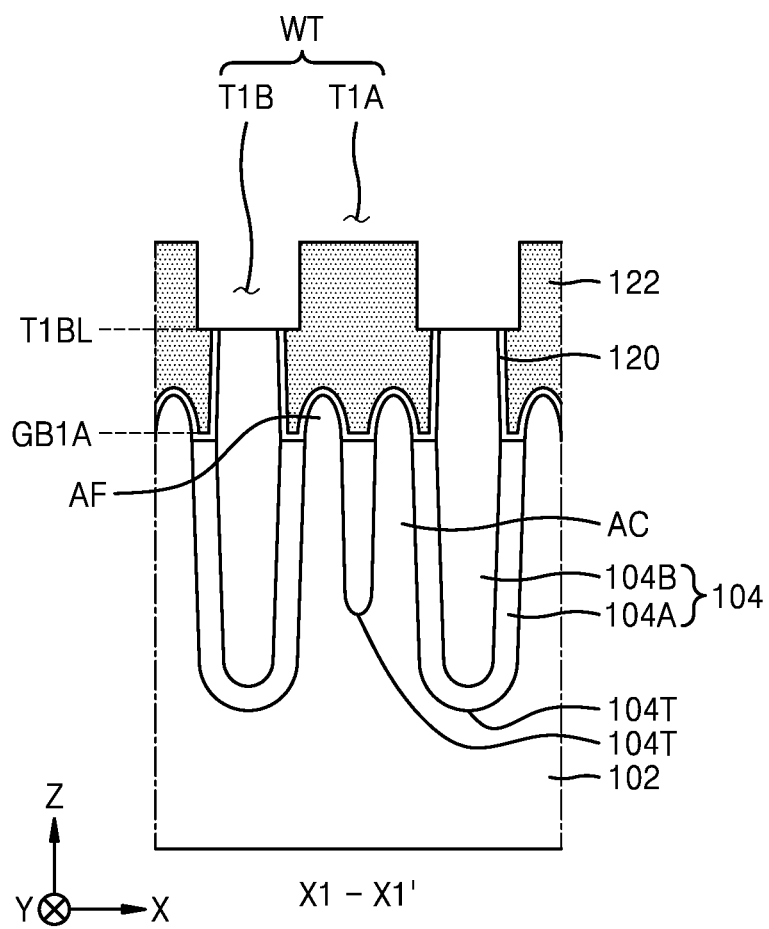
Figure 22B:
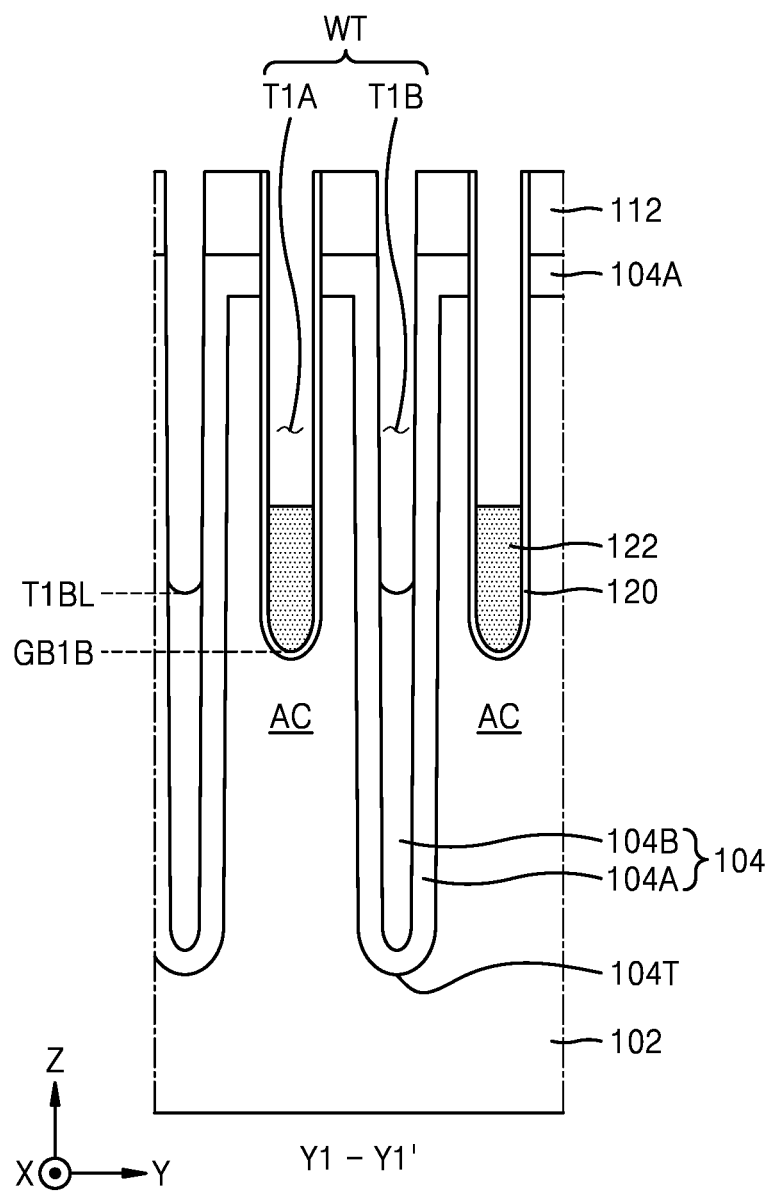

Referring to FIGS. 22A and 22B, in a resulting product of FIGS. 21A and 21B, an upper surface of each of the plurality of conductive layers 122M may be exposed by removing the doped semiconductor layer 224L. After the doped semiconductor layer 224L is removed, the remaining resulting products of the plurality of conductive layers 122M may respectively constitute the plurality of first conductive patterns 122.

A portion of the first trench T1A over each of the plurality of first conductive patterns 122 may remain empty, and the plurality of second trenches T1B may be respectively connected to the plurality of first trenches T1A in the first horizontal direction (X direction). The plurality of first trenches T1A and the plurality of second trenches T1B may constitute a plurality of word line trenches WT.

Figure 23A:
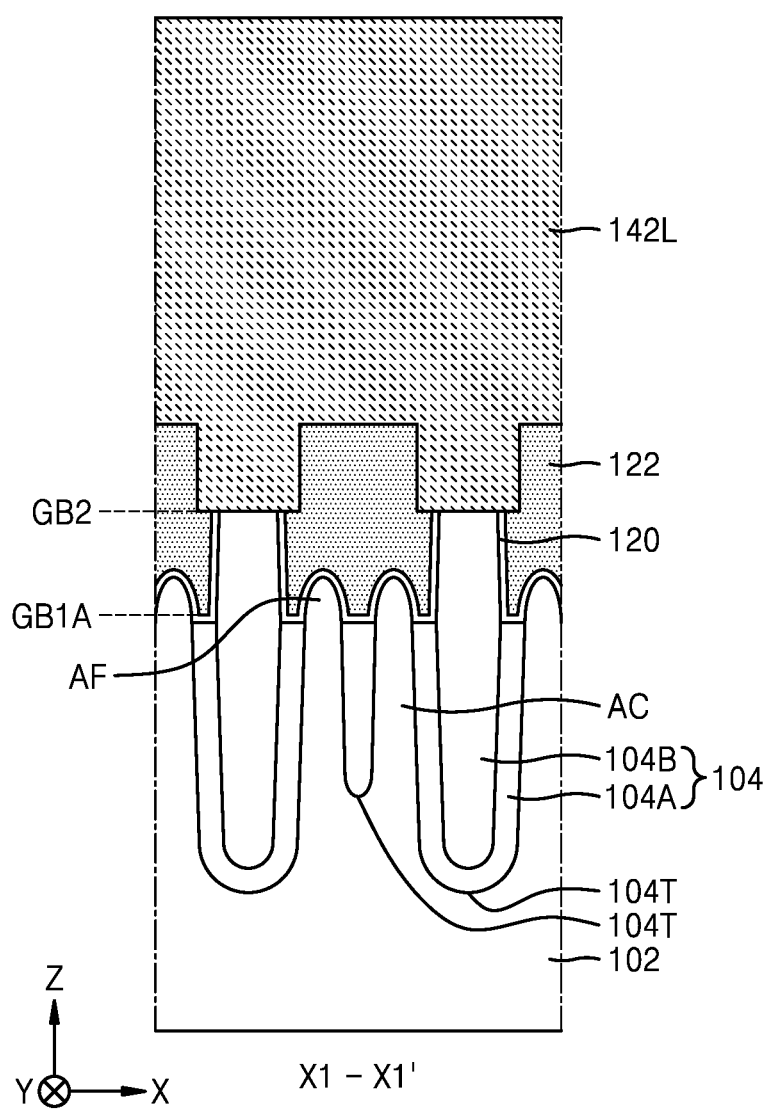
Figure 23B:
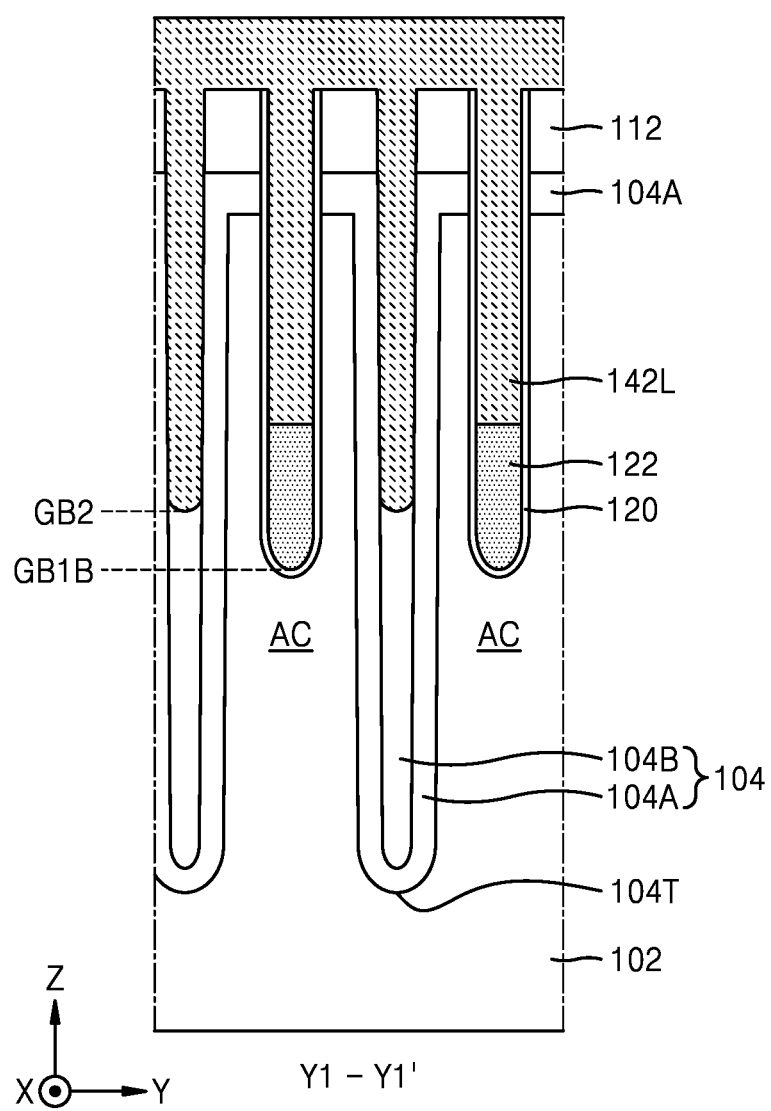

Referring to FIGS. 23A and 23B, in a resulting product of FIGS. 22A and 22B, a conductive layer 142L may be formed to a thickness sufficient to fill the plurality of first trenches T1A and the plurality of second trenches T1B. In an embodiment, the conductive layer 142L may include Ti, TiN, Ta, TaN, W, WN, Mo, TiSiN, WSiN, or a combination thereof. However, embodiments of the present inventive concept are not necessarily limited thereto.

Figure 24A:
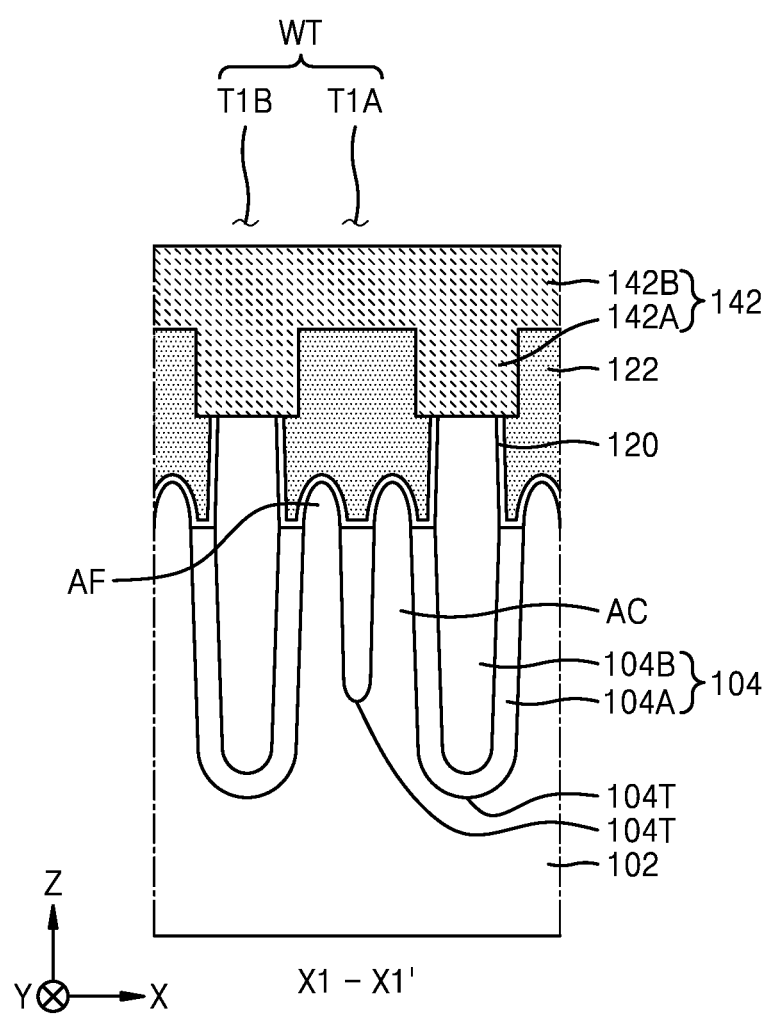
Figure 24B:
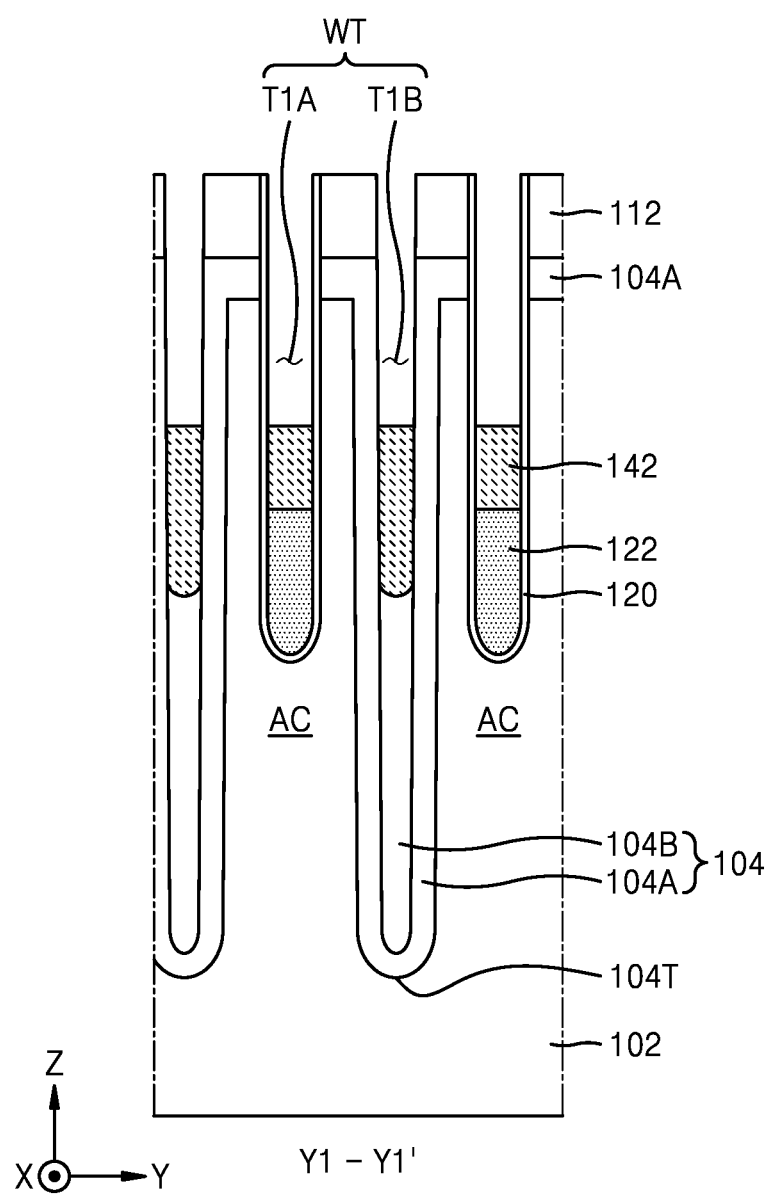

Referring to FIGS. 24A and 24B, in a resulting product of FIGS. 23A and 23B, by etching-back the conductive layer 142L such that a certain space of each of the plurality of first trenches T1A and the plurality of second trenches T1B remains, a plurality of connecting lines 142, which respectively include the remaining portions of the conductive layer 142L, may be formed. Each of the plurality of connecting lines 142 may include the second conductive pattern 142A and the conductive line portion 142B, which are integrally connected to each other.

Figure 25A:
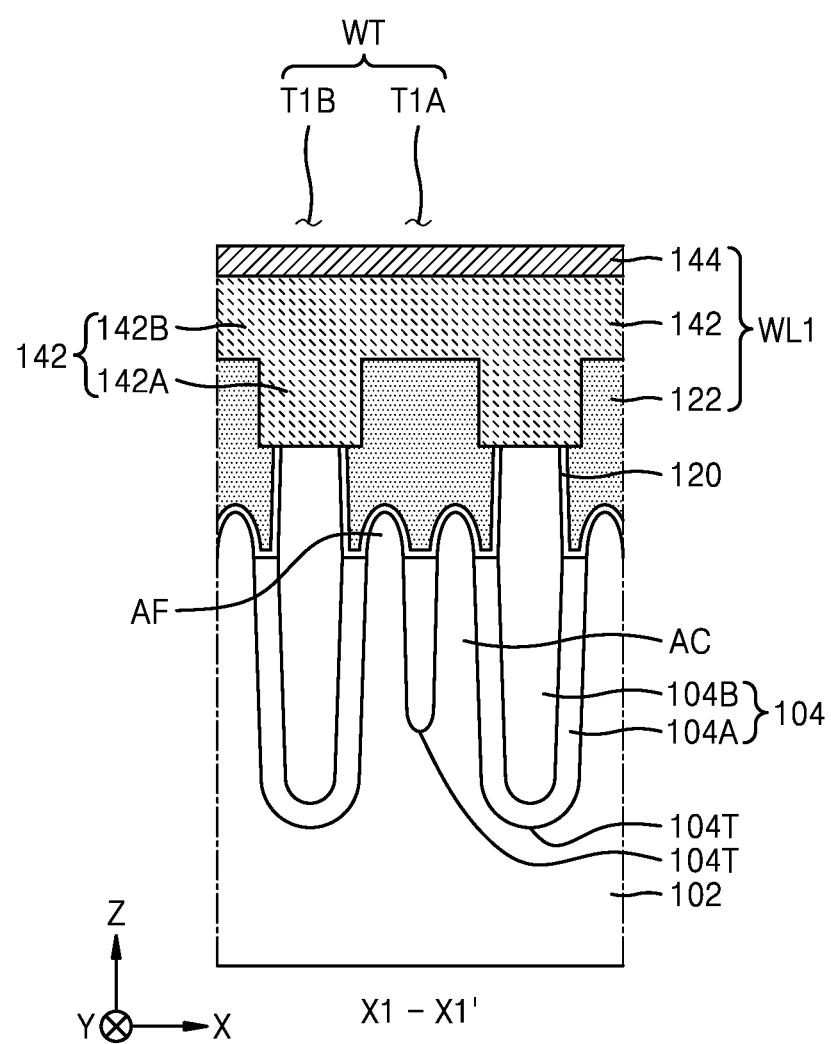
Figure 25B:
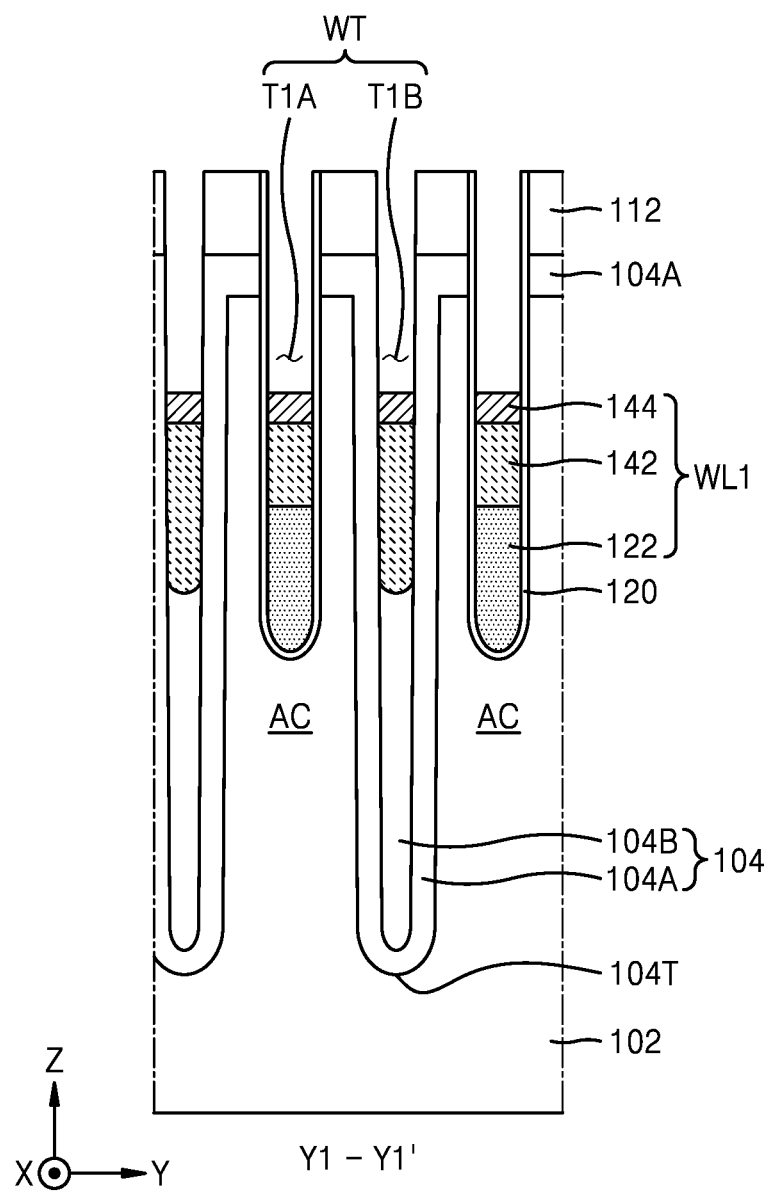

Referring to FIGS. 25A and 25B, a plurality of doped semiconductor patterns 144 may be formed on a resulting product of FIGS. 24A and 24B. In an example of a process of forming the plurality of doped semiconductor patterns 144, a doped polysilicon layer may be formed to a thickness sufficient to fill the plurality of first trenches T1A and the plurality of second trenches T1B in the resulting product of FIGS. 24A and 24B, followed by etching-back the doped polysilicon layer, thereby forming the plurality of doped semiconductor patterns 144, which respectively include the remaining portions of the doped polysilicon layer. After the plurality of doped semiconductor patterns 144 are formed, a portion of each of the plurality of first trenches T1A and the plurality of second trenches T1B may remain empty. The plurality of first conductive patterns 122, the connecting line 142, and the doped semiconductor pattern 144 may constitute the word line WL1.

Figure 26A:
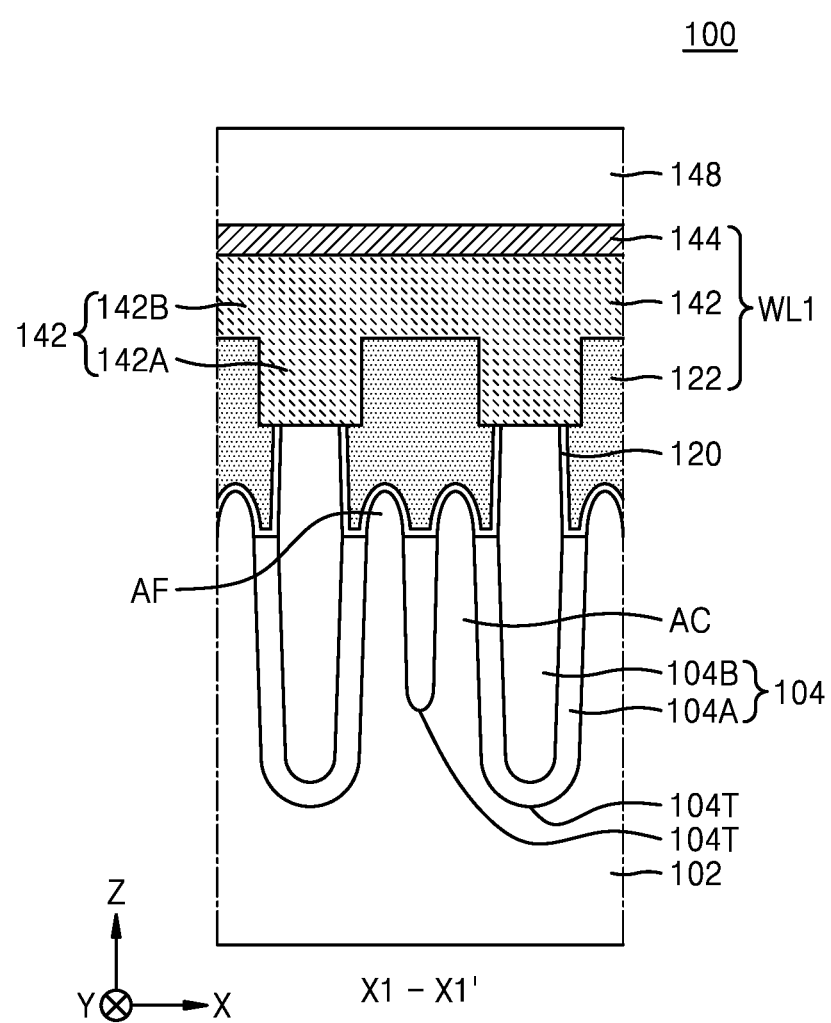
Figure 26B:
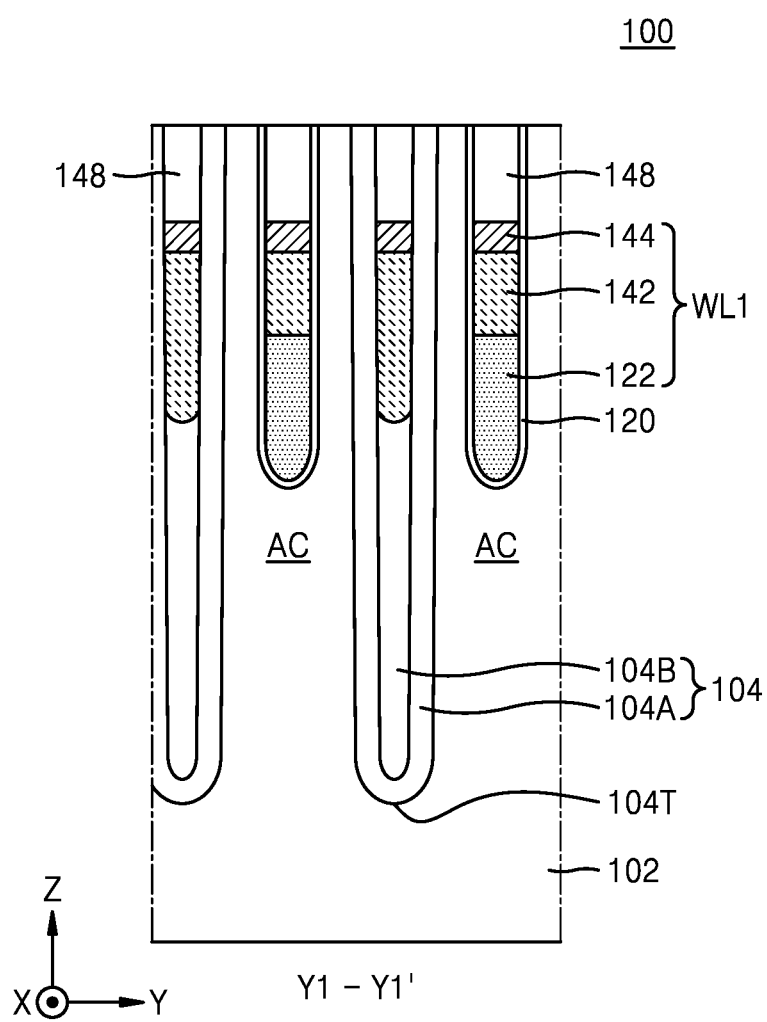

Referring to FIGS. 26A and 26B, in a resulting product of FIGS. 25A and 25B, by forming the buried insulating film 148 to fill the empty portion of each of the plurality of first trenches T1A and the plurality of second trenches T1B, the integrated circuit device 100 shown in FIGS. 3A to 3D may be fabricated.

Figure 27A:
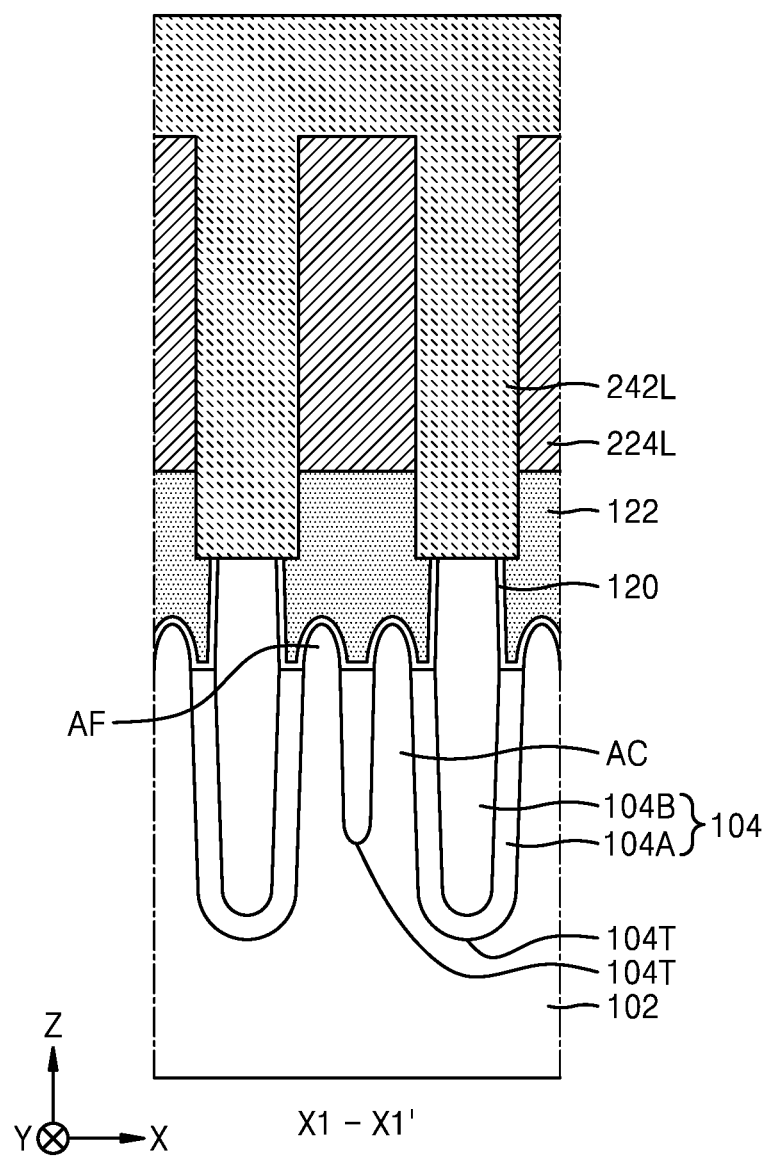
FIGS. 27A to 29B are cross-sectional views respectively illustrating a sequence of processes of a method of fabricating an integrated circuit device, according to some embodiments, and in particular, FIGS. 27A, 28A, and 29A respectively illustrate cross-sectional views of some components in a region corresponding to a cross-section taken along the line X1-X1' of FIGS. 3C and 3D according to the sequence of processes, and FIGS. 27B, 28B, and 29B respectively illustrate cross-sectional views of some components in a region corresponding to a cross-section taken along the line Y1-Y1' of FIGS. 3C and 3D according to the sequence of processes.
Figure 27B:
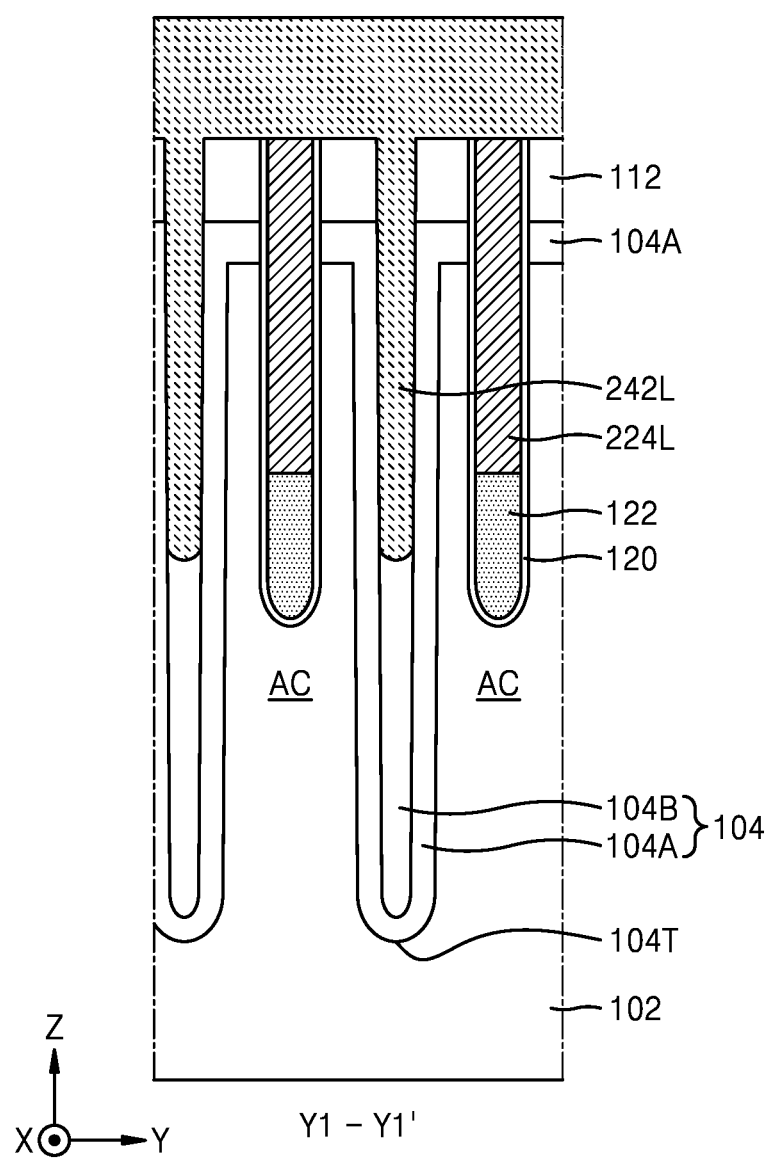
Figure 28A:
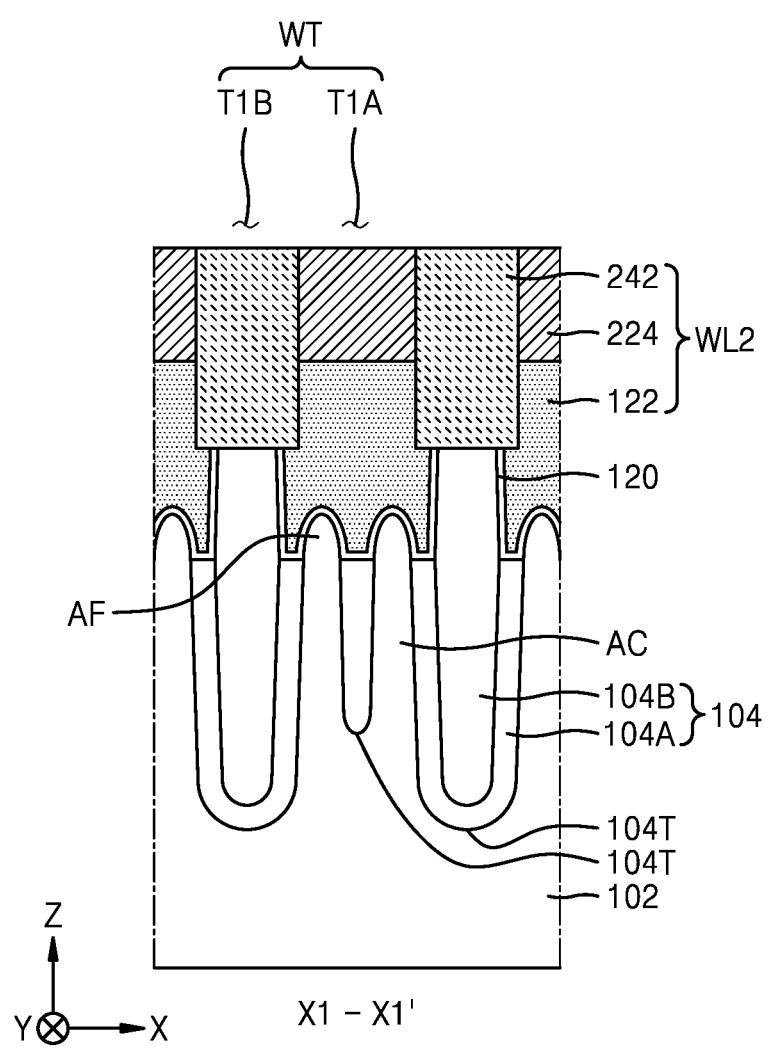
Figure 28B:
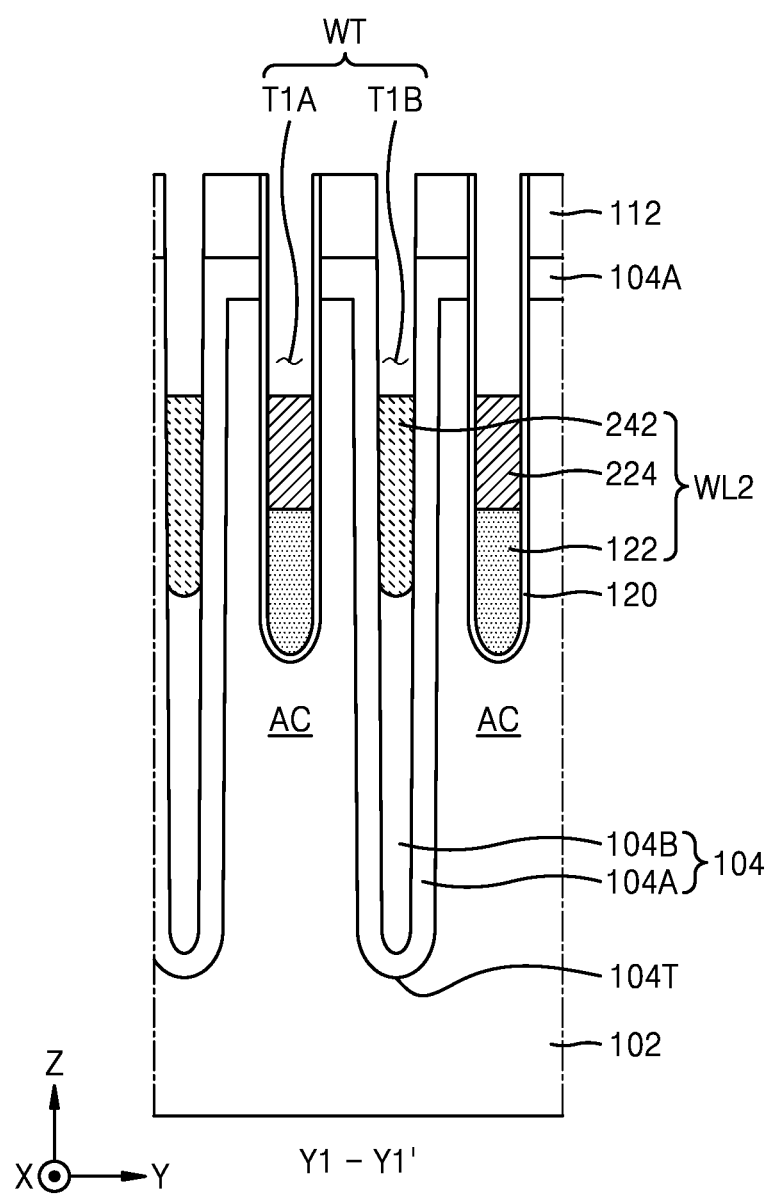
Figure 29A:
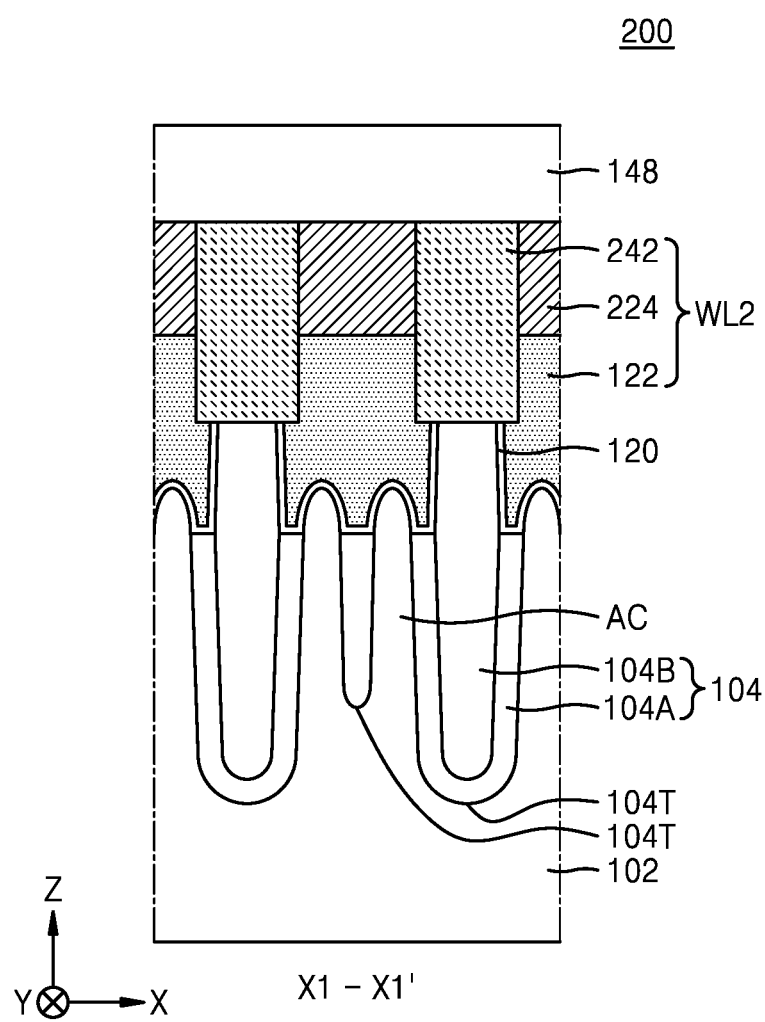
Figure 29B:
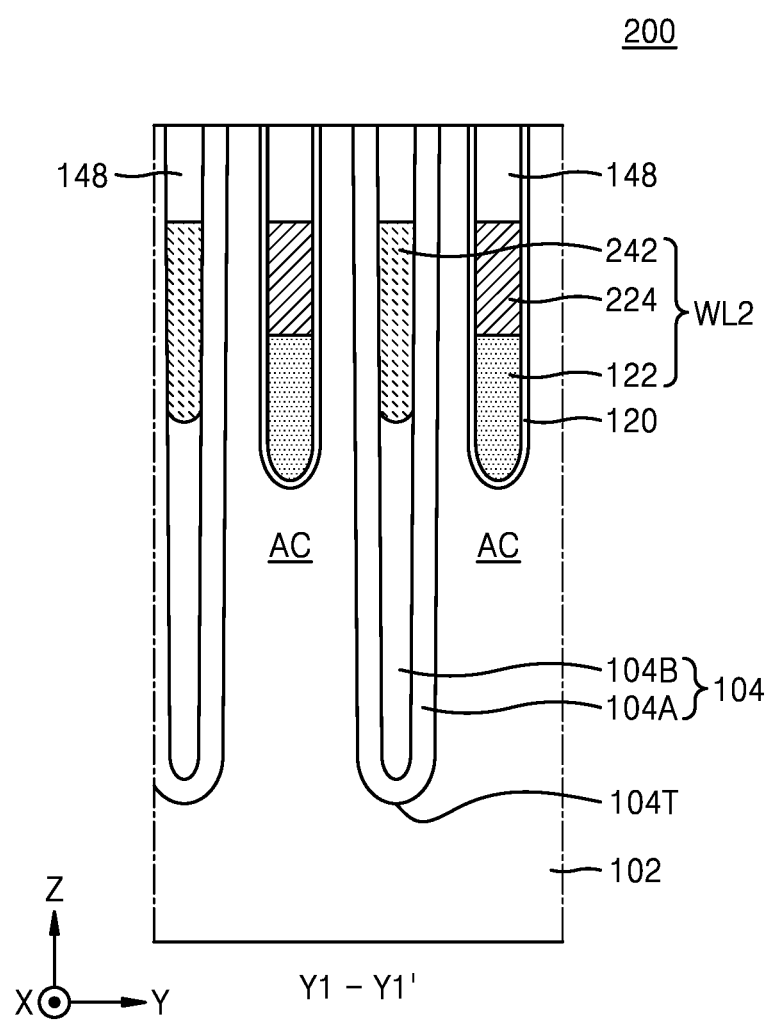

FIGS. 27A to 29B are cross-sectional views respectively illustrating a sequence of processes of a method of fabricating an integrated circuit device, according to some embodiments, and in particular, FIGS. 27A, 28A, and 29A respectively illustrate cross-sectional views of some components in a region corresponding to a cross-section taken along the line X1-X1' of FIGS. 3C and 3D according to the sequence of processes, and FIGS. 27B, 28B, and 29B respectively illustrate cross-sectional views of some components in a region corresponding to a cross-section taken along the line Y1-Y1' of FIGS. 3C and 3D according to the sequence of processes. An example of a method of fabricating the integrated circuit device 200 shown in FIGS. 4A and 4B will be described with reference to FIGS. 27A to 29B.

Referring to FIGS. 27A and 27B, after the processes described with reference to FIGS. 11A to 21C are performed, a conductive layer 242L may be formed on the resulting product of FIGS. 21A, 21B, and 21C. In an embodiment, the conductive layer 242L may include Ti, TiN, Ta, TaN, W, WN, Mo, TiSiN, WSiN, or a combination thereof. However, embodiments of the present disclosure are not necessarily limited thereto. After the conductive layer 242L is formed, the plurality of first conductive patterns 122, which contact the conductive layer 242L, may be obtained from the plurality of conductive layers 122M.

Referring to FIGS. 28A and 28B, in a resulting product of FIGS. 27A and 27B, by etching-back a portion of the conductive layer 242L and a portion of the doped semiconductor layer 224L, the plurality of doped semiconductor patterns 224 having planarized upper surfaces and the plurality of second conductive patterns 242 having planarized upper surfaces may be formed. The plurality of first trenches T1A may have certain spaces remaining over the plurality of doped semiconductor patterns 224, respectively, and the plurality of second trenches T1B may have certain spaces remaining over the plurality of second conductive patterns 242, respectively. The plurality of first conductive patterns 122, the plurality of second conductive patterns 242, and the plurality of doped semiconductor patterns 224 may constitute the word line WL2.

Referring to FIGS. 29A and 29B, in a resulting product of FIGS. 29A and 29B, by forming the buried insulating film 148 to fill the empty portion of each of the plurality of first trenches T1A and the plurality of second trenches T1B, the integrated circuit device 200 shown in FIGS. 4A and 4B may be fabricated.

Figure 30A:
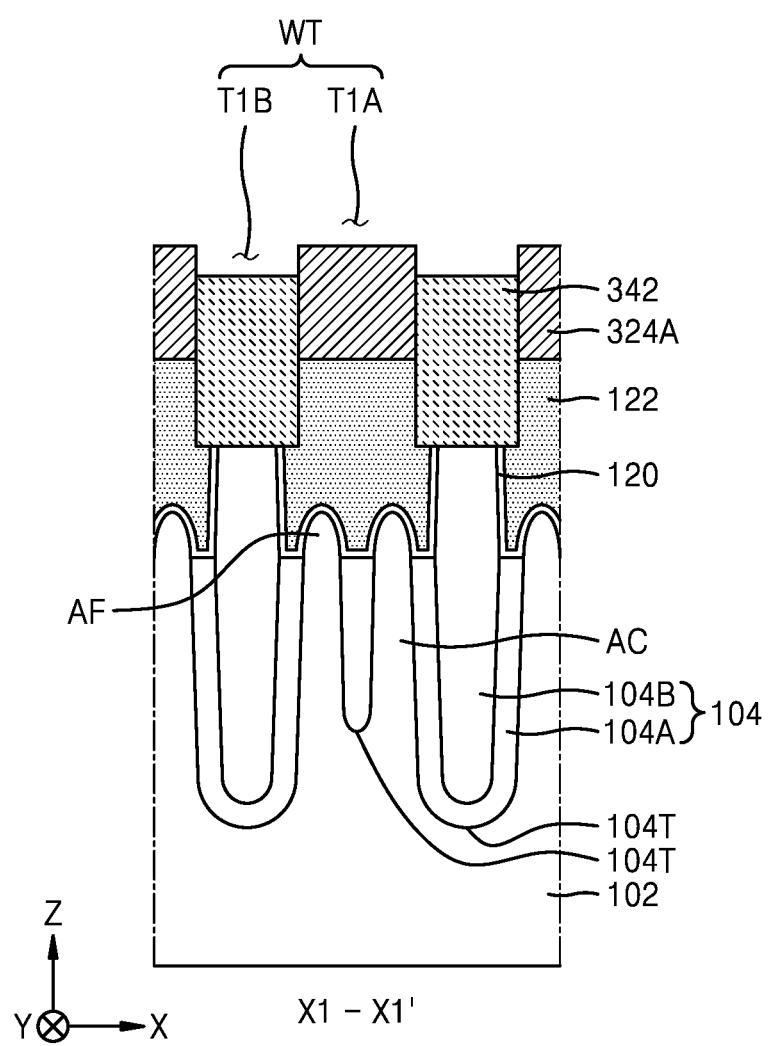
FIGS. 30A to 32B are cross-sectional views respectively illustrating a sequence of processes of a method of fabricating an integrated circuit device, according to some embodiments, and in particular, FIGS. 30A, 31A, and 32A respectively illustrate cross-sectional views of some components in a region corresponding to a cross-section taken along the line X1-X1' of FIGS. 3C and 3D according to the sequence of processes, and FIGS. 30B, 31B, and 32B respectively illustrate cross-sectional views of some components in a region corresponding to a cross-section taken along the line Y1-Y1' of FIGS. 3C and 3D according to the sequence of processes.
Figure 30B:
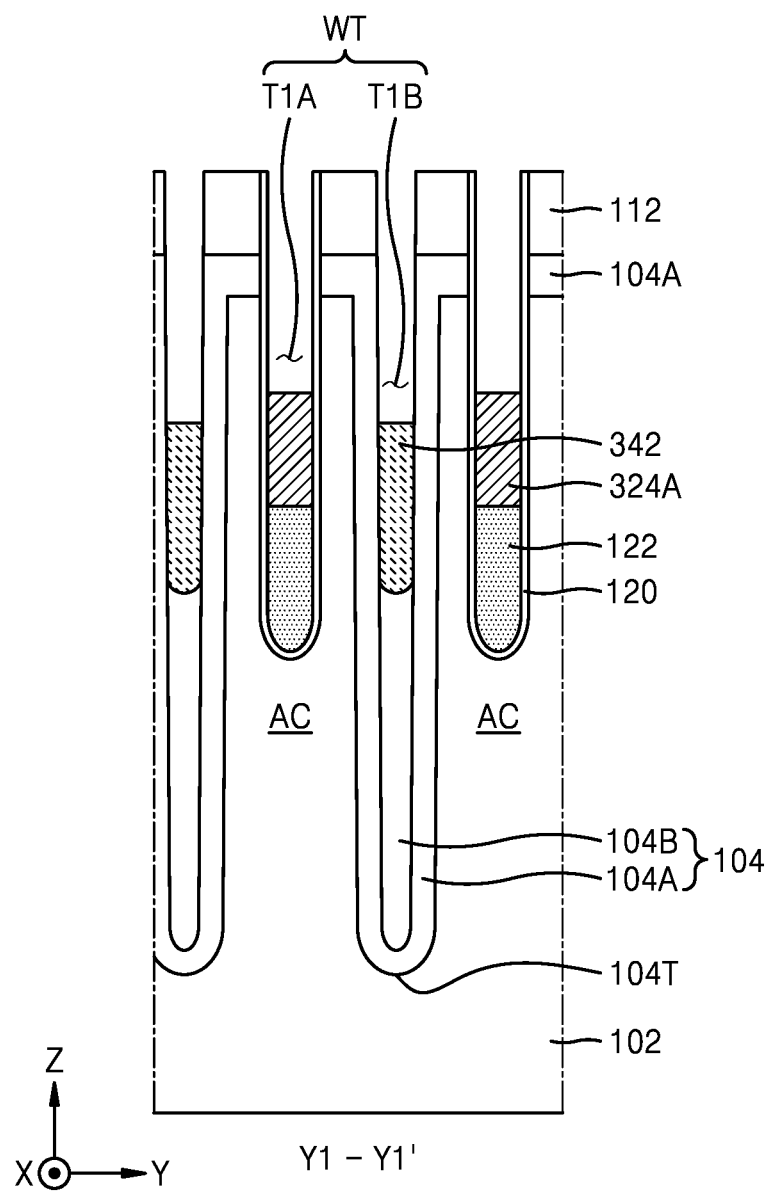
Figure 31A:
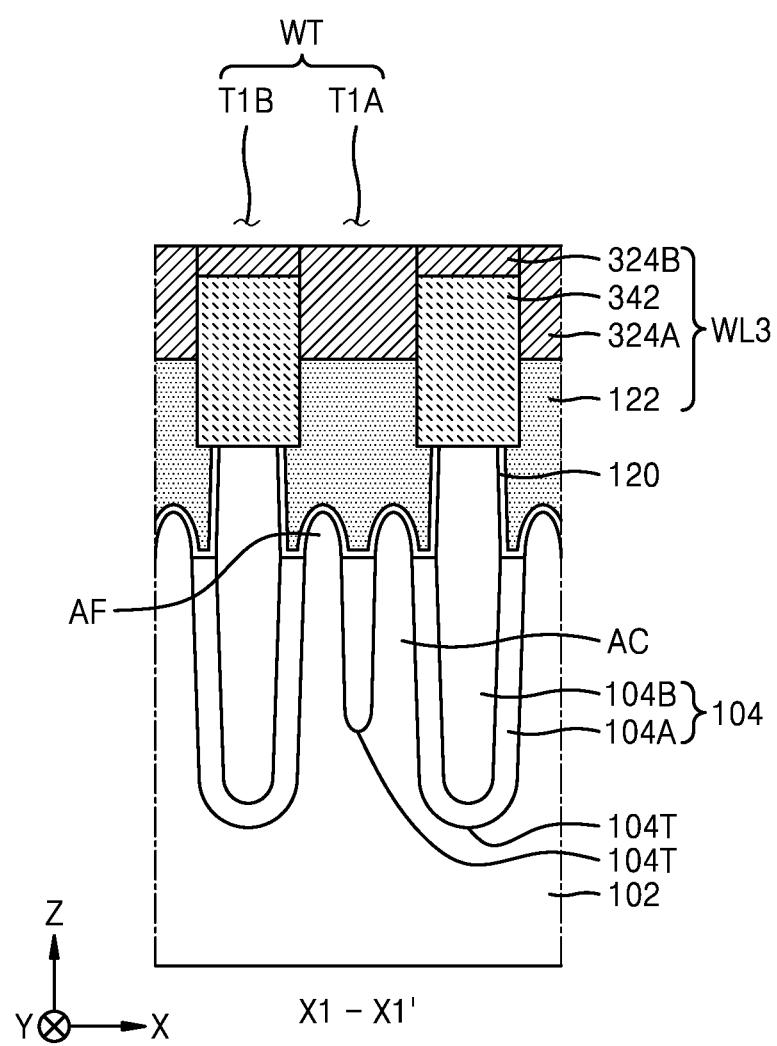
Figure 31B:
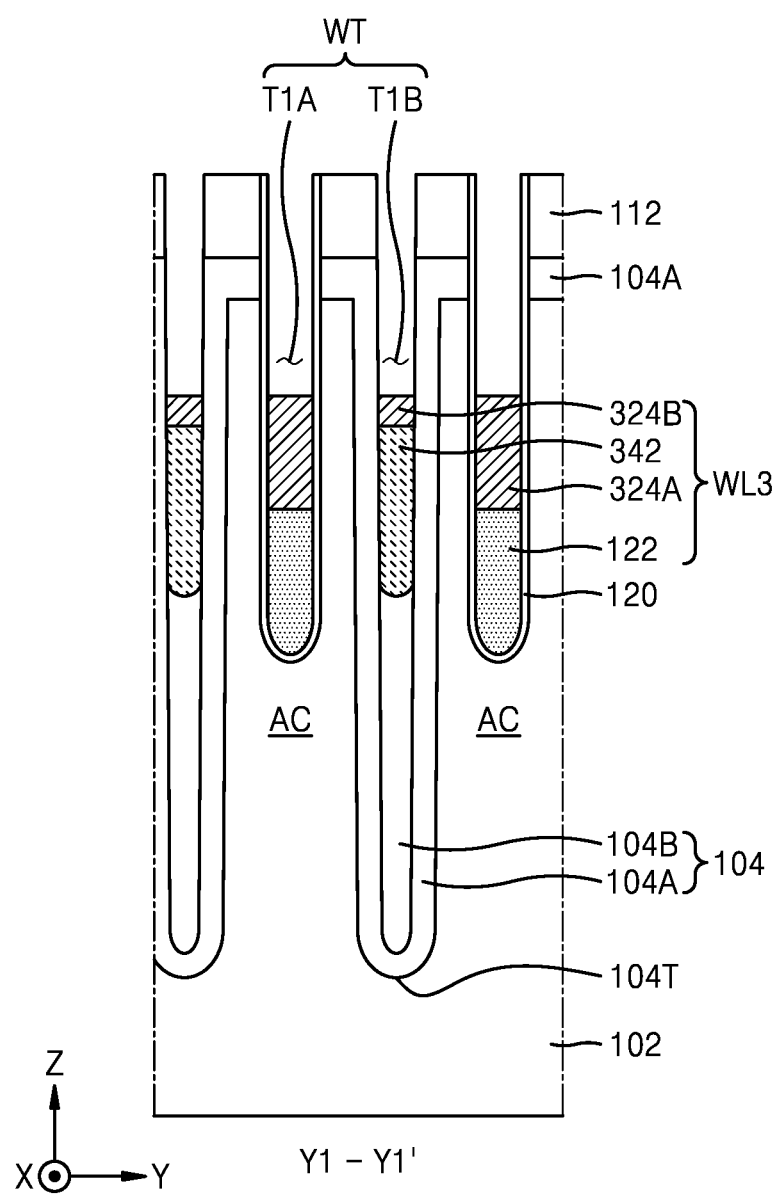
Figure 32A:
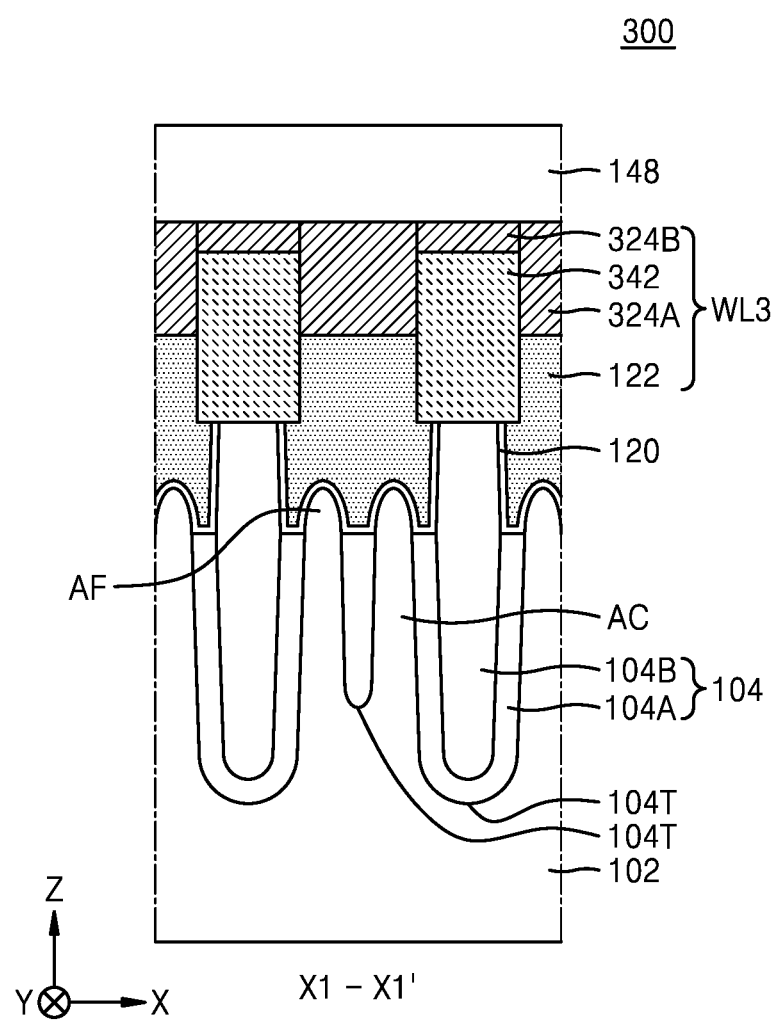
Figure 32B:
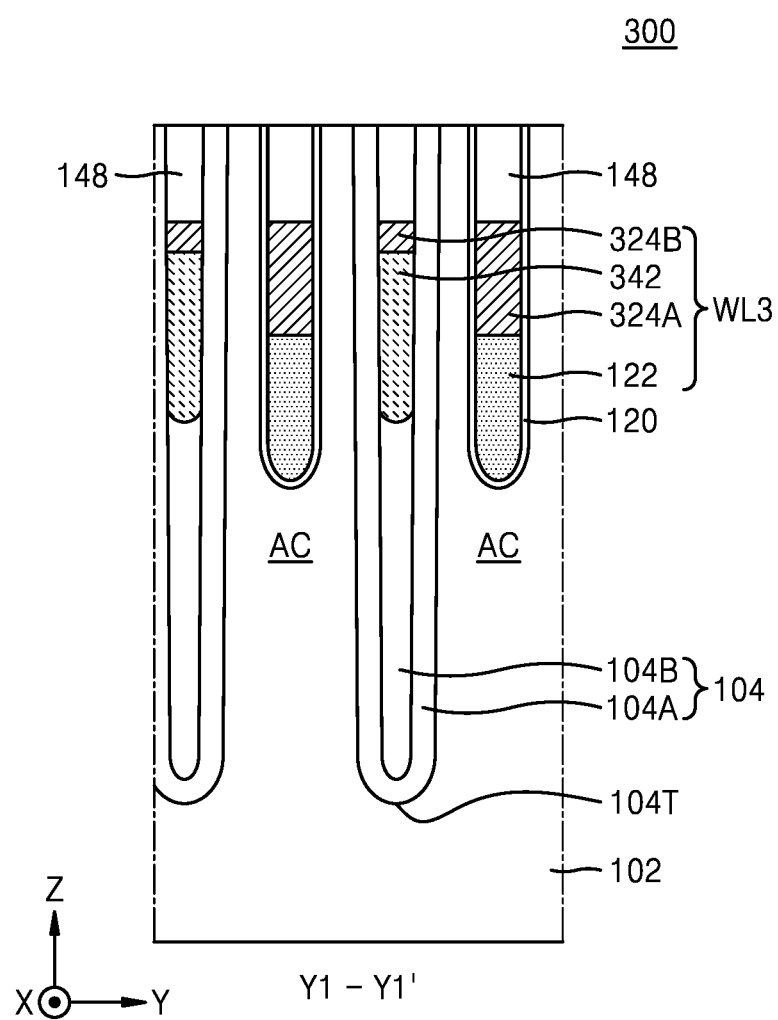

FIGS. 30A to 32B are cross-sectional views respectively illustrating a sequence of processes of a method of fabricating an integrated circuit device, according to some embodiments, and in particular, FIGS. 30A, 31A, and 32A respectively illustrate cross-sectional views of some components in a region corresponding to a cross-section taken along the line X1-X1' of FIGS. 3C and 3D according to the sequence of processes, and FIGS. 30B, 31B, and 32B respectively illustrate cross-sectional views of some components in a region corresponding to a cross-section taken along the line Y1-Y1' of FIGS. 3C and 3D according to the sequence of processes. An example of a method of fabricating the integrated circuit device 300 shown in FIGS. 5A and 5B will be described with reference to FIGS. 30A to 32B.

Referring to FIGS. 30A and 30B, after the process described with reference to FIGS. 27A and 27B is performed, by etching-back a portion of the conductive layer 242L and a portion of the doped semiconductor layer 224L, in a resulting product of FIGS. 27A and 27B, by a method similar to that described with reference to FIGS. 28A and 28B, the plurality of first doped semiconductor patterns 324A having planarized upper surfaces and the plurality of second conductive patterns 342 having planarized upper surfaces may be formed. In an embodiment, by causing an etch-back depth of the conductive layer 242L to be different from an etch-back depth of the doped semiconductor layer 224L, the vertical level of the upper surface of each of the plurality of second conductive patterns 342 may be closer to the substrate 102 than the vertical level of the upper surface of each of the plurality of first doped semiconductor patterns 324A. The plurality of first trenches T1A may have certain spaces remaining over the plurality of first doped semiconductor patterns 324A, respectively, and the plurality of second trenches T1B may have certain spaces remaining over the plurality of second conductive patterns 342, respectively.

Referring to FIGS. 31A and 31B, a doped polysilicon film may be formed on a resulting product of FIGS. 30A and 30B, followed by etching-back the doped polysilicon film such that the upper surface of each of the plurality of first doped semiconductor patterns 324A is exposed, thereby forming the plurality of second doped semiconductor patterns 324B, which respectively cover the upper surfaces of the plurality of second conductive patterns 342. Each of the plurality of second doped semiconductor patterns 324B may have an upper surface that is at the same vertical level as the vertical level of the upper surface of each of the plurality of first doped semiconductor patterns 324A.

Referring to FIGS. 32A and 32B, in a resulting product of FIGS. 31A and 31B, by forming the buried insulating film 148 to fill the empty portion of each of the plurality of first trenches T1A and the plurality of second trenches T1B, the integrated circuit device 300 shown in FIGS. 5A and 5B may be fabricated.

To fabricate the integrated circuit device 400 shown in FIGS. 6A and 6B, the method described with reference to FIGS. 30A to 32B may be used. However, in the process described with reference to FIGS. 30A and 30B, the plurality of first doped semiconductor patterns 424A may be formed instead of the plurality of first doped semiconductor patterns 324A. A process of forming the plurality of first doped semiconductor patterns 424A may be substantially the same as the method of forming the plurality of first doped semiconductor patterns 324A, described with reference to FIGS. 30A and 30B. However, the upper surface of each of the plurality of first doped semiconductor patterns 424A may be at a vertical level that is equal to or similar to that of the upper surface of each of the plurality of second conductive patterns 342. Subsequently, by a similar method to that described regarding the formation of the plurality of second doped semiconductor patterns 324B with reference to FIGS. 31A and 31B, the plurality of second doped semiconductor patterns 424B may be formed to respectively cover the upper surfaces of the plurality of first doped semiconductor patterns 424A and the plurality of second conductive patterns 342, and by a similar method to that described with reference to FIGS. 32A and 32B, the buried insulating film 148 may be formed on the plurality of second doped semiconductor patterns 424B to fill the empty portion of each of the plurality of first trenches T1A and the plurality of second trenches T1B, thereby fabricating the integrated circuit device 400 shown in FIGS. 6A and 6B.

Although the methods of fabricating the integrated circuit devices 100, 200, 300, and 400 shown in FIGS. 3A to 6B have been described as examples with reference to FIGS. 11A to 32B, it will be understood by those of ordinary skill in the art that the integrated circuit devices 500 and 600 shown in FIGS. 7 and 8, and integrated circuit devices, which have variously modified and changed structures without departing from the scope of the present inventive concept, may be fabricated by applying various modifications and changes to the methods described with reference to FIGS. 11A to 32B without departing from the scope of the present inventive concept.

According to the methods of fabricating the integrated circuit devices 100, 200, 300, and 400, described with reference to FIGS. 11A to 32B, according to embodiments, to form the plurality of first conductive patterns 122, after the plurality of first trenches T1A are formed in the substrate 102 and the device isolation film 104 by the method described with reference to FIGS. 13A to 13E, portions of the substrate 102 and the device isolation film 104, which remain in regions for the plurality of second conductive patterns 142A to be respectively formed in, may respectively support the structures defining the plurality of first trenches T1A, around the plurality of first trenches T1A. Accordingly, even when the structures defining the plurality of first trenches T1A have relatively small widths and relatively high aspect rations, process defects, such as the leaning or collapse of the structures, may be prevented from being generated. In addition, to form the plurality of second conductive patterns 142A, after the plurality of second trenches T1B are formed in the substrate 102 and the device isolation film 104 by the method described with reference to FIGS. 21A to 21C, a structure filling each of the plurality of first trenches T1A, for example, the conductive layer 122M and the doped semiconductor layer 224L shown in FIGS. 21A and 21B, and other structures therearound may support the structures defining the plurality of second trenches T1B, around the plurality of second trenches T1B. Accordingly, even when the structures defining the plurality of second trenches T1B have relatively small widths and relatively high aspect rations, process defects, such as the leaning or collapse of the portions of the substrate 102 and the device isolation film 104, which define the plurality of second trenches T1B, may be prevented from being generated. Therefore, the reliability of the integrated circuit devices 100, 200, 300, and 400 may be increased.

While the present inventive concept has been particularly shown and described with reference to non-limiting embodiments thereof, it will be understood that various changes in form and details may be made therein without departing from the spirit and scope of the present inventive concept.

What is claimed is:

1. An integrated circuit device comprising:
 a substrate comprising a plurality of active regions arranged in a line in a first horizontal direction, each of the plurality of active regions are spaced apart from each other;
 a device isolation film arranged on the substrate to surround the plurality of active regions; and
 a word line arranged on the plurality of active regions and the device isolation film, the word line extending lengthwise in the first horizontal direction,
 wherein the word line comprises:
 a plurality of first conductive patterns spaced apart from each other in the first horizontal direction, each of the plurality of first conductive patterns covering a first pair of active regions of the plurality of active regions that are immediately adjacent to each other in the first horizontal direction, and a first portion of the device isolation film between each active region of the first pair of active regions, each active region of the first pair of active regions being spaced apart from each other by a first separation distance in the first horizontal direction; and a plurality of second conductive patterns arranged one-by-one between the plurality of first conductive patterns, each of the plurality of second conductive patterns covering a second portion of the device isolation film between a second pair of active regions of the plurality of active regions that are immediately adjacent to each other in the first horizontal direction, each active region of the second pair of active regions being spaced apart from each other by a second separation distance that is greater than the first separation distance in the first horizontal direction, and wherein a first vertical distance from a main surface of the substrate to a lowermost surface of each of the plurality of first conductive patterns is greater than a second vertical distance from the main surface of the substrate to a lowermost surface of each of the plurality of second conductive patterns.

2. The integrated circuit device of claim 1, wherein, in a second horizontal direction that is perpendicular to the first horizontal direction, a width of each of the plurality of first conductive patterns is greater than a width of each of the plurality of second conductive patterns.

3. The integrated circuit device of claim 1, wherein, in a second horizontal direction that is perpendicular to the first horizontal direction, a width of each portion of the plurality of first conductive patterns that overlaps the first portion of the device isolation film in a vertical direction is greater than a width of each portion of the plurality of second conductive patterns that overlaps the second portion of the device isolation film in the vertical direction.

4. The integrated circuit device of claim 1, wherein:
the word line extends lengthwise along a straight line in the first horizontal direction; and
each of the plurality of first conductive patterns and the plurality of second conductive patterns in the word line has a major axis in the first horizontal direction and has a shape extending lengthwise in the first horizontal direction.

5. The integrated circuit device of claim 1, wherein the word line comprises a plurality of contact surfaces between the plurality of first conductive patterns and the plurality of second conductive patterns.

6. The integrated circuit device of claim 1, further comprising:
a conductive line portion covering an upper surface of each of the plurality of first conductive patterns and integrally connected to each of the plurality of second conductive patterns,
wherein the plurality of second conductive patterns and the conductive line portion comprise a same material as each other.

7. The integrated circuit device of claim 1, wherein the plurality of first conductive patterns and the plurality of second conductive patterns comprise a same material as each other.

8. The integrated circuit device of claim 1, wherein each of the plurality of first conductive patterns and each of the plurality of second conductive patterns comprise different materials from each other.

9. The integrated circuit device of claim 1, wherein a constituent material of the plurality of second conductive patterns has a lower resistivity than a constituent material of the plurality of first conductive patterns.

10. The integrated circuit device of claim 1, wherein:
the word line extends in a zigzag manner in the first horizontal direction;
in the word line, each of the plurality of first conductive patterns has a planar shape extending lengthwise along a first major-axis line that makes a first acute angle in a first rotation direction from a straight line extending in the first horizontal direction; and
in the word line, each of the plurality of second conductive patterns has a planar shape extending lengthwise along a second major-axis line that makes a second acute angle in a second rotation direction from the straight line, the second rotation direction is opposite to the first rotation direction.

11. The integrated circuit device of claim 1, further comprising:
a plurality of gate dielectric films between the plurality of first conductive patterns and the substrate,
wherein gate dielectric films of the plurality of gate dielectric films are spaced apart from each other in the first horizontal direction with a second conductive pattern of the plurality of second conductive patterns therebetween.

12. The integrated circuit device of claim 1, wherein the word line further comprises a doped semiconductor pattern that covers upper surfaces of at least some of first conductive patterns of the plurality of first conductive patterns and second conductive patterns of the plurality of second conductive patterns.

13. An integrated circuit device comprising:
a substrate comprising a plurality of active regions, each active region of the plurality of active regions comprising an upper surface having a major axis and a minor axis, the plurality of active regions is repeatedly arranged spaced apart from each other in a major-axis direction that is parallel to the major axis and in a minor-axis direction that is parallel to the minor axis;
a device isolation film surrounding the plurality active regions; and
a plurality of word lines extending lengthwise in a first horizontal direction that intersects with each of the major-axis direction and the minor-axis direction, across a group of active regions of the plurality of active regions and the device isolation film, the group of active regions is arranged in the first horizontal direction,
wherein each of the plurality of word lines comprises:
a plurality of first conductive patterns spaced apart from each other in the first horizontal direction, each of the plurality of first conductive patterns covering a first pair of active regions of the plurality of active regions that are immediately adjacent to each other in the first horizontal direction, and a first portion of the device isolation film between each active region of the first pair of active regions, each active region of the first pair of active regions being spaced apart from each other by a first separation distance in the first horizontal direction; and
a plurality of second conductive patterns arranged one-by-one between the plurality of first conductive patterns, each of the plurality of second conductive patterns covering a second portion of the device isolation film between a second pair of active regions of the plurality of active regions that are immediately adjacent to each other in the first horizontal direction, each active region of the second pair of active regions being spaced apart from each other by a second separation distance that is greater than the first separation distance in the first horizontal direction, and wherein a vertical level of a lowermost surface of each of the plurality of first conductive patterns is lower than a vertical level of a lowermost surface of each of the plurality of second conductive patterns.

14. The integrated circuit device of claim 13, wherein each of the plurality of word lines further comprises a doped semiconductor pattern that covers upper surfaces of at least some of first conductive patterns of the plurality of first conductive patterns and second conductive patterns of the plurality of second conductive patterns.

15. The integrated circuit device of claim 13, further comprising:
a plurality of gate dielectric films between the plurality of first conductive patterns and the substrate,
wherein gate dielectric films of the plurality of gate dielectric films are spaced apart from each other in the first horizontal direction with a second conductive pattern of the plurality of second conductive patterns therebetween.

16. The integrated circuit device of claim 13, wherein, in each of the plurality of word lines, a width of each of the plurality of first conductive patterns is greater than a width of each of the plurality of second conductive patterns, in a second horizontal direction that is perpendicular to the first horizontal direction.

17. The integrated circuit device of claim 13, wherein, in each of the plurality of word lines, each of the plurality of first conductive patterns and the plurality of second conductive patterns has a major axis that is parallel to the first horizontal direction.

18. The integrated circuit device of claim 13, wherein, in each of the plurality of word lines, each of the plurality of first conductive patterns and the plurality of second conductive patterns has a major axis in a direction making an acute angle with the first horizontal direction.

19. An integrated circuit device comprising:
a substrate comprising a plurality of active regions arranged in a line in a first horizontal direction, each of the plurality of active regions are spaced apart from each other;
a device isolation film arranged on the substrate to surround the plurality of active regions;
a word line arranged on the plurality of active regions and the device isolation film, the word line extending lengthwise in the first horizontal direction; and
a plurality of gate dielectric films arranged between portions of the word line that vertically overlap the plurality of active regions and the plurality of active regions,
wherein the word line comprises:
a plurality of first conductive patterns, each first conductive pattern of the plurality of first conductive patterns covering a first pair of active regions of the plurality of active regions that are immediately adjacent to each other in the first horizontal direction, and a first portion of the device isolation film between each active region of the first pair of active regions, the plurality of first conductive patterns are spaced apart from each other in the first horizontal direction and are spaced apart from the first portion of the device isolation film with the plurality of gate dielectric films respectively therebetween, each active region of the first pair of active regions being spaced apart from each other by a first separation distance in the first horizontal direction;
a plurality of second conductive patterns arranged one-by-one between the plurality of first conductive patterns, each of the plurality of second conductive patterns covering a second portion of the device isolation film between a second pair of active regions of the plurality of active regions that are immediately adjacent to each other in the first horizontal direction, each active region of the second pair of active regions being spaced apart from each other by a second separation distance that is greater than the first separation distance in the first horizontal direction; and
a doped polysilicon pattern covering upper surfaces of at least some of first conductive patterns of the plurality of first conductive patterns and second conductive patterns of the plurality of second conductive patterns,
and wherein a first vertical distance from a main surface of the substrate to a lowermost surface of each of the plurality of first conductive patterns is greater than a second vertical distance from the main surface of the substrate to a lowermost surface of each of the plurality of second conductive patterns.

20. The integrated circuit device of claim 19, wherein a width of each of the plurality of first conductive patterns is greater than a width of each of the plurality of second conductive patterns, in a second horizontal direction that is perpendicular to the first horizontal direction.

* * * * *